US009129724B2

(12) United States Patent
Gundel

(10) Patent No.: US 9,129,724 B2
(45) Date of Patent: *Sep. 8, 2015

(54) SHIELDED ELECTRICAL CABLE

(71) Applicant: 3M INNOVATIVE PROPERTIES COMPANY, St. Paul, MN (US)

(72) Inventor: Douglas B. Gundel, Cedar Park, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/483,243

(22) Filed: Sep. 11, 2014

(65) Prior Publication Data

US 2015/0027746 A1  Jan. 29, 2015

Related U.S. Application Data

(63) Continuation of application No. 13/813,285, filed as application No. PCT/US2010/060649 on Dec. 16, 2010, now Pat. No. 8,859,901.

(60) Provisional application No. 61/385,670, filed on Sep. 23, 2010.

(51) Int. Cl.
*H01B 7/17* (2006.01)
*H05K 9/00* (2006.01)
(Continued)

(52) U.S. Cl.
CPC ................ *H01B 7/17* (2013.01); *H01B 7/0045* (2013.01); *H01B 7/0861* (2013.01); *H05K 9/0098* (2013.01); *H01B 7/0838* (2013.01); *H01B 11/002* (2013.01); *H01B 11/203* (2013.01)

(58) Field of Classification Search
CPC ............... H05K 9/00; H05B 3/00; H05B 7/00
USPC ...... 174/110 R, 113 R, 117 R, 117 F, 117 FF, 174/36
See application file for complete search history.

(56) References Cited

U.S. PATENT DOCUMENTS
3,496,281 A * 2/1970 McMahon ...................... 174/29
(Continued)

FOREIGN PATENT DOCUMENTS
DE          911277          9/1954
(Continued)

OTHER PUBLICATIONS
PCT International Search Report from PCT/US2010/060649, dated Nov. 7, 2011, 7 pages.
(Continued)

*Primary Examiner* — William H Mayo, III
(74) *Attorney, Agent, or Firm* — Robert S. Moshrefzadeh

(57) ABSTRACT

A shielded electrical cable is disclosed. The cable includes a plurality of conductor sets that extend along the length of the cable and are spaced apart from each other along the width of the cable. Each conductor set includes one or more insulated conductors, and first and second shielding films that are disposed on opposite first and second sides of the cable. The first and second films include cover portions and pinched portions arranged such that, in transverse cross section, the cover portions of the first and second films in combination substantially surround each conductor set, and the pinched portions of the first and second films in combination form pinched portions of the cable on each side of each conductor set. Each conductor set also includes an EMI absorbing layer that is disposed on the first side of the cable, and an adhesive layer that bonds the first shielding film to the second shielding film in the pinched portions of the cable. The plurality of conductor sets includes a first conductor set that includes neighboring first and second insulated conductors and has corresponding first cover portions of the first and second shielding films and corresponding first pinched portions of the first and second shielding films that form a first pinched region of the cable on one side of the first conductor set. The maximum separation between the first cover portions of the first and second shielding films is D. The minimum separation between the first pinched portions of the first and second shielding films is $d_1$. $d_1/D$ is less than 0.25. The minimum separation between the first cover portions of the first and second shielding films in a region between the first and second insulated conductors is $d_2$. $d_2/D$ is greater than 0.33.

8 Claims, 39 Drawing Sheets

(51) Int. Cl.
*H01B 7/00* (2006.01)
*H01B 7/08* (2006.01)
*H01B 11/00* (2006.01)
*H01B 11/20* (2006.01)

(56) References Cited

U.S. PATENT DOCUMENTS

| | | | |
|---|---|---|---|
| 3,775,552 A * | 11/1973 | Schumacher | 174/105 R |
| 3,993,394 A | 11/1976 | Cooper | |
| 4,099,323 A | 7/1978 | Bouvier | |
| 4,149,026 A * | 4/1979 | Fritz et al. | 174/32 |
| 4,185,162 A | 1/1980 | Bogese | |
| 4,287,385 A | 9/1981 | Dombrowsky | |
| 4,382,236 A * | 5/1983 | Suzuki | 333/1 |
| 4,404,424 A | 9/1983 | King et al. | |
| 4,412,092 A | 10/1983 | Hansell, III | |
| 4,449,778 A | 5/1984 | Lane | |
| 4,468,089 A | 8/1984 | Brorein | |
| 4,470,195 A | 9/1984 | Lang | |
| 4,475,006 A | 10/1984 | Olyphant | |
| 4,481,379 A * | 11/1984 | Bolick et al. | 174/36 |
| 4,487,992 A | 12/1984 | Tomita | |
| 4,490,574 A | 12/1984 | Tomita et al. | |
| 4,492,815 A | 1/1985 | Maros | |
| 4,611,656 A | 9/1986 | Kendall et al. | |
| 4,705,332 A | 11/1987 | Sadigh-Behzadi | |
| 4,720,155 A | 1/1988 | Schildkraut et al. | |
| 4,735,583 A | 4/1988 | Rudy, Jr. et al. | |
| 4,767,345 A | 8/1988 | Gutter et al. | |
| 4,780,157 A | 10/1988 | Coon | |
| 4,800,236 A | 1/1989 | Lemke | |
| 4,850,898 A | 7/1989 | Gallusser | |
| 4,920,234 A | 4/1990 | Lemke | |
| 5,057,646 A | 10/1991 | Nichols et al. | |
| 5,084,594 A | 1/1992 | Cady et al. | |
| 5,090,911 A | 2/1992 | Welsh | |
| 5,132,489 A | 7/1992 | Yamano | |
| 5,162,611 A | 11/1992 | Nichols, III et al. | |
| 5,171,161 A | 12/1992 | Kachlic | |
| 5,184,965 A | 2/1993 | Myschik et al. | |
| 5,235,132 A | 8/1993 | Ainsworth et al. | |
| 5,244,415 A | 9/1993 | Marsilio et al. | |
| 5,250,127 A * | 10/1993 | Hara | 156/52 |
| 5,268,531 A | 12/1993 | Nguyen et al. | |
| 5,279,415 A | 1/1994 | Edgley et al. | |
| 5,286,924 A | 2/1994 | Loder et al. | |
| 5,380,216 A | 1/1995 | Broeksteeg et al. | |
| 5,441,424 A | 8/1995 | Morlion et al. | |
| 5,446,239 A * | 8/1995 | Mizutani et al. | 174/36 |
| 5,460,533 A | 10/1995 | Broeksteeg et al. | |
| 5,477,159 A | 12/1995 | Hamling | |
| 5,483,020 A | 1/1996 | Hardie et al. | |
| 5,507,653 A | 4/1996 | Stoner | |
| 5,511,992 A | 4/1996 | Thalhammer | |
| 5,518,421 A | 5/1996 | Davis | |
| 5,524,766 A | 6/1996 | Marchek et al. | |
| 5,600,544 A | 2/1997 | Thalhammer | |
| 5,632,634 A | 5/1997 | Soes | |
| 5,702,258 A | 12/1997 | Provencher et al. | |
| 5,743,765 A | 4/1998 | Andrews et al. | |
| 5,766,036 A | 6/1998 | Ahmad et al. | |
| 5,767,442 A | 6/1998 | Eisenberg et al. | |
| 5,775,924 A | 7/1998 | Miskin et al. | |
| 5,804,768 A | 9/1998 | Sexton | |
| 5,900,588 A | 5/1999 | Springer et al. | |
| 5,934,942 A | 8/1999 | Patel et al. | |
| 5,938,476 A | 8/1999 | Wu et al. | |
| 5,941,733 A | 8/1999 | Lai | |
| 6,007,385 A | 12/1999 | Wu | |
| 6,039,606 A | 3/2000 | Chiou | |
| 6,089,916 A | 7/2000 | Kuo | |
| 6,367,128 B1 | 4/2002 | Galkiewicz et al. | |
| 6,524,135 B1 | 2/2003 | Feldman et al. | |
| 6,546,604 B2 | 4/2003 | Galkiewicz et al. | |
| 6,588,074 B2 | 7/2003 | Galkiewicz et al. | |
| 6,717,058 B2 | 4/2004 | Booth et al. | |
| 6,763,556 B2 | 7/2004 | Fagan et al. | |
| 6,831,230 B2 | 12/2004 | Ide et al. | |
| 7,267,575 B1 | 9/2007 | Hwang | |
| 7,329,141 B2 | 2/2008 | Kumakura et al. | |
| 7,807,927 B2 * | 10/2010 | Yeh | 174/110 R |
| 2002/0020545 A1 | 2/2002 | Suzuki | |
| 2003/0085052 A1 | 5/2003 | Tsao et al. | |
| 2003/0102148 A1 | 6/2003 | Ohara et al. | |
| 2003/0213610 A1 * | 11/2003 | Ide et al. | 174/117 F |
| 2006/0016615 A1 * | 1/2006 | Schilson et al. | 174/117 F |
| 2006/0054334 A1 | 3/2006 | Vaupotic et al. | |
| 2006/0172588 A1 | 8/2006 | Peng | |
| 2006/0207784 A1 | 9/2006 | Chang | |
| 2007/0240898 A1 * | 10/2007 | Reichert et al. | 174/117 F |
| 2009/0166082 A1 | 7/2009 | Liu et al. | |
| 2010/0186225 A1 | 7/2010 | Reichert | |
| 2012/0090866 A1 | 4/2012 | Gundel | |
| 2012/0090872 A1 | 4/2012 | Gundel | |
| 2012/0090873 A1 | 4/2012 | Gundel | |
| 2012/0097421 A1 | 4/2012 | Gundel | |

FOREIGN PATENT DOCUMENTS

| | | |
|---|---|---|
| DE | 2644252 | 9/1976 |
| DE | 2547152 | 4/1977 |
| DE | 2758472 | 12/1977 |
| DE | 3522173 | 7/1986 |
| EP | 1 546 609 | 5/1979 |
| EP | 0 082 700 | 6/1983 |
| EP | 103430 | 3/1984 |
| EP | 0 284 245 | 9/1988 |
| EP | 0 446 980 | 9/1991 |
| EP | 0 477 006 | 3/1992 |
| EP | 0 548 942 | 6/1993 |
| EP | 0 654 859 | 5/1995 |
| EP | 0 696 085 | 2/1996 |
| EP | 0 907 221 | 4/1999 |
| EP | 0 961 298 | 12/1999 |
| EP | 2 058 825 | 5/2009 |
| JP | 60 140309 | 9/1985 |
| JP | 61 133914 | 8/1986 |
| JP | 1023947 | 1/1989 |
| JP | 4 36906 | 2/1992 |
| JP | H06-5042 | 1/1994 |
| JP | 08-203350 | 8/1996 |
| JP | 2000082346 | 3/2000 |
| JP | 2001135157 | 5/2001 |
| JP | 2002-117731 | 4/2002 |
| JP | 2003281944 | 10/2003 |
| JP | 2005-116300 | 4/2005 |
| JP | 2006 286480 | 10/2006 |
| JP | 2007265640 | 10/2007 |
| JP | 4164979 | 8/2008 |
| JP | 2009093934 | 4/2009 |
| JP | 2010 097882 | 4/2010 |
| WO | 2006/113702 | 10/2006 |
| WO | 2009/130859 | 10/2009 |

OTHER PUBLICATIONS

3M Electrical Markets Division: "3M EMI Absorber with Shielding; AB6000 Series, AB6000S Series, and AB6000G Series", Oct. 2008; XP002647977, 4 pages.

* cited by examiner

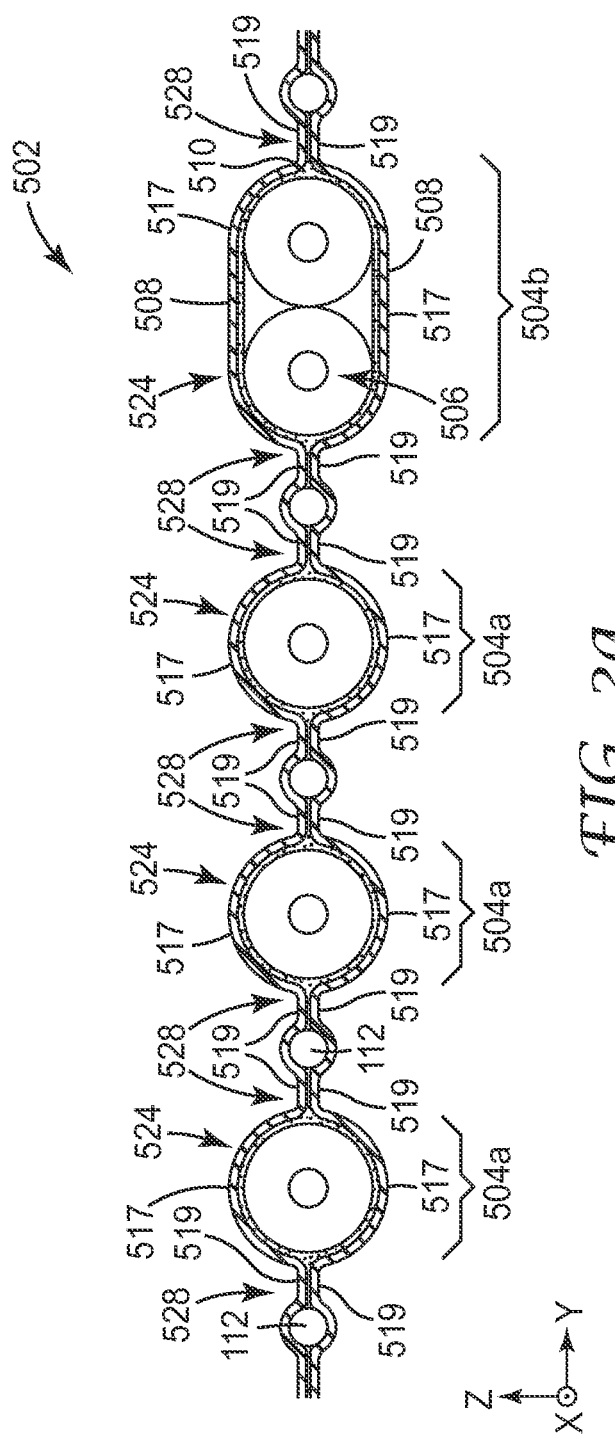

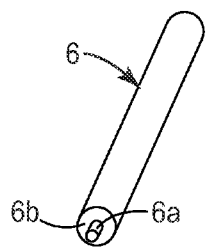
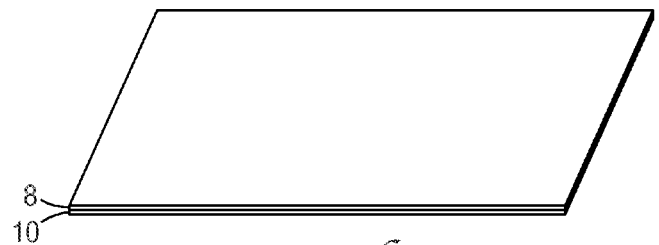
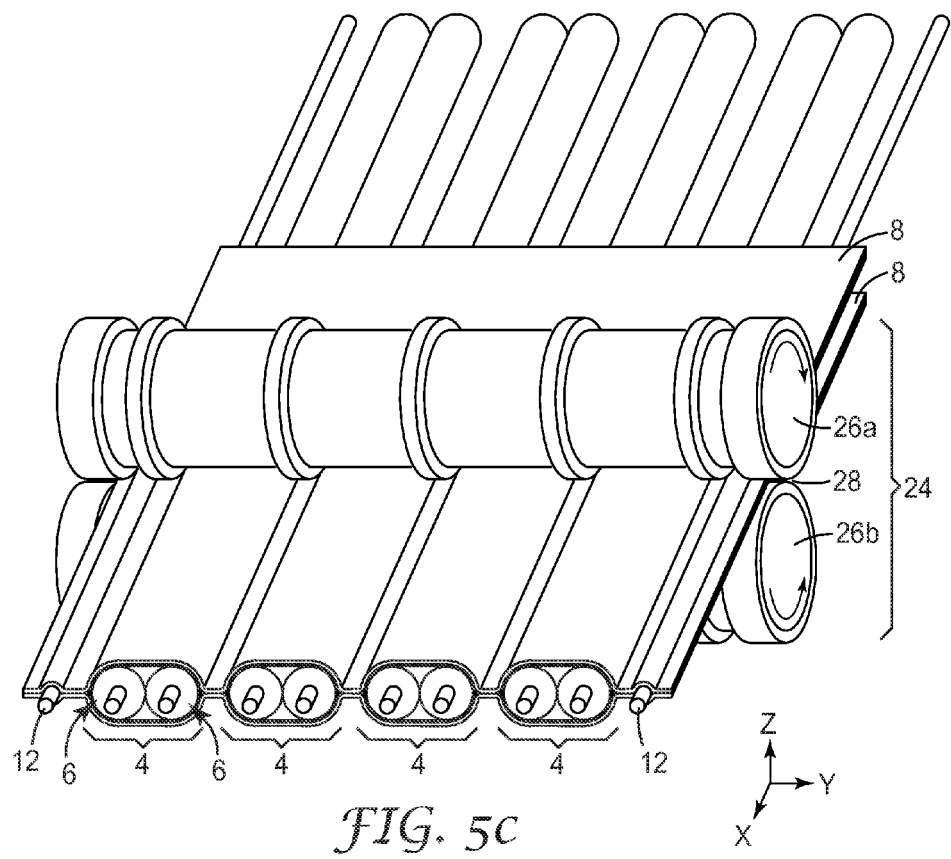

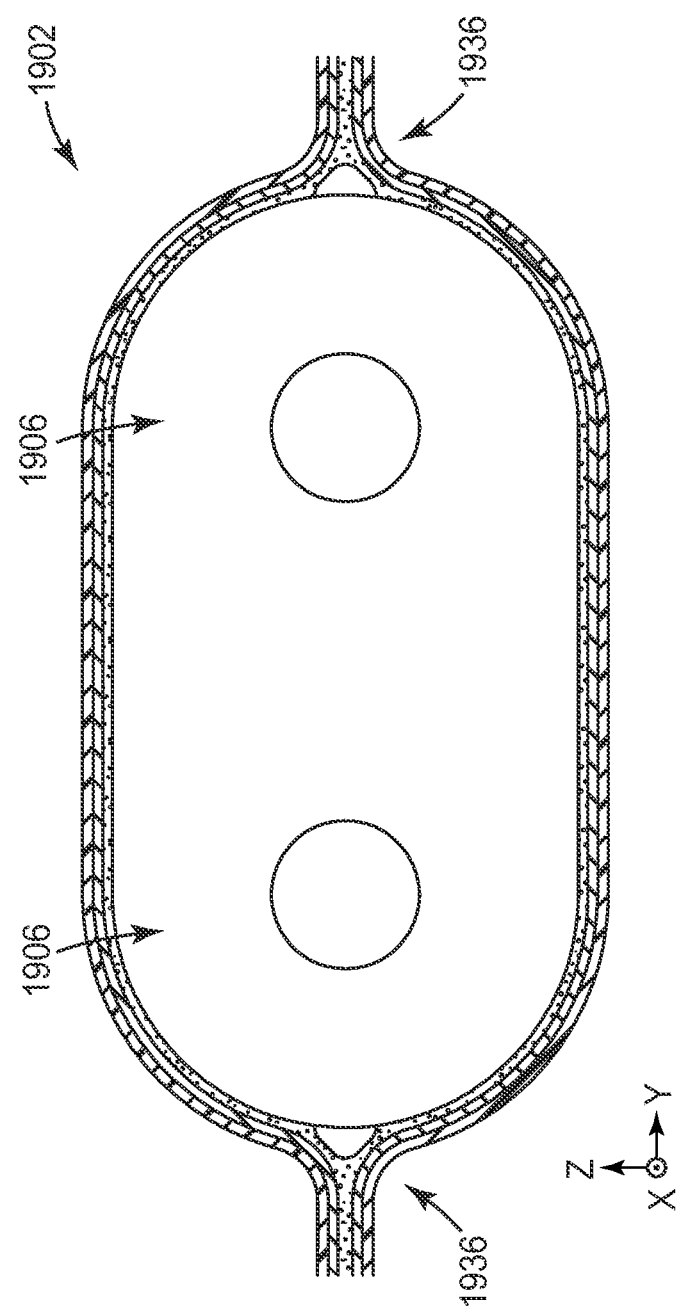

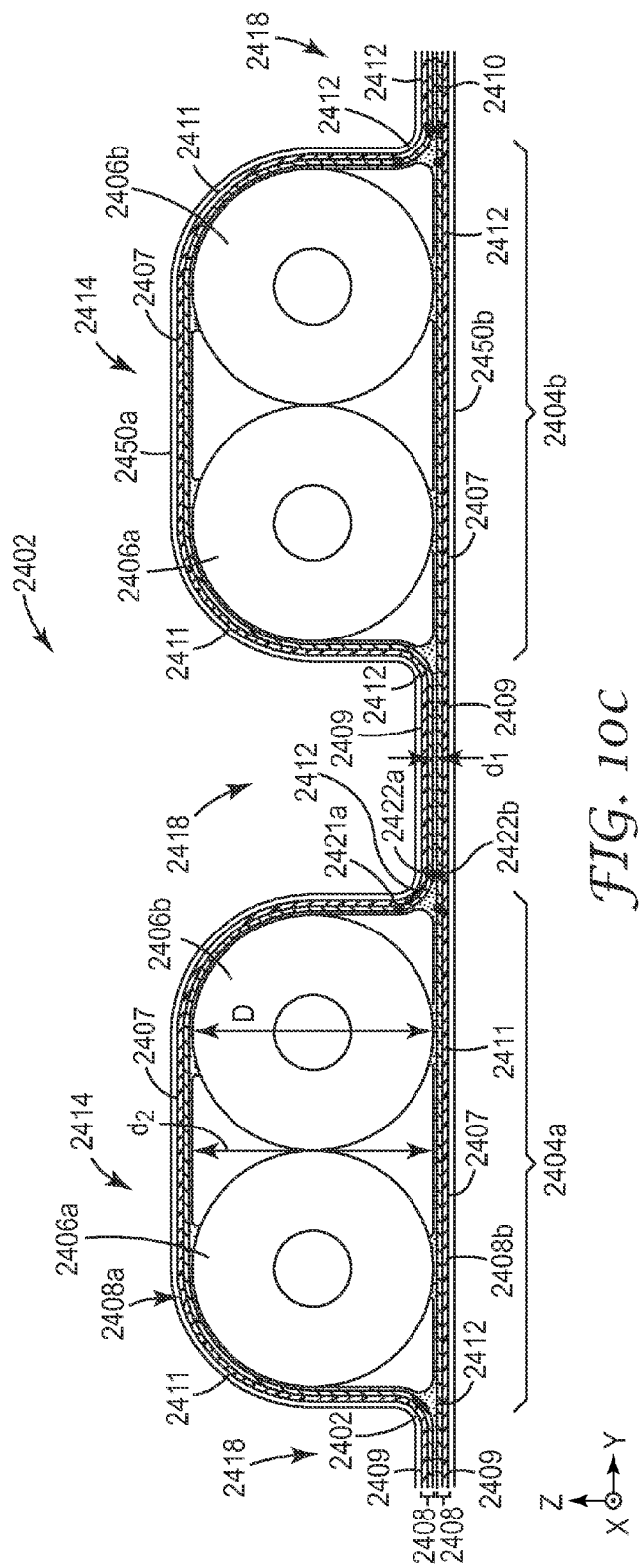

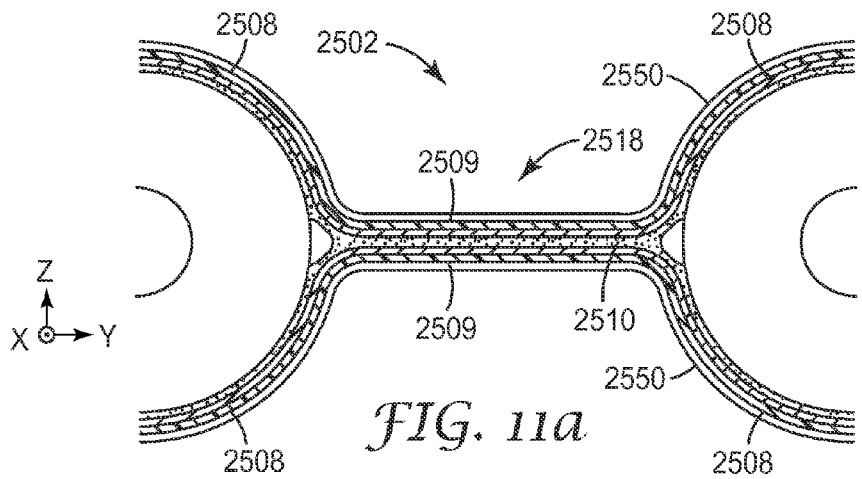
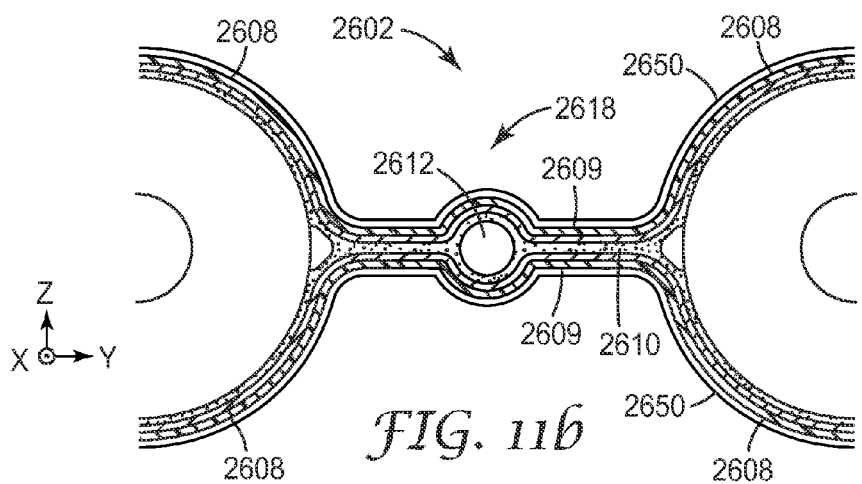
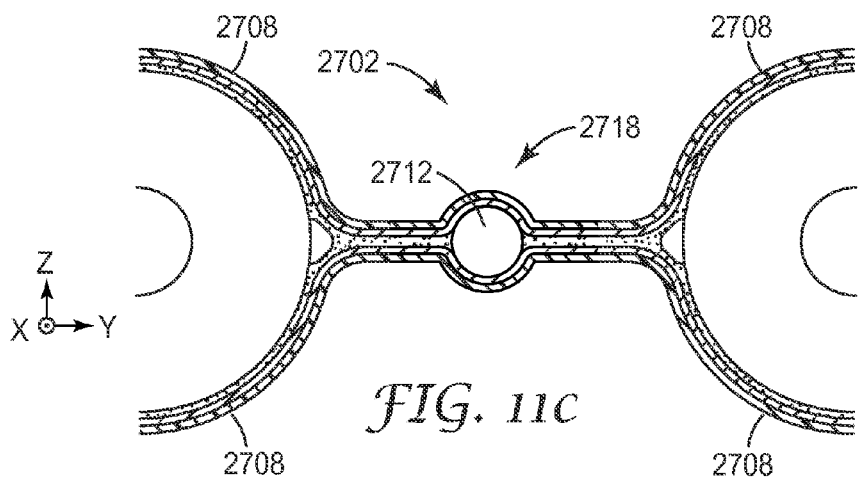

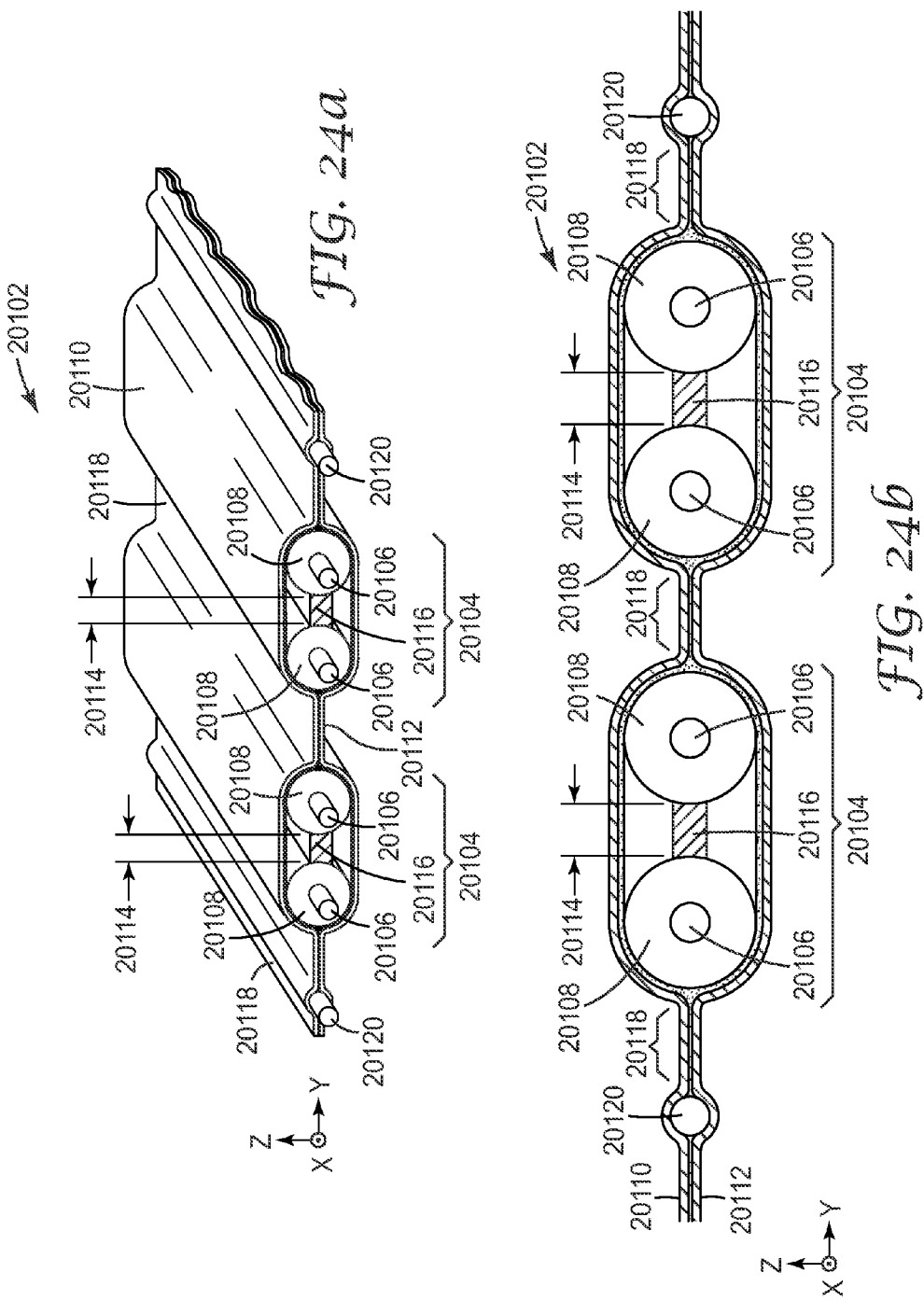

SHIELDED ELECTRICAL CABLE

TECHNICAL FIELD

This invention generally relates to electrical cables that include one or more EMI absorbing layers.

BACKGROUND

Electrical cables for transmission of electrical signals are well known. One common type of electrical cable is a coaxial cable. Coaxial cables generally include an electrically conductive wire surrounded by an insulator. The wire and insulator are surrounded by a shield, and the wire, insulator, and shield are surrounded by a jacket. Another common type of electrical cable is a shielded electrical cable that includes one or more insulated signal conductors surrounded by a shielding layer formed, for example, by a metal foil.

SUMMARY

Generally, the present invention relates to shielded electrical cables. In one embodiment, a shielded electrical cable includes a plurality of conductor sets that extend along a length of the cable and are spaced apart from each other along a width of the cable. Each conductor set includes one or more insulated conductors; and first and second shielding films that are disposed on opposite first and second sides of the cable. The first and second films include cover portions and pinched portions arranged such that, in transverse cross section, the cover portions of the first and second films in combination substantially surround each conductor set, and the pinched portions of the first and second films in combination form pinched portions of the cable on each side of each conductor set. Each conductor set further includes a first EMI absorbing layer that is disposed on the first side of the cable; and a first adhesive layer that bonds the first shielding film to the second shielding film in the pinched portions of the cable. The plurality of the conductor sets includes a first conductor set that includes neighboring first and second insulated conductors and has corresponding first cover portions of the first and second shielding films and corresponding first pinched portions of the first and second shielding films that form a first pinched region of the cable on one side of the first conductor set. The maximum separation between the first cover portions of the first and second shielding films is D. The minimum separation between the first pinched portions of the first and second shielding films is $d_1$. $d_1/D$ is less than 0.25. The minimum separation between the first cover portions of the first and second shielding films in a region between the first and second insulated conductors is $d_2$. $d_2/D$ is greater than 0.33. In some cases, $d_1/D$ is less than 0.1. In some cases, the first EMI absorbing layer is disposed between the first shielding film and the plurality of conductor sets. In some cases, the first shielding film is disposed between the first EMI absorbing layer and the plurality of conductor sets. In some cases, the cable further includes a second EMI absorbing layer that is disposed on the second side of the cable.

In another embodiment, a shielded electrical cable includes a plurality of conductor sets that extend along a length of the cable and are spaced apart from each other along a width of the cable. Each conductor set includes one or more insulated conductors; and first and second shielding films that are disposed on opposite first and second sides of the cable. The first and second films include cover portions and pinched portions that are arranged such that, in transverse cross section, the cover portions of the first and second films in combination substantially surround each conductor set, and the pinched portions of the first and second films in combination form pinched portions of the cable on each side of each conductor set. Each conductor set further includes a first EMI absorbing layer that is disposed on the first side of the cable; and a first adhesive layer that bonds the first shielding film to the second shielding film in the pinched portions of the cable. The plurality of conductor sets includes a first conductor set that includes neighboring first and second insulated conductors and has corresponding first cover portions of the first and second shielding films and corresponding first pinched portions of the first and second shielding films that form a first pinched cable portion on one side of the first conductor set. The maximum separation between the first cover portions of the first and second shielding films is D. The minimum separation between the first pinched portions of the first and second shielding films is $d_1$. $d_1/D$ is less than 0.25. The high frequency electrical isolation of the first insulated conductor relative to the second insulated conductor is substantially less than the high frequency electrical isolation of the first conductor set relative to an adjacent conductor set. In some cases, $d_1/D$ is less than 0.1. In some cases, the high frequency isolation of the first insulated conductor relative to the second conductor is a first far end crosstalk C1 at a specified frequency range of 3-15 GHz and a length of 1 meter, and the high frequency isolation of the first conductor set relative to the adjacent conductor set is a second far end crosstalk C2 at the specified frequency, and C2 is at least 10 dB lower than C1. In some cases, the cover portions of the first and second shielding films in combination substantially surround each conductor set by encompassing at least 70% of a periphery of each conductor set.

In another embodiment, a shielded electrical cable includes a plurality of conductor sets that extend along a length of the cable and are spaced apart from each other along a width of the cable. Each conductor set includes one or more insulated conductors; and first and second shielding films that include concentric portions, pinched portions, and transition portions arranged such that, in transverse cross section, the concentric portions are substantially concentric with one or more end conductors of each conductor set, the pinched portions of the first and second shielding films in combination form pinched portions of the cable on two sides of the conductor set, and the transition portions provide gradual transitions between the concentric portions and the pinched portions. Each conductor set also includes a first EMI absorbing layer that is disposed on the plurality of conductor sets. Each shielding film includes a conductive layer. A first one of the transition portions is proximate a first one of the one or more end conductors and has a cross-sectional area $A_1$ defined as an area between the conductive layers of the first and second shielding films, the concentric portions, and a first one of the pinched portions proximate the first end conductor. $A_1$ is less than the cross-sectional area of the first end conductor. Each shielding film is characterizable in transverse cross section by a radius of curvature that changes across the width of the cable. The radius of curvature for each of the shielding films is at least 100 micrometers across the width of the cable. In some cases, the cross-sectional area $A_1$ includes as one boundary a boundary of the first pinched portion. The boundary is defined by the position along the first pinched portion at which a separation d between the first and second shielding films is about 1.2 to about 1.5 times a minimum separation $d_1$ between the first and second shielding films at the first pinched portion. In some cases, the cross-sectional area $A_1$ includes as one boundary a line segment having a first endpoint at an inflection point of the first shielding film. In some cases, the line segment has a second endpoint at an inflection point of the second shielding film.

In another embodiment, a shielded electrical cable includes a plurality of conductor sets that extend along a length of the cable and are spaced apart from each other along a width of the cable. Each conductor set includes one or more insulated conductors; and first and second shielding films that include concentric portions, pinched portions, and transition portions arranged such that, in transverse cross section, the concentric portions are substantially concentric with one or more end conductors of each conductor set, the pinched portions of the first and second shielding films in combination form pinched regions of the cable on two sides of the conductor set, and the transition portions provide gradual transitions between the concentric portions and the pinched portions. Each conductor set also includes a first EMI absorbing layer that is disposed on the plurality of conductor sets. One of the two shielding films includes a first one of the concentric portions, a first one of the pinched portions, and a first one of the transition portions. The first transition portion connects the first concentric portion to the first pinched portion. The first concentric portion has a radius of curvature $R_1$ and the transition portion has a radius of curvature $r_1$. $R_1/r_1$ is in a range from 2 to 15.

BRIEF DESCRIPTION OF THE DRAWINGS

The invention may be more completely understood and appreciated in consideration of the following detailed description of various embodiments of the invention in connection with the accompanying drawings, in which:

FIGS. 2a-2g are front cross-sectional views of seven exemplary embodiments of a shielded electrical cable;

FIGS. 5a-5e and 5f-5g are perspective and front cross-sectional views, respectively, illustrating an exemplary method of making a shielded electrical cable;

FIGS. 8a-8b are front cross-sectional views of two other exemplary embodiments of a shielded electrical cable according to an aspect of the present invention;

FIGS. 10a-10c are front cross-sectional views of three other exemplary embodiments of a shielded electrical cable;

FIGS. 11a-11g are front cross-sectional detail views illustrating seven exemplary embodiments of a parallel portion of a shielded electrical cable;

FIG. 24a is a perspective view of an example cable construction; and

FIG. 24b is a cross section view of the example cable construction of FIG. 24a.

In the specification, a same reference numeral used in multiple figures refers to the same or similar elements having the same or similar properties and functionalities.

DETAILED DESCRIPTION

The present invention generally relates to cables that include a plurality of spaced apart conductor sets and one or more EMI absorbing layers for preventing or reducing cross talk between neighboring conductor sets by primarily absorbing the electromagnetic field.

Figure 1:
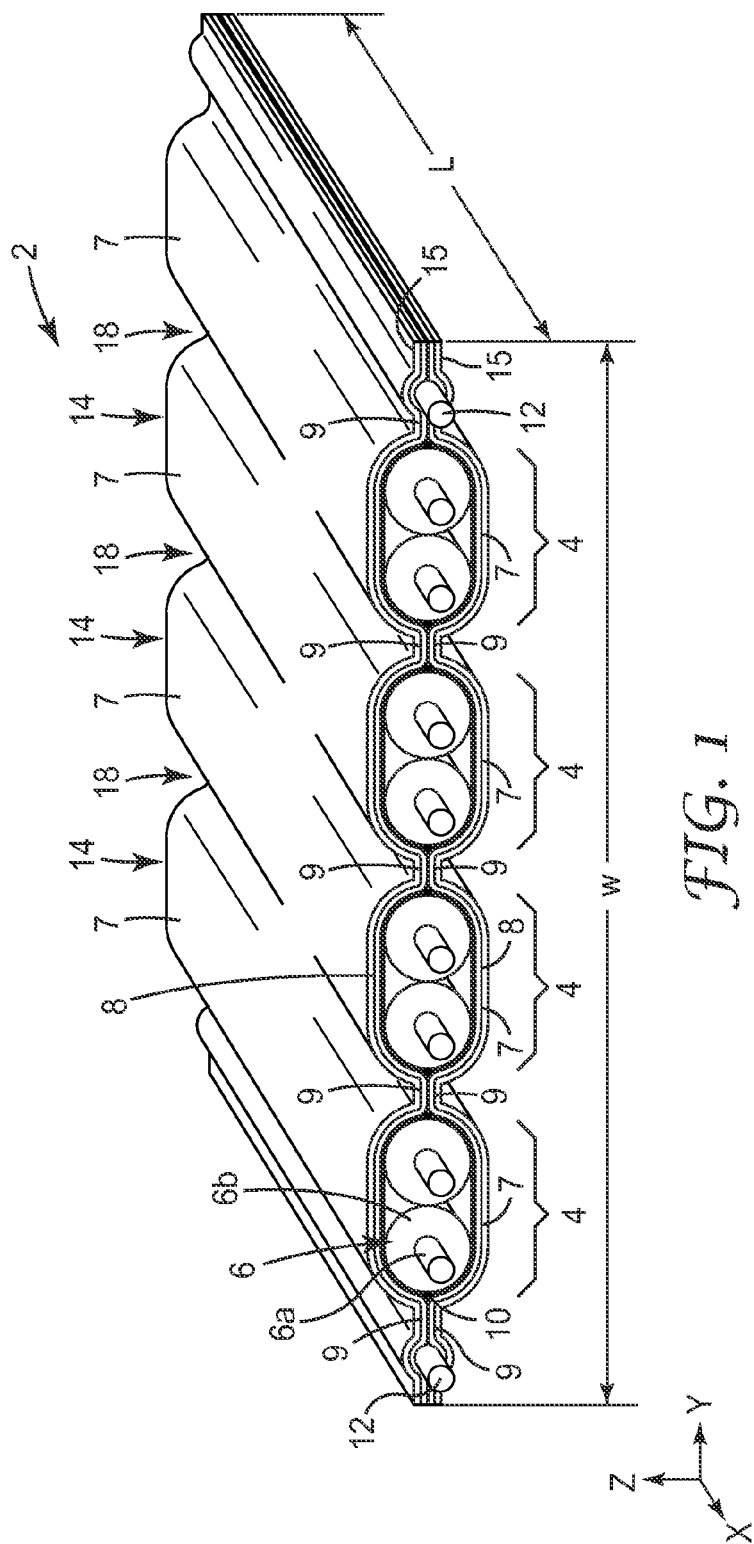
FIG. 1 is a perspective view of an exemplary embodiment of a shielded electrical cable.

FIG. 1 is a schematic three-dimensional view of a shielded electrical cable 2 that includes a plurality of conductor sets 4 spaced apart from each other along all or a portion of a width, w, of cable 2 along the y-axis and extend along a length, L, of cable 2 along the x-axis. Cable 2 may be arranged generally in a planar configuration as illustrated in FIG. 1 or may be folded at one or more places along its length and/or width into a folded configuration. In some cases, some parts of cable 2 may be arranged in a planar configuration and other parts of the cable may be folded. In some cases, at least one of the conductor sets 4 of cable 2 includes two insulated conductors 6 extending along the length, L, of cable 2 where each insulated conductor includes a conductor 6a surrounded by an insulator 6b. The two insulated conductors 6 of conductor sets 4 may be arranged substantially parallel along all or a portion of the length, L, of the cable 2. Insulated conductors 6 may include insulated signal wires, insulated power wires, or insulated ground wires. Two shielding films 8 are disposed on opposite first and second sides of the cable 2.

The first and second shielding films 8 are arranged so that, in transverse cross section, cable 2 includes cover regions 14 and pinched regions 18. In the cover regions 14 of the cable 2, cover portions 7 of the first and second shielding films 8 in transverse cross section substantially surround each conductor set 4. For example, cover portions of the shielding films may collectively encompass at least 75%, or at least 80, or at least 85% or at least 90% of the perimeter of any given conductor set. Pinched portions 9 of the first and second shielding films form the pinched regions 18 of cable 2 on each side of each conductor set 4. In the pinched regions 18 of the cable 2, one or both of the shielding films 8 are deflected, bringing the pinched portions 9 of the shielding films 8 into closer proximity. In some cases, as illustrated in FIG. 1, both of the shielding films 8 are deflected in the pinched regions 18 to bring the pinched portions 9 into closer proximity. In some cases, one of the shielding films may remain relatively flat in the pinched regions 18 when the cable is in a planar or unfolded configuration, and the other shielding film on the opposite side of the cable may be deflected to bring the pinched portions of the shielding film into closer proximity.

The conductors and/or ground wires may include any suitable conductive material and may have a variety of cross sectional shapes and sizes. For example, in cross section, the conductors and/or ground wires may be circular, oval, rectangular or any other shape. One or more conductors and/or ground wires in a cable may have one shape and/or size that differs from other one or more conductors and/or ground wires in the cable. The conductors and/or ground wires may be solid or stranded wires. All of the conductors and/or ground wires in a cable may be stranded, all may be solid, or some may be stranded and some solid. Stranded conductors and/or ground wires may take on different sizes and/or shapes. The connectors and/or ground wires may be coated or plated with various metals and/or metallic materials, including gold, silver, tin, and/or other materials.

The material used to insulate the conductors of the conductor sets may be any suitable material that achieves the desired electrical properties of the cable. In some cases, the insulation used may be a foamed insulation which includes air to reduce the dielectric constant and the overall thickness of the cable. One or both of the shielding films may include a conductive layer and a non-conductive polymeric layer. The conductive layer may include any suitable conductive material, including but not limited to copper, silver, aluminum, gold, and alloys thereof. The shielding films may have a thickness in the range of 0.01 mm to 0.05 mm and the overall thickness of the cable may be less than 2 mm or less than 1 mm.

Cable 2 may also include an adhesive layer 10 disposed between shielding films 8 at least between the pinched portions 9. Adhesive layer 10 bonds the pinched portions 9 of the shielding films 8 to each other in the pinched regions 18 of the cable 2. The adhesive layer 10 may or may not be present in the cover region 14 of the cable 2.

In some cases, conductor sets 4 have a substantially curvilinearly-shaped envelope or perimeter in transverse cross-section (the yz-plane), and shielding films 8 are disposed around conductor sets 4 such as to substantially conform to and maintain the cross-sectional shape along at least part of, and preferably along substantially all of, the length L of cable 2. Maintaining the cross-sectional shape maintains the electrical characteristics of conductor sets 4 as intended in the design of conductor sets 4. This is an advantage over some conventional shielded electrical cables where disposing a conductive shield around a conductor set changes the cross-sectional shape of the conductor set.

Although in the embodiment illustrated in FIG. 1, each conductor set 4 has two insulated conductors 6, in other embodiments, some or all of the conductor sets may include only one insulated conductor, or may include more than two insulated conductors 6. For example, an alternative shielded electrical cable similar in design to that of FIG. 1 may include one conductor set that has eight insulated conductors 6, or eight conductor sets each having only one insulated conductor 6. This flexibility in arrangements of conductor sets and insulated conductors allows the disclosed shielded electrical cables to be configured in ways that are suitable for a wide variety of intended applications. For example, the conductor sets and insulated conductors may be configured to form: a multiple twinaxial cable, i.e., multiple conductor sets each having two insulated conductors; a multiple coaxial cable, i.e., multiple conductor sets each having only one insulated conductor; or combinations thereof. In some embodiments, a conductor set may further include a conductive shield (not shown) disposed around the one or more insulated conductors, and an insulative jacket (not shown) disposed around the conductive shield.

In the embodiment illustrated in FIG. 1, shielded electrical cable 2 further includes optional ground conductors 12. Ground conductors 12 may include ground wires or drain wires. Ground conductors 12 can be spaced apart from and extend in substantially the same direction as insulated conductors 6. Shielding films 8 can be disposed around ground conductors 12. The adhesive layer 10 may bond shielding films 8 to each other in the pinched portions 9 on both sides of ground conductors 12. Ground conductors 12 may electrically contact at least one of the shielding films 8.

Shielded electrical cable 2 further and optionally includes EMI absorbing layers 15 disposed on both sides of cable 2. EMI absorbing layers 15 attenuate the electromagnetic field primarily by absorbing the field. Shielding films 8 attenuate the electromagnetic field primarily by reflecting the field. In general, cable 2 can have no or one or more shielding films 8 and/or no or one or more EMI absorbing layers 15. In some cases, shielding films 8 and EMI absorbing layers 15 in combination, but not individually, reduce the cross-talk between neighboring conductor sets 4 to an acceptable and pre-determined level. In such cases, each of shielding films 8 and EMI absorbing layers 15 reduce the cross-talk to a level that is greater than the pre-determined and desirable level, but, in combination, they reduce the cross-talk to a level that is equal to or less than the pre-determined and desirable level.

EMI absorbing layers 15 can include any type material that is capable of attenuating an electromagnetic field primarily through absorption. For example, in some cases, the EMI absorbing material can be a dielectric material having a magnetic permeability of greater than one, or greater than two, or greater than three, in the desired frequency range, and which exhibits a non-negligible magnetic loss tangent. Examples of EMI absorbing materials include EMI Absorbers AB-2000 Series or EMI Absorbers AB-5000 Series, both commercially available from 3M Company, St. Paul, Minn. EMI Absorbers AB-2000 Series includes a thin, flexible backing made of silicone rubber and magnetic materials, with an acrylic pressure-sensitive adhesive. EMI Absorbers AB-5000 Series includes a flexible soft metal flake filler in polymer resin with an acrylic adhesive system and removable liner. Examples of EMI absorbing materials include ferromagnetic materials such as, e.g., ferrite materials. A ferrite material may be formed of non-conductive, Fe-oxide compounds including $Fe_2O_3$ and/or $Fe_3O_4$ as well as other metal oxides. In some cases, an EMI absorbing material can be formed as polymeric resin that includes ferromagnetic powder. In some cases, the composition and structure of EMI absorbing material can be selected to absorb electromagnetic waves at one or more frequency generally associated with the electromagnetic field generated by the conductor sets. In some cases, the composite EMI absorbing material can absorb electromagnetic waves over a range of frequencies.

Figure 2A:
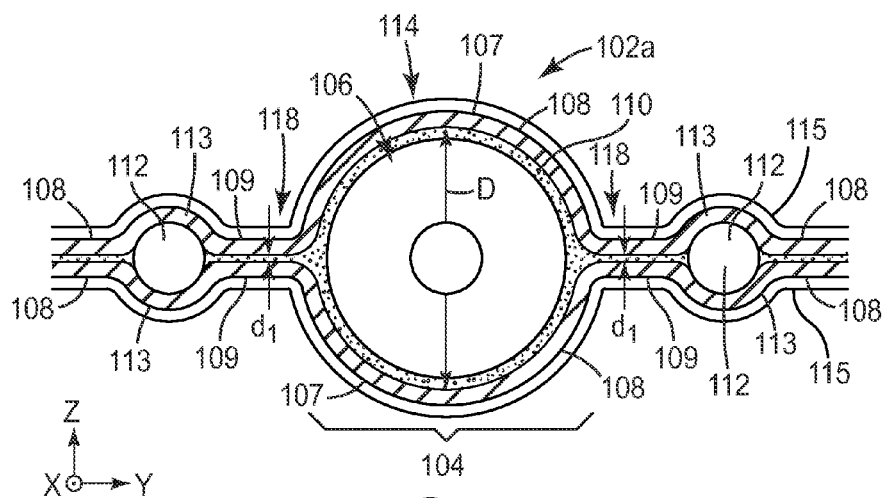

The cross-sectional views of FIGS. 2a-2g may represent various shielded electrical cables, or portions of cables. In FIG. 2a, shielded electrical cable 102a includes a single conductor set 104. Conductor set 104 extends along the length of the cable along the x-axis or direction and has only a single insulated conductor 106. If desired, the cable 102a may be made to include multiple conductor sets 104 spaced apart from each other across a width of the cable 102a along the y-axis and extending along the length of the cable. Two shielding films 108 are disposed on opposite sides of the cable. Furthermore, two EMI absorbing layers 115 are disposed on the shielding films on opposite first and second sides of the cable. Furthermore, two EMI absorbing layers 115 are disposed on the shielding films on opposite sides of the cable. The cable 102a includes a cover region 114 and pinched regions 118. In the cover region 114 of the cable 102a, the shielding films 108 include cover portions 107 that cover the conductor set 104. In transverse cross section in the yz-plane, the cover portions 107, in combination, substantially surround the conductor set 104. In the pinched regions 118 of the cable 102a, the shielding films 108 include pinched portions 109 on each side of the conductor set 104.

In the exemplary cable 102a, the shielding films are disposed between the EMI absorbing layers and the conductor sets. In some cases, the EMI absorbing layers can be disposed between the shielding films and the conductor sets. In some cases, not shown expressly in FIG. 2a, a shielding film may be disposed between two EMI absorbing layers on the same side of the cable, or an EMI absorbing layer may be disposed between two shielding films on the same side of the cable. In some cases, the cable can include alternating layers of shielding films and EMI absorbing layers.

An optional adhesive layer 110 may be disposed between shielding films 108. Shielded electrical cable 102a further includes optional ground conductors 112. Ground conductors 112 are spaced apart from and extend in substantially the same direction (x-axis) as insulated conductor 106. Conductor set 104 and ground conductors 112 can be arranged so that they lie generally in a plane, such as the xy-plane, as illustrated in FIG. 2a.

Second cover portions 113 of shielding films 108 are disposed around, and cover, the ground conductors 112. The adhesive layer 110 may bond the shielding films 108 to each other on both sides of ground conductors 112. Ground conductors 112 may electrically contact at least one of shielding films 108. In FIG. 2a, insulated conductor 106 and shielding films 108 are effectively arranged in a coaxial cable configuration with extensions on both sides of the conductor set. The coaxial cable configuration of FIG. 2a can be used in a single ended circuit arrangement.

As illustrated in the transverse cross sectional view of FIG. 2a, there is a maximum separation, D, between the cover portions 107 of the shielding films 108, and there is a minimum separation, $d_1$, between the pinched portions 109 of the shielding films 108.

FIG. 2a shows the adhesive layer 110 disposed between the pinched portions 109 of the shielding films 108 in the pinched regions 118 of the cable 102a and disposed between the cover portions 107 of the shielding films 108 and the insulated conductor 106 in the cover region 114 of the cable 102a. In this arrangement, the adhesive layer 110 bonds the pinched portions 109 of the shielding films 108 together in the pinched regions 118 of the cable, and bonds the cover portions 107 of the shielding films 108 to the insulated conductor 106 in the cover region 114 of the cable 102a.

Figure 2B:
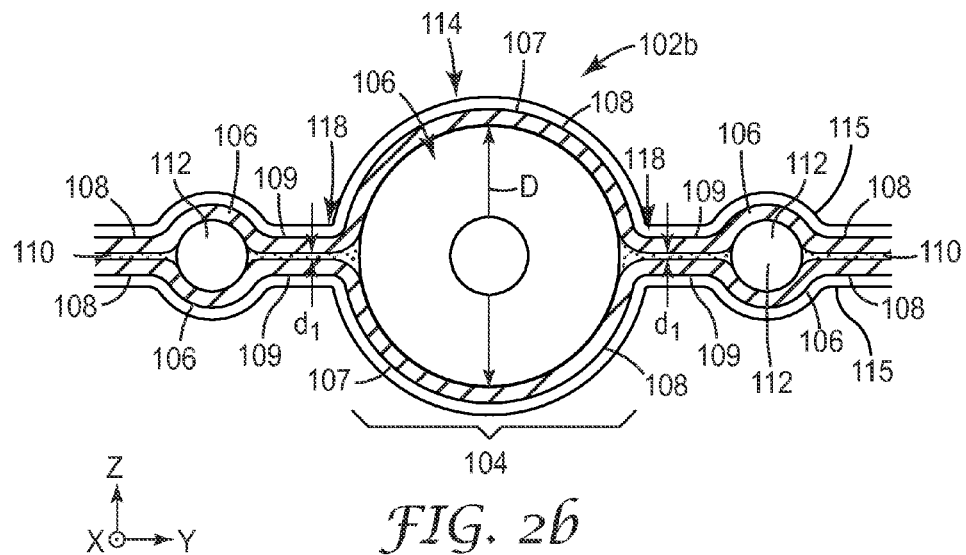

Shielded cable 102b of FIG. 2b is similar to cable 102a of FIG. 2a, with similar elements identified by similar reference numerals. In FIG. 2b, the optional adhesive layer 110 is not present between the cover portions 107 of the shielding films 108 and the insulated conductor 106 in the cover region 114 of the cable 102b. In this arrangement, the adhesive layer 110 bonds the pinched portions 109 of the shielding films 108 together in the pinched regions 118 of the cable, but the adhesive layer 110 does not bond cover portions 107 of the shielding films 108 to the insulated conductor 106 in the cover regions 114 of the cable 102b.

Figure 2C:
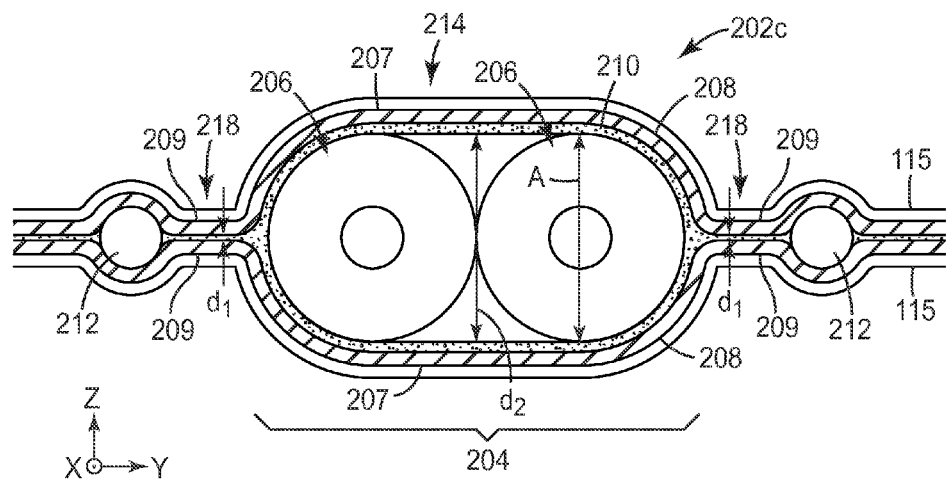

Referring to FIG. 2c, shielded electrical cable 202c is similar to shielded electrical cable 102a of FIG. 2a. Cable 202c has a single conductor set 204 which has two insulated conductors 206. If desired, the cable 202c may be made to include multiple conductor sets 204 spaced part across a width of the cable 202c and extending along a length of the cable. Insulated conductors 206 are arranged generally in a single plane (the xy-plane) and effectively in a twinaxial configuration. The twin axial cable configuration of FIG. 2c can be used in a differential pair circuit arrangement or in a single ended circuit arrangement.

Two shielding films 208 and EMI absorbing layers 115 are disposed on opposite sides of conductor set 204. The cable 202c includes a cover region 214 and pinched regions 218. In the cover region 214 of the cable 202c, the shielding films 208 include cover portions 207 that cover the conductor set 204. In transverse cross section, the cover portions 207, in combination, substantially surround the conductor set 204. In the pinched regions 218 of the cable 202c, the shielding films 208 include pinched portions 209 on each side of the conductor set 204.

An optional adhesive layer 210c may be disposed between shielding films 208. Shielded electrical cable 202c further includes optional ground conductors 212. Ground conductors 212 are spaced apart from, and extend in substantially the same direction as, insulated conductors 206 along the x-axis. Conductor set 204 and ground conductors 212 can be arranged so that they lie generally in a plane, such as the xy-plane, as illustrated in FIG. 2c.

As illustrated in the cross section of FIG. 2c, there is a maximum separation, D, between the cover portions 207 of the shielding films 208; there is a minimum separation, $d_1$, between the pinched portions 209 of the shielding films 208; and there is a minimum separation, $d_2$, between the shielding films 208 between the insulated conductors 206. Cable 202c can be characterized by a maximum separation, D, between the cover portions 107 of the shielding films 108, a minimum separation, $d_2$, between the cover portions 107 of the shielding films 108, and a minimum separation, $d_1$, between the pinched portions 109 of the shielding films 108. In some cases, the ratio $d_1/D$ is less than 0.25 or less than 0.1. In some cases, $d_2/D$ is greater than 0.33.

FIG. 2c shows the adhesive layer 210c disposed between the pinched portions 209 of the shielding films 208 in the pinched regions 218 of the cable 202 and disposed between the cover portions 207 of the shielding films 208 and the insulated conductors 206 in the cover region 214 of the cable 202c. In this arrangement, the adhesive layer 210c bonds the pinched portions 209 of the shielding films 208 together in the pinched regions 218 of the cable 202c, and also bonds the cover portions 207 of the shielding films 208 to the insulated conductors 206 in the cover region 214 of the cable 202c.

Figure 2D:
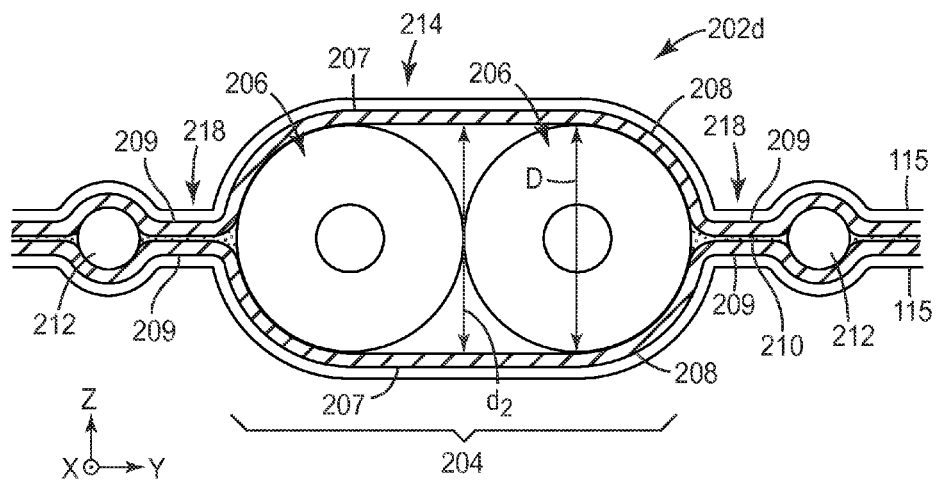

Shielded cable 202d of FIG. 2d is similar to cable 202c of FIG. 2c, with similar elements identified by similar reference numerals, except that in cable 202d the optional adhesive layer 210d is not present between the cover portions 207 of the shielding films 208 and the insulated conductors 206 in the cover region 214 of the cable. In this arrangement, the adhesive layer 210d bonds the pinched portions 209 of the shielding films 208 together in the pinched regions 218 of the cable, but does not bond the cover portions 207 of the shielding films 208 to the insulated conductors 206 in the cover region 214 of the cable 202d.

Figure 2E:
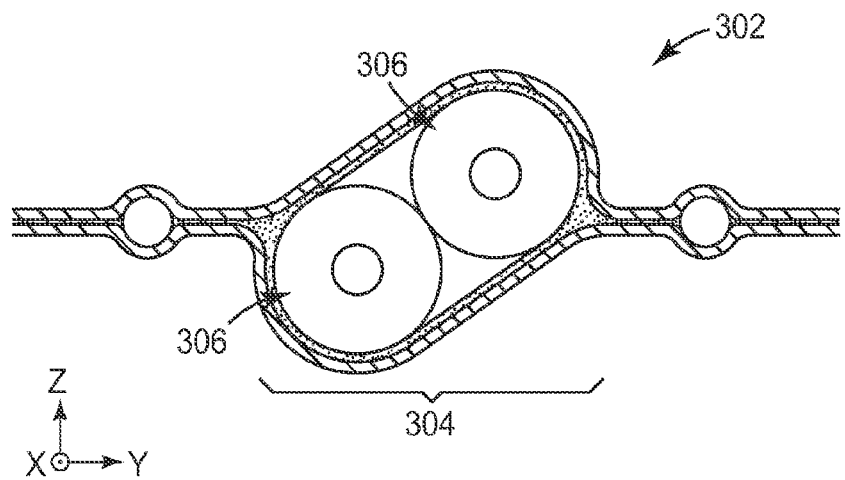

Referring now to FIG. 2e, we see there a transverse cross-sectional view of a shielded electrical cable 302 similar in many respects to the shielded electrical cable 102a of FIG. 2a. However, where cable 102a includes a single conductor set 104 having only a single insulated conductor 106, cable 302 includes a single conductor set 304 that has two insulated conductors 306 extending along the length of the cable 302 along the x-axis or direction. Cable 302 may be made to have multiple conductor sets 304 spaced apart from each other across a width of the cable 302 and extending along a length of the cable 302. Insulated conductors 306 are arranged effectively in a twisted pair cable arrangement, whereby insulated conductors 306 twist around each other and extend along the length of the cable 302 along the x-axis or direction.

Figure 2F:
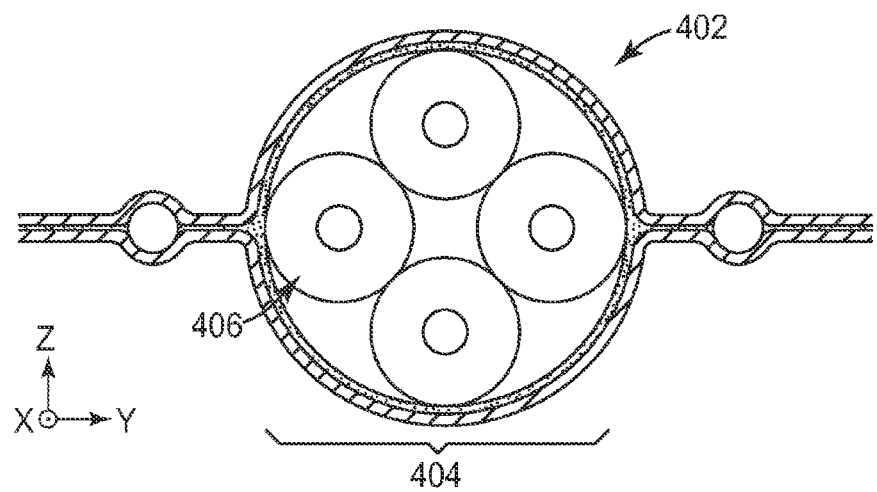

FIG. 2f depicts another shielded electrical cable 402 that is also similar in many respects to the shielded electrical cable 102a of FIG. 2a. However, where cable 102a includes a single conductor set 104 having only a single insulated conductor 106, cable 402 includes a single conductor set 404 that has four insulated conductors 406 extending along the length of the cable 402 along the x-axis or direction. The cable 402 may be made to have multiple conductor sets 404 spaced apart from each other across a width of the cable 302 along the y-axis and extending along the length of the cable 302 along the x-axis.

Insulated conductors 406 are arranged effectively in a quad cable arrangement, whereby insulated conductors 406 may or may not twist around each other as insulated conductors 406 extend along the length of the cable 402 along the x-axis.

Referring back to FIGS. 2a-2f, further embodiments of shielded electrical cables may include a plurality of spaced apart conductor sets 104, 204, 304, or 404, or combinations thereof, arranged generally in a single plane. Optionally, the shielded electrical cables may include a plurality of ground conductors 112 spaced apart from, and extending generally in the same direction as, the insulated conductors of the conductor sets. In some configurations, the conductor sets and ground conductors can be arranged generally in a single plane. FIG. 2g illustrates an exemplary embodiment of such a shielded electrical cable.

Referring to FIG. 2g, shielded electrical cable 502 includes a plurality of spaced apart conductor sets 504a, 504b arranged generally in the xy-plane where each conductor set includes one or two insulated conductors 506. Shielded electrical cable 504 further includes optional ground conductors 112 disposed between conductor sets 504a, 504b and at both sides or edges of shielded electrical cable 502.

First and second shielding films 508 are disposed on opposite first and second sides of the cable 502 and are arranged so that, in transverse cross section in the yz-plane, the cable 502 includes cover regions 524 and pinched regions 528. In the cover regions 524 of the cable, cover portions 517 of the first and second shielding films 508 in transverse cross section substantially surround each conductor set 504a, 504b. For example, the cover portions of the first and second shielding films in combination substantially surround each conductor set by encompassing at least 70% of a periphery of each conductor set. Pinched portions 519 of the first and second shielding films 508 form the pinched regions 518 on two sides of each conductor set 504a, 504b.

The shielding films 508 are disposed around ground conductors 112. An optional adhesive layer 510 is disposed between shielding films 208 and bonds the pinched portions 519 of the shielding films 508 to each other in the pinched regions 528 on both sides of each conductor set 504a, 504b. Shielded electrical cable 502 includes a combination of coaxial cable arrangements (conductor sets 504a) and a twinaxial cable arrangement (conductor set 504b) and may therefore be referred to as a hybrid cable arrangement. In some cases, cable 502 can include one or more EMI absorbing layers, not expressly shown in FIG. 2g, disposed on the conductor sets on one or both sides of the cable.

The shielding films used in the disclosed shielded cables can have a variety of configurations and can be made in a variety of ways. FIGS. 7a-7d illustrate four exemplary embodiments of a shielded electrical cable according to aspects of the present invention. FIGS. 3a-3d illustrate various examples of constructions of the shielding films of the shielded electrical cables. In one aspect, at least one of the shielding films may include a conductive layer and a non-conductive polymeric layer. The conductive layer may include any suitable conductive material, including but not limited to copper, silver, aluminum, gold, and alloys thereof. The non-conductive polymeric layer may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. The non-conductive polymeric layer may include one or more additives and/or fillers to provide properties suitable for the intended application. In another aspect, at least one of the shielding films may include a laminating adhesive layer disposed between the conductive layer and the non-conductive polymeric layer. For shielding films that have a conductive layer disposed on a non-conductive layer, or that otherwise have one major exterior surface that is electrically conductive and an opposite major exterior surface that is substantially non-conductive, the shielding film may be incorporated into the shielded cable in several different orientations as desired. In some cases, for example, the conductive surface may face the conductor sets of insulated wires and ground wires, and in some cases the non-conductive surface may face those components. In cases where two shielding films are used on opposite sides of the cable, the films may be oriented such that their conductive surfaces face each other and each face the conductor sets and ground wires, or they may be oriented such that their non-conductive surfaces face each other and each face the conductor sets and ground wires, or they may be oriented such that the conductive surface of one shielding film faces the conductor sets and ground wires, while the non-conductive surface of the other shielding film faces conductor sets and ground wires from the other side of the cable.

In some cases, at least one of the shielding films may include a stand-alone conductive film, such as a compliant or flexible metal foil. The construction of the shielding films may be selected based on a number of design parameters suitable for the intended application, such as, e.g., flexibility, electrical performance, and configuration of the shielded electrical cable (such as, e.g., presence and location of ground conductors). In some cases, the shielding films have an integrally formed construction. In some cases, the shielding films may have a thickness in the range of 0.01 mm to 0.05 mm. The shielding films desirably provide isolation, shielding, and precise spacing between the conductor sets, and allow for a more automated and lower cost cable manufacturing process. In addition, the shielding films are conductive sheets and prevent a phenomenon known as "signal suck-out" or resonance, whereby high signal attenuation occurs at a particular frequency range. This phenomenon typically occurs in conventional shielded electrical cables where a conductive shield is a ribbon wrapped around a conductor set.

Figure 3A:
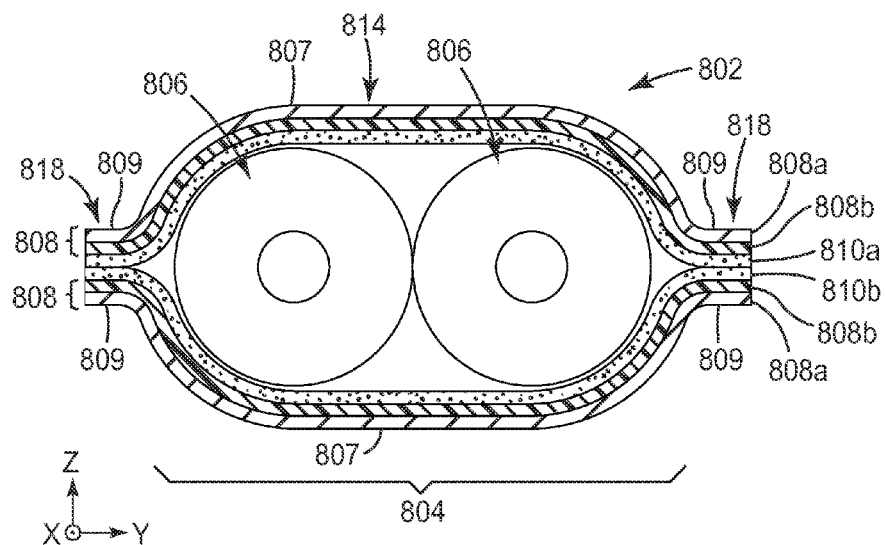
FIGS. 3a-3d are front cross-sectional views of four other exemplary embodiments of a shielded electrical cable.

FIG. 3a is a cross sectional view across a width of a shielded electrical cable 802 that shows a single conductor set 804. Conductor set 804 includes two insulated conductors 806 that extend along a length of the cable 802 along the x-axis. Cable 802 may include multiple conductor sets 804 spaced apart from each other across the width of the cable 802 along the y-axis. Two shielding films 808 are disposed on opposite sides of the cable 802 where each shielding film includes a conductive layer 808a disposed on a non-conductive polymeric layer 808b. Non-conductive polymeric layer 808b faces insulated conductors 806. Conductive layer 808a may be deposited onto non-conductive polymeric layer 808b using any suitable method. In transverse cross section in the yz-plane, cover portions 807 of the shielding films 808, in combination, substantially surround the conductor set 804 in the cover region 814 of the cable 802. For example, the cover portions of the first and second shielding films in combination substantially surround each conductor set by encompassing at least 70% of a periphery of each conductor set. Pinched portions 809 of the shielding films 808 form pinched regions 818 of the cable 802 on each side of the conductor set 804.

Shielding films 808 may include optional adhesive layers 810a, 810b that bond the pinched portions 809 of the shielding films 808 to each other in the pinched regions 818 of the cable 802. Adhesive layer 810a is disposed on one of the non-conductive polymeric layers 808b and adhesive layer 810b is disposed on another of the non-conductive polymeric layers 808b. The adhesive layers 810a, 810b may or may not be present in the cover region 814 of the cable 802. If present, the adhesive layers 810a, 810b may extend fully or partially across the width of the cover portions 807 of the shielding film 808, bonding the cover portions 807 of the shielding films 808 to the insulated conductors 806.

In this example, insulated conductors 806 and shielding films 808 are arranged generally in a single plane, such as the xy-plane, and effectively in a twinaxial configuration which may be used in a single ended circuit arrangement or a differential pair circuit arrangement.

Figure 3B:
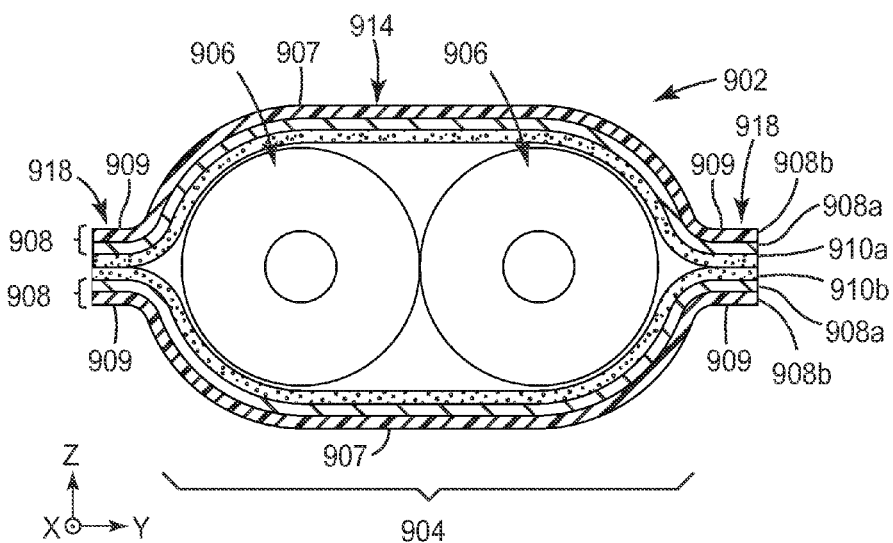

FIG. 3b is a cross sectional view across a width of a shielded electrical cable 902 that shows a single conductor set 904. Conductor set 904 includes two insulated conductors 906 that extend along a length of the cable 902 along the x-axis. Cable 902 may include multiple conductor sets 904 spaced apart from each other along a width of the cable 902 along the y-axis and extending along a length of the cable 902. Two shielding films 908 are disposed on opposite sides of the cable 902 where each shielding film includes a conductive layer 908a disposed on a non-conductive polymeric layer 908b. Conductive layer 908a faces insulated conductors 906. Conductive layer 908a may be deposited onto non-conductive polymeric layer 908b using any suitable method. In transverse cross section, cover portions 907 of the shielding films 908, in combination, substantially surround the conductor set 904 in the cover regions 914 of the cable 902. Pinched portions 909 of the shielding films 908 form pinched regions 918 of the cable 902 on each side of the conductor set 904.

One or more optional adhesive layers 910a, 910b bond the pinched portions 909 of the shielding films 908 to each other in the pinched regions 918 on both sides of conductor set 904. The adhesive layers 910a, 910b may extend fully or partially across the width of the cover portions 907 of the shielding film 908. Insulated conductors 906 are arranged generally in a single plane and effectively form a twinaxial cable configuration and can be used in a single ended circuit arrangement or a differential pair circuit arrangement.

Figure 3C:
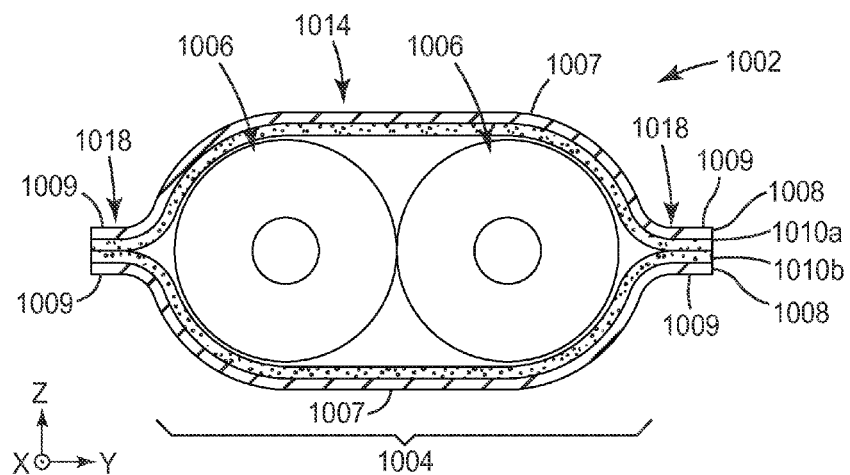

FIG. 3c is a cross sectional view across a width of a shielded electrical cable 1002 showing a single conductor set 1004. Conductor set 1004 includes two insulated conductors 1006 that extend along a length of the cable 1002 along the x-axis. Cable 1002 may include multiple conductor sets 1004 spaced apart from each other along a width of the cable 1002 along the y-axis and extending along a length of the cable 1002. Two shielding films 1008 are disposed on opposite sides of the cable 1002 and include cover portions 1007. In transverse cross section, the cover portions 1007, in combination, substantially surround the conductor set 1004 in a cover region 1014 of the cable 1002. Pinched portions 1009 of the shielding films 1008 form pinched regions 1018 of the cable 1002 on each side of the conductor set 1004.

Cable 1002 includes one or more optional adhesive layers 1010a, 1010b that bond the pinched portions 1009 of the shielding films 1008 to each other on both sides of conductor set 1004 in the pinched regions 1018. The adhesive layers 1010a, 1010b may extend fully or partially across the width of the cover portions 1007 of the shielding film 1008. Insulated conductors 1006 are arranged generally in a single plane, such as the xy-plane, and effectively in a twinaxial cable configuration that can be used in a single ended circuit arrangement or a differential pair circuit arrangement. Shielding films 1008 include a stand-alone conductive film.

Figure 3D:
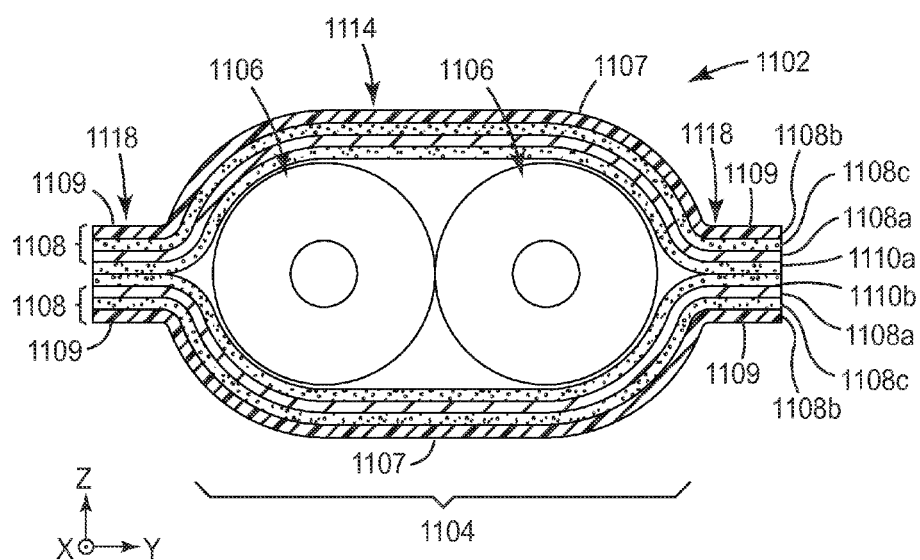

FIG. 3d is a cross sectional view of a shielded electrical cable 1102 that shows a single conductor set 1104. Conductor set 1104 includes two insulated conductors 1106 which extend along a length of the cable 1102 along the x-axis. Cable 1102 may include multiple conductor sets 1104 spaced apart from each other along a width of the cable 1102 along the y-axis and extending along a length of the cable 1102. Two shielding films 1108 are disposed on opposite sides of the cable 1102 and include cover portions 1107. In transverse cross section, the cover portions 1107, in combination, substantially surround conductor set 1104 in a cover region 1114 of the cable 1102. Pinched portions 1109 of the shielding films 1108 form pinched regions 1118 of the cable 1102 on each side of the conductor set 1104.

Shielding films 1108 include one or more optional adhesive layers 1110a and 1110b that bond the pinched portions 1109 of the shielding films 1108 to each other in the pinched regions 1118 on both sides of conductor set 1104. The adhesive layer 1010a, 1010b may extend fully or partially across the width of the cover portions 1107 of the shielding film 1108.

Insulated conductors 1106 are arranged generally in a single plane, such as the xy-plane, and effectively in a twinaxial cable configuration. The twinaxial cable configuration can be used in a single ended circuit arrangement or a differential circuit arrangement. Shielding films 1108 include a conductive layer 1108a, a non-conductive polymeric layer 1108b, and a laminating adhesive layer 1108c disposed between conductive layer 1108a and non-conductive polymeric layer 1108b, thereby laminating conductive layer 1108a to non-conductive polymeric layer 1108b. Conductive layer 1108a faces insulated conductors 1106.

As discussed elsewhere herein, adhesive material may be used in the cable construction to bond one or two shielding films to one, some, or all of the conductor sets at cover regions of the cable, and/or adhesive material may be used to bond two shielding films together at pinched regions of the cable. A layer of adhesive material may be disposed on at least one shielding film, and in cases where two shielding films are used on opposite sides of the cable, a layer of adhesive material may be disposed on both shielding films. In the latter cases, the adhesive used on one shielding film is preferably the same as, but may if desired be different from, the adhesive used on the other shielding film. A given adhesive layer may include an electrically insulative adhesive, and may provide an insulative bond between two shielding films. Furthermore, a given adhesive layer may provide an insulative bond between at least one of shielding films and insulated conductors of one, some, or all of the conductor sets, and between at least one of shielding films and one, some, or all of the ground conductors (if any). Alternatively, a given adhesive layer may include an electrically conductive adhesive, and may provide a conductive bond between two shielding films. Furthermore, a given adhesive layer may provide a conductive bond between at least one of shielding films and one, some, or all of the ground conductors (if any). Suitable conductive adhesives include conductive particles to provide the flow of electrical current. The conductive particles can be any of the types of particles currently used, such as spheres, flakes, rods, cubes, amorphous, or other particle shapes. They may be solid or substantially solid particles such as carbon black, carbon fibers, nickel spheres, nickel coated copper spheres, metal-coated oxides, metal-coated polymer fibers, or other similar conductive particles. These conductive particles can be made from electrically insulating materials that are plated or coated with a conductive material such as silver, aluminum, nickel, or indium tin-oxide. The metal-coated insulating material can be substantially hollow particles such as hollow glass spheres, or may comprise solid materials such as glass beads or metal oxides. The conductive particles may be on the order of several tens of microns to nanometer sized materials such as carbon nanotubes. Suitable conductive adhesives may also include a conductive polymeric matrix.

When used in a given cable construction, an adhesive layer is preferably substantially conformable in shape relative to other elements of the cable, and conformable with regard to bending motions of the cable. In some cases, a given adhesive layer may be substantially continuous, e.g., extending along substantially the entire length and width of a given major surface of a given shielding film. In some cases, the adhesive layer may be substantially discontinuous. For example, the adhesive layer may be present only in some portions along the length or width of a given shielding film. A discontinuous adhesive layer may for example include a plurality of longitudinal adhesive stripes that are disposed, e.g., between the pinched portions of the shielding films on both sides of each conductor set and between the shielding films beside the ground conductors (if any). A given adhesive material may be or include at least one of a pressure sensitive adhesive, a hot melt adhesive, a thermoset adhesive, and a curable adhesive. An adhesive layer may be configured to provide a bond between shielding films that is substantially stronger than a bond between one or more insulated conductor and the shielding films. This may be achieved, e.g., by appropriate selection of the adhesive formulation. An advantage of this adhesive configuration is to allow the shielding films to be readily strippable from the insulation of insulated conductors. In other cases, an adhesive layer may be configured to provide a bond between shielding films and a bond between one or more insulated conductor and the shielding films that are substantially equally strong. An advantage of this adhesive configuration is that the insulated conductors are anchored between the shielding films. When a shielded electrical cable having this construction is bent, this allows for little relative movement and therefore reduces the likelihood of buckling of the shielding films. Suitable bond strengths may be chosen based on the intended application. In some cases, a conformable adhesive layer may be used that has a thickness of less than about 0.13 mm. In exemplary embodiments, the adhesive layer has a thickness of less than about 0.05 mm.

A given adhesive layer may conform to achieve desired mechanical and electrical performance characteristics of the shielded electrical cable. For example, the adhesive layer may conform to be thinner between the shielding films in areas between conductor sets, which increases at least the lateral flexibility of the shielded cable. This may allow the shielded cable to be placed more easily into a curvilinear outer jacket. In some cases, an adhesive layer may conform to be thicker in areas immediately adjacent the conductor sets and substantially conform to the conductor sets. This may increase the mechanical strength and enable forming a curvilinear shape of shielding films in these areas, which may increase the durability of the shielded cable, for example, during flexing of the cable. In addition, this may help to maintain the position and spacing of the insulated conductors relative to the shielding films along the length of the shielded cable, which may result in more uniform impedance and superior signal integrity of the shielded cable.

A given adhesive layer may conform to effectively be partially or completely removed between the shielding films in areas between conductor sets, e.g., in pinched regions of the cable. As a result, the shielding films may electrically contact each other in these areas, which may increase the electrical performance of the cable. In some cases, an adhesive layer may conform to effectively be partially or completely removed between at least one of the shielding films and the ground conductors. As a result, the ground conductors may electrically contact at least one of shielding films in these areas, which may increase the electrical performance of the cable. Even in cases where a thin layer of adhesive remains between at least one of shielding films and a given ground conductor, asperities on the ground conductor may break through the thin adhesive layer to establish electrical contact as intended.

Figure 4A:
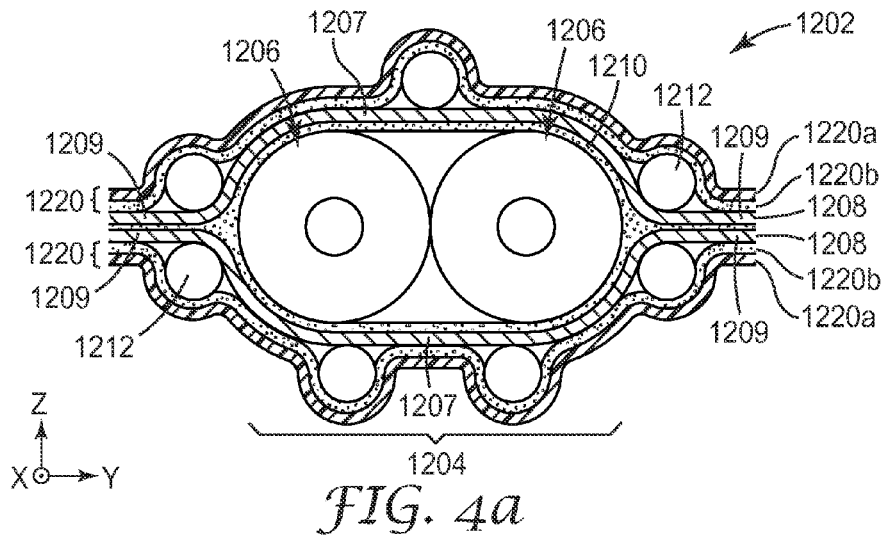
FIGS. 4a-4c are front cross-sectional views of three other exemplary embodiments of a shielded electrical cable.
Figure 4B:
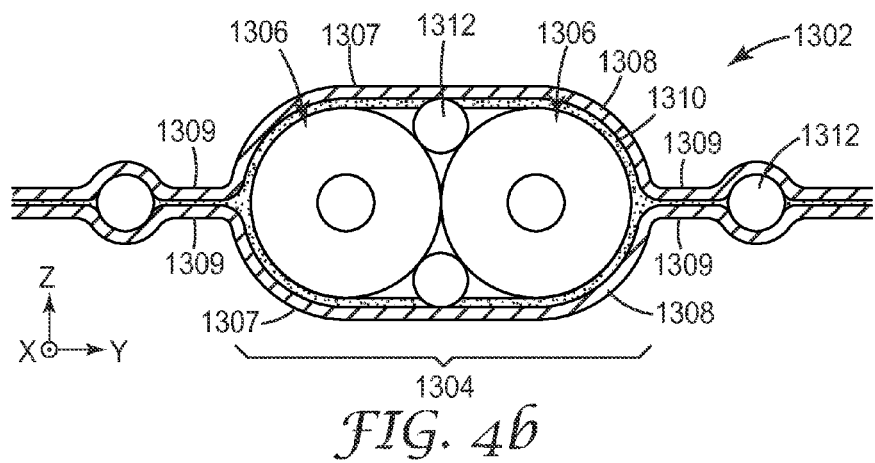
Figure 4C:
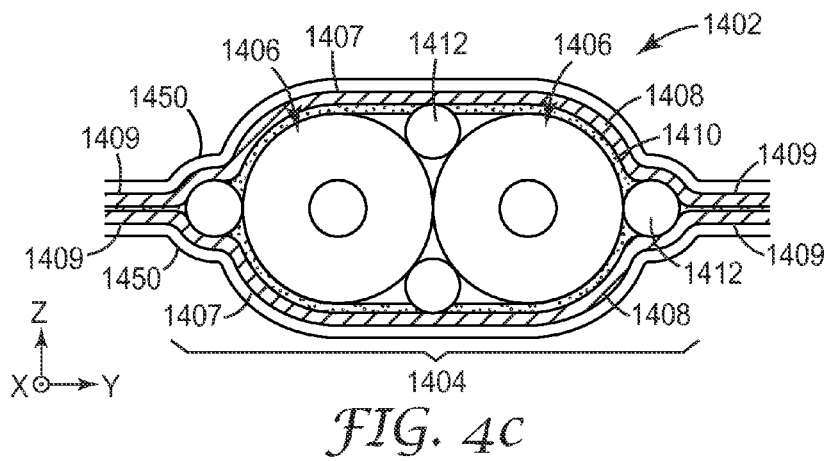

FIGS. 4a-4c are cross sectional views of three exemplary embodiments of a shielded electrical cable which illustrate examples of the placement of ground conductors in the shielded electrical cables. An aspect of a shielded electrical cable is proper grounding of the shield and such grounding can be accomplished in a number of ways. In some cases, a given ground conductor can electrically contact at least one of the shielding films such that grounding the given ground conductor also grounds the shielding films. Such a ground conductor may also be referred to as a "drain wire". Electrical contact between the shielding film and the ground conductor may be characterized by a relatively low DC resistance, e.g., a DC resistance of less than 10 ohms, or less than 2 ohms, or of substantially 0 ohms. In some cases, a given ground conductor does not electrically contact the shielding films, but may be an individual element in the cable construction that is independently terminated to any suitable individual contact element of any suitable termination component, such as, e.g., a conductive path or other contact element on a printed circuit board, paddle board, or other device. Such a ground conductor may also be referred to as a "ground wire". FIG. 4a illustrates an exemplary shielded electrical cable in which ground conductors are positioned external to the shielding films. FIGS. 4b-4c illustrate embodiments in which the ground conductors are positioned between the shielding films, and may be included in the conductor set. One or more ground conductors may be placed in any suitable position external to the shielding films, between the shielding films, or a combination of both.

Referring to FIG. 4a, a shielded electrical cable 1202 includes a single conductor set 1204 that extends along a length of the cable 1202 along the x-axis. Conductor set 1204 includes two insulated conductors 1206, i.e., one pair of insulated conductors. Cable 1202 may include multiple conductor sets 1204 spaced apart from each other across a width of the cable along the y-axis and extending along a length of the cable 1202. Two shielding films 1208 are disposed on opposite first and second sides of the cable 1202 and include cover portions 1207 and pinched portions 1209. In transverse cross section, the cover portions 1207, in combination, substantially surround conductor set 1204. An optional adhesive layer 1210 is disposed between pinched portions 1209 of the shielding films 1208 and bonds shielding films 1208 to each other on both sides of conductor set 1204. Insulated conductors 1206 are arranged generally in a single plane, such as the xy-plane, and effectively in a twinaxial cable configuration that can be used in a single ended circuit arrangement or a differential pair circuit arrangement. Shielded electrical cable 1202 further includes a plurality of ground conductors 1212 positioned external to shielding films 1208. Ground conductors 1212 are placed over, under, and on both sides of conductor set 1204. Optionally, shielded electrical cable 1202 includes protective films 1220 surrounding shielding films 1208 and ground conductors 1212. Protective films 1220 include a protective layer 1220a and an adhesive layer 1220b bonding protective layer 1220a to shielding films 1208 and ground conductors 1212. Alternatively, shielding films 1208 and ground conductors 1212 may be surrounded by an outer conductive shield, such as, e.g., a conductive braid, and an outer insulative jacket (not shown). In some cases, at least one protective layer 1220a and adhesive layer 1220b can be electrically conductive Referring to FIG. 4b, shielded electrical cable 1302 includes a single conductor set 1304 that extends along a length of cable 1302 along the x-axis. Conductor set 1304 includes two insulated conductors 1306. Cable 1302 may include multiple conductor sets 1304 spaced apart from each other across a width of the cable 1302 along the y-axis and extending along the length of the cable 1302. Two shielding films 1308 are disposed on opposite first and second sides of the cable 1302 and include cover portions 1307 and pinched portions 1309. In transverse cross section, cover portions, in combination, substantially surround conductor set 1304. An optional adhesive layer 1310 is disposed between pinched portions 1309 of the shielding films 1308 and bonds shielding films 1308 to each other on both sides of conductor set 1304. Insulated conductors 1306 are arranged generally in a single plane and effectively in a twinaxial or differential pair cable arrangement. Shielded electrical cable 1302 further includes a plurality of ground conductors 1312 positioned between shielding films 1308. Two of the ground conductors 1312 are included in conductor set 1304, and two of the ground conductors 1312 are spaced apart from conductor set 1304.

Referring to FIG. 4c, shielded electrical cable 1402 includes a single conductor set 1404 that extends along a length of cable 1402 along the x-axis. Conductor set 1404 includes two insulated conductors 1406. Cable 1402 may include multiple conductor sets 1304 spaced apart from each other across a width of the cable 1402 along the y-axis and extending along the length of the cable 1402. Two shielding films 1408 are disposed on opposite first and second sides of the cable 1402 and include cover portions 1407 and pinched portions 1409. In transverse cross section, the cover portions 1407, in combination, substantially surround conductor set 1404. An optional adhesive layer 1410 is disposed between pinched portions 1409 of the shielding films 1408 and bonds shielding films 1408 to each other on both sides of conductor set 1404. Insulated conductors 1406 are arranged generally in a single plane and effectively in a twinaxial or differential pair cable arrangement. Shielded electrical cable 1402 further includes a plurality of ground conductors 1412 positioned between shielding films 1408. All of the ground conductors 1412 are included in conductor set 1404. Two of the ground conductors 1412 and insulated conductors 1406 are arranged generally in a single plane, such as the xy-plane. Shielded electrical cable 1402 further includes EMI absorbing layers 1450 disposed on shielding films 1408 and conductor set 1404 on both sides of the cable.

FIGS. 5a-5g illustrate an exemplary method of making a shielded electrical cable that may be substantially the same as that shown in FIG. 1.

In the step illustrated in FIG. 5a, insulated conductors 6 are formed using any suitable method, such as, e.g., extrusion, or are otherwise provided. Insulated conductors 6 include conductor 6a surrounded by insulator 6b and may be formed of any suitable length. Insulated conductors 6 may then be provided as such or cut to a desired length. Ground conductors 12 (see FIG. 5c) may be formed and provided in a similar fashion.

In the step illustrated in FIG. 5b, one or more shielding films 8 are formed. A single layer or multilayer web may be formed using any suitable method, such as, e.g., continuous wide web processing. Each shielding film 8 may be formed of any suitable length. The shielding film 8 may then be provided as such or cut to a desired length and/or width. The shielding film 8 may be pre-formed to have transverse partial folds to increase flexibility in the longitudinal direction. One or both of the shielding films 8 may include a conformable adhesive layer 10, which may be formed on the shielding film 8 using any suitable method, such as, e.g., laminating, coating or sputtering.

In the step illustrated in FIG. 5c, a plurality of insulated conductors 6, ground conductors 12, and shielding films 8 are provided. A forming tool 24 is provided. Forming tool 24 includes a pair of forming rolls 26a, 26b having a shape corresponding to a desired cross-sectional shape of the shielded electrical cable 2, the forming tool also including a bite 28. Insulated conductors 6, ground conductors 12, and shielding films 8 are arranged according to the configuration of desired shielded electrical cable 2, such as any of the cables shown and/or described herein, and positioned in proximity to forming rolls 26a, 26b, after which they are concurrently fed into bite 28 of forming rolls 26a, 26b and disposed between forming rolls 26a, 26b. Forming tool 24 forms shielding films 8 around conductor sets 4 and ground conductor 12 and bonds shielding films 8 to each other on both sides of each conductor set 4 and ground conductors 12. Heat may be applied to facilitate bonding. Although in this embodiment, forming shielding films 8 around conductor sets 4 and ground conductor 12 and bonding shielding films 8 to each other on both sides of each conductor set 4 and ground conductors 12 occur in a single operation, in other embodiments, these steps may occur in separate operations.

Other layers can be included in the arrangement that is fed into bite 28 of forming rolls 26a and 26b. For example, one or more EMI absorbing layer, one or more protective layers, and/or one or more jacket layers can be included in the arrangement and fed into bite 28.

Figure 5D:
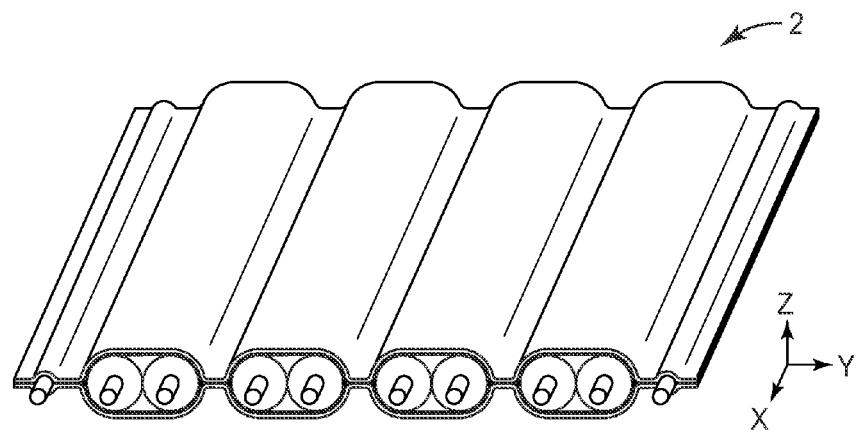
Figure 5E:
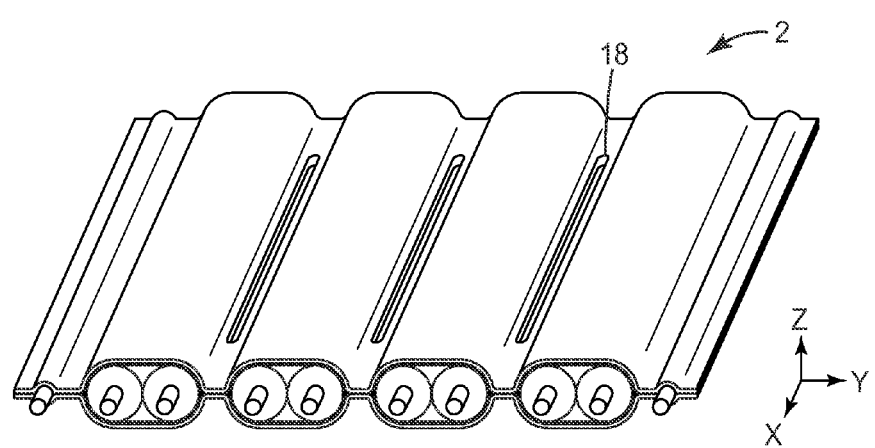

FIG. 5d illustrates shielded electrical cable 2 as it is formed by forming tool 24. In the optional step illustrated in FIG. 5e, longitudinal splits 18 are formed between conductor sets 4. Splits 18 may be formed in shielded electrical cable 2 using any suitable method, such as, e.g., laser cutting or punching.

Figures 5F, 5G:
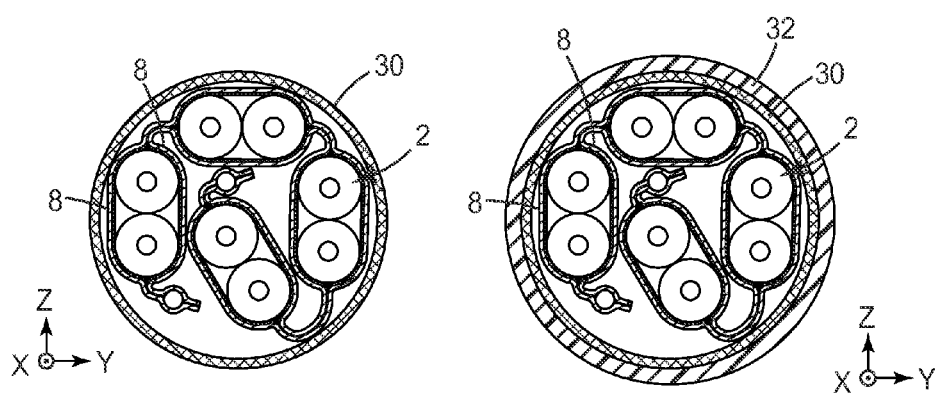

In another optional step illustrated in FIG. 5f, shielding films 8 of shielded electrical cable 2 may be folded lengthwise along the pinched regions multiple times into a bundle, and an outer conductive shield 30 may be provided around the folded bundle using any suitable method. An outer jacket 32 may also be provided around outer conductive shield 30 as schematically illustrated in FIG. 5g, using any suitable method, such as, e.g., extrusion. In some embodiments, the outer conductive shield 30 may be omitted and the outer jacket 32 may be provided around the folded shielded cable.

Figure 6A:
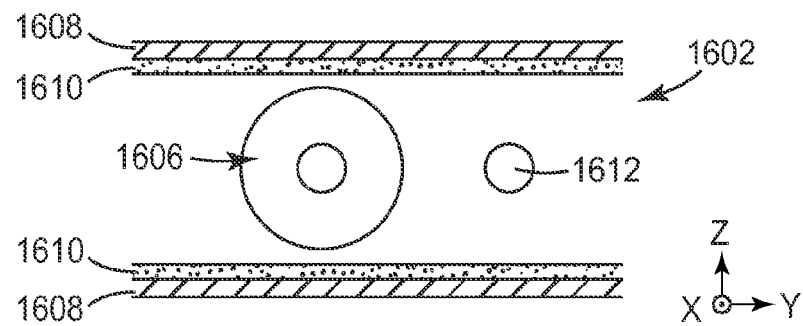
FIGS. 6a-6c are front cross-sectional views illustrating a detail of an exemplary method of making a shielded electrical cable.
Figure 6B:
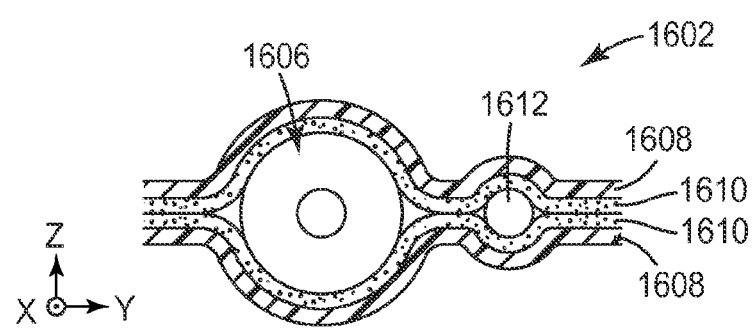
Figure 6C:
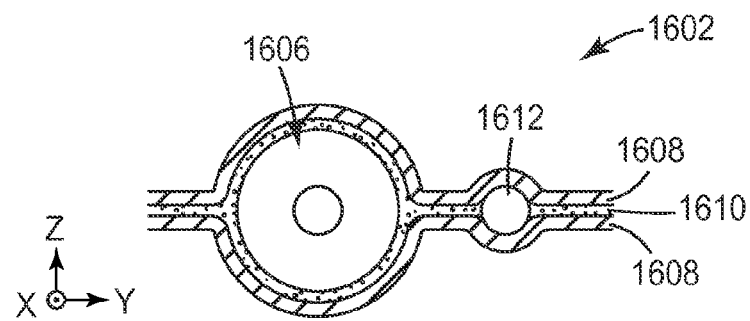

FIGS. 6a-6c illustrate a detail of an exemplary method of making a shielded electrical cable. FIGS. 6a-6c illustrate how one or more adhesive layers may be conformably shaped during the forming and bonding of the shielding films.

In the step illustrated in FIG. 6a, an insulated conductor 1606, a ground conductor 1612 spaced apart from insulated conductor 1606, and two shielding films 1608 are provided. Shielding films 1608 each include a conformable adhesive layer 1610. In the steps illustrated in FIGS. 6b-6c, shielding films 1608 are formed around insulated conductor 1606 and ground conductor 1612 and bonded to each other. Initially, as illustrated in FIG. 6b, adhesive layers 1610 still have their original thickness. As the forming and bonding of shielding films 1608 proceeds, conformable adhesive layers 1610 conform to achieve desired mechanical and electrical performance characteristics of shielded electrical cable 1602 (FIG. 6c).

As illustrated in FIG. 6c, adhesive layers 1610 conform to be thinner between shielding films 1608 on both sides of insulated conductor 1606 and ground conductor 1612; a portion of adhesive layers 1610 displaces away from these areas. Further, conformable adhesive layers 1610 conform to be thicker in areas immediately adjacent insulated conductor 1606 and ground conductor 1612, and substantially conform to insulated conductor 1606 and ground conductor 1612; a portion of adhesive layers 1610 displaces into these areas. Further, conformable adhesive layers 1610 conform to effectively be removed between shielding films 1608 and ground conductor 1612; conformable adhesive layers 1610 displace away from these areas such that ground conductor 1612 electrically contacts shielding films 1608.

In some approaches, a semi-rigid cable can be formed using a thicker metal or metallic material as the shielding film. For example, aluminum or other metal may be used in this approach without a polymer backing film. The aluminum (or other material) is passed through shaping dies to create corrugations in the aluminum which form cover portions and pinched portions. The insulated conductors are placed in the corrugations that form the cover portions. If drain wires are used, smaller corrugations may be formed for the drain wires. The insulated conductors and, optionally, drain wires, are sandwiched in between opposite layers of corrugated aluminum. The aluminum layers may be bonded together with adhesive or welded, for example. Connection between the upper and lower corrugated aluminum shielding films could be through the un-insulated drain wires. Alternatively, the pinched portions of the aluminum could be embossed, pinched further and/or punched through to provide positive contact between the corrugated shielding layers.

In exemplary embodiments, the cover regions of the shielded electrical cable include concentric regions and transition regions positioned on one or both sides of a given conductor set. Portions of a given shielding film in the concentric regions are referred to as concentric portions of the shielding film and portions of the shielding film in the transition regions are referred to as transition portions of the shielding film. The transition regions can be configured to provide high manufacturability and strain and stress relief of the shielded electrical cable. Maintaining the transition regions at a substantially constant configuration (including aspects such as, e.g., size, shape, content, and radius of curvature) along the length of the shielded electrical cable may help the shielded electrical cable to have substantially uniform electrical properties, such as, e.g., high frequency isolation, impedance, skew, insertion loss, reflection, mode conversion, eye opening, and jitter.

Additionally, in certain embodiments, such as, e.g., embodiments wherein the conductor set includes two insulated conductors that extend along a length of the cable that are arranged generally in a single and effectively as a twinaxial cable that can be connected in a differential pair circuit arrangement, maintaining the transition portion at a substantially constant configuration along the length of the shielded electrical cable can beneficially provide substantially the same electromagnetic field deviation from an ideal concentric case for both conductors in the conductor set. Thus, careful control of the configuration of this transition portion along the length of the shielded electrical cable can contribute to the advantageous electrical performance and characteristics of the cable. FIGS. 7a-9b illustrate various exemplary embodiments of a shielded electrical cable that include transition regions of the shielding films disposed on one or both sides of the conductor set.

Figure 7A:
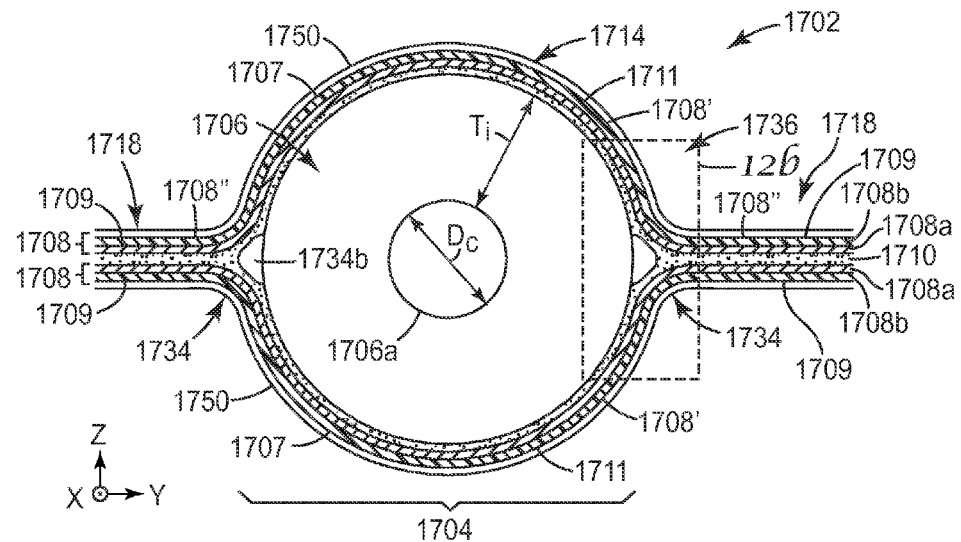
FIGS. 7a-7b are a front cross-sectional view of another exemplary embodiment of a shielded electrical cable according to an aspect of the present invention and a corresponding detail view, respectively.
Figure 7B:
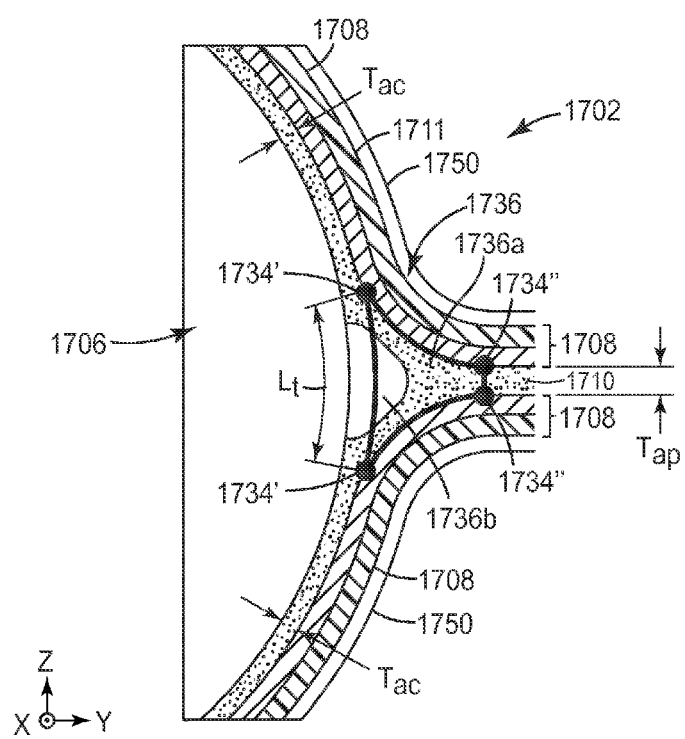

The shielded electrical cable 1702, which is shown in cross section in FIGS. 7a and 7b, includes a single conductor set 1704 that extends along a length of the cable 1702 along the x-axis. The shielded electrical cable 1702 may be made to have multiple conductor sets 1704 spaced apart from each other along a width of the cable 1702 along the y-axis and extending along a length of the cable 1702. Although only one insulated conductor 1706 is shown in FIG. 7a, multiple insulated conductors may be included in the conductor set 1704, if desired.

The insulated conductor of a conductor set that is positioned nearest to a pinched region of the cable is considered to be an end conductor of the conductor set. The conductor set 1704, as shown, has a single insulated conductor 1706 and it is also an end conductor, since it is positioned nearest to the pinched region 1718 of the shielded electrical cable 1702.

First and second shielding films 1708 are disposed on opposite sides of the cable and include cover portions 1707. In transverse cross section, the cover portions 1707 substantially surround conductor set 1704. An optional adhesive layer 1710 is disposed between the pinched portions 1709 of the shielding films 1708 and bonds shielding films 1708 to each other in the pinched regions 1718 of the cable 1702 on both sides of conductor set 1704. The optional adhesive layer 1710 may extend partially or fully across the cover portion 1707 of the shielding films 1708, e.g., from the pinched portion 1709 of the shielding film 1708 on one side of the conductor set 1704 to the pinched portion 1709 of the shielding film 1708 on the other side of the conductor set 1704. Cable 1702 further includes EMI absorbing layers 1750 disposed on conductor set 1704 and shielding films 1708 on both sides of the cable.

Insulated conductor 1706 is effectively arranged as a coaxial cable which may be used in a single ended circuit arrangement. Shielding films 1708 may include a conductive layer 1708a and a non-conductive polymeric layer 1708b. In some embodiments, as illustrated by FIGS. 7a and 7b, the conductive layer 1708a faces the insulated conductors. Alternatively, the orientation of the conductive layers of one or both of shielding films 1708 may be reversed, as discussed elsewhere herein.

Shielding films 1708 include a concentric portion that is substantially concentric with the end conductor 1706 of the conductor set 1704. The shielded electrical cable 1702 includes transition regions 1736. Portions of the shielding film 1708 in the transition region 1736 of the cable 1702 are transition portions 1734 of the shielding films 1708. In some embodiments, shielded electrical cable 1702 includes transition regions 1736 positioned on both sides of the conductor set 1704 and in some embodiments, the transition regions 1736 may be positioned on only one side of conductor set 1704.

Transition regions 1736 are defined by shielding films 1708 and conductor set 1704. The transition portions 1734 of the shielding films 1708 in the transition regions 1736 provide a gradual transition between concentric portions 1711 and pinched portions 1709 of the shielding films 1708. As opposed to a sharp transition, such as, e.g., a right-angle transition or a transition point (as opposed to a transition portion), a gradual or smooth transition, such as, e.g., a substantially sigmoidal transition, provides strain and stress relief for shielding films 1708 in transition regions 1736 and prevents damage to shielding films 1708 when shielded electrical cable 1702 is in use, e.g., when laterally or axially bending shielded electrical cable 1702. This damage may include, e.g., fractures in conductive layer 1708a and/or debonding between conductive layer 1708a and non-conductive polymeric layer 1708b. In addition, a gradual transition prevents damage to shielding films 1708 in manufacturing of shielded electrical cable 1702, which may include, e.g., cracking or shearing of conductive layer 1708a and/or non-conductive polymeric layer 1708b. Use of the disclosed transition regions on one or both sides of one, some or all of the conductor sets in a shielded electrical ribbon cable represents a departure from conventional cable configurations, such as, e.g., a typical coaxial cable, wherein a shield is generally continuously disposed around a single insulated conductor, or a typical conventional twinaxial cable, in which a shield is continuously disposed around a pair of insulated conductors.

According to one aspect of at least some of the disclosed shielded electrical cables, acceptable electrical properties can be achieved by reducing the electrical impact of the transition region, e.g., by reducing the size of the transition region and/or carefully controlling the configuration of the transition region along the length of the shielded electrical cable. Reducing the size of the transition region reduces the capacitance deviation and reduces the required space between multiple conductor sets, thereby reducing the conductor set pitch and/or increasing the electrical isolation between conductor sets. Careful control of the configuration of the transition region along the length of the shielded electrical cable contributes to obtaining predictable electrical behavior and consistency, which provides for high speed transmission lines so that electrical data can be more reliably transmitted. Careful control of the configuration of the transition region along the length of the shielded electrical cable is a factor as the size of the transition portion approaches a lower size limit.

An electrical characteristic that is often considered is the characteristic impedance of the transmission line. Any impedance changes along the length of a transmission line may cause power to be reflected back to the source instead of being transmitted to the target. Ideally, the transmission line will have no impedance variation along its length, but, depending on the intended application, variations up to 5-10% may be acceptable. Another electrical characteristic that is often considered in twinaxial cables (differentially driven) is skew or unequal transmission speeds of two transmission lines of a pair along at least a portion of their length. Skew produces conversion of the differential signal to a common mode signal that can be reflected back to the source, reduces the transmitted signal strength, creates electromagnetic radiation, and can dramatically increase the bit error rate, in particular jitter. Ideally, a pair of transmission lines will have no skew, but, depending on the intended application, a differential S-parameter SCD21 or SCD12 value (representing the differential-to common mode conversion from one end of the transmission line to the other) of less than −25 to −30 dB up to a frequency of interest, such as, e.g., 6 GHz, may be acceptable. Alternatively, skew can be measured in the time domain and compared to a required specification. Shielded electrical cables described herein may achieve skew values of less than about 20 picoseconds/meter (psec/m) or less than about 10 psec/m at data transfer speeds up to about 10 Gbps, for example.

Referring again to FIGS. 7a-7b, in part to help achieve acceptable electrical properties, transition regions 1736 of shielded electrical cable 1702 may each include a cross-sectional transition area 1736a. The transition area 1736a is smaller than a cross-sectional area 1706a of insulated conductor 1706. As best shown in FIG. 7b, cross-sectional transition area 1736a of transition region 1736 is defined by transition points 1734' and 1734".

The transition points 1734' occur where the shielding films deviate from being substantially concentric with the end insulated conductor 1706 of the conductor set 1704. The transition points 1734' are the points of inflection of the shielding films 1708 at which the curvature of the shielding films 1708 changes sign. For example, with reference to FIG. 7b, the curvature of the upper shielding film 1708 transitions from concave downward to concave upward at the inflection point which is the upper transition point 1734'. The curvature of the lower shielding film 1708 transitions from concave upward to concave downward at the lower inflection point which is the transition point 1734'. The other transition points 1734" occur where a separation between the pinched portions 1709 of the shielding films 1708 exceeds the minimum separation, $d_1$, of the pinched portions 1709, by a predetermined factor, e.g., about 1.2 to about 1.5. In addition, each transition area 1736a may include a void area 1736b. Void areas 1736b on either side of the conductor set 1704 may be substantially the same. Further, adhesive layer 1710 may have a thickness $T_{ac}$ at the concentric portion 1711 of the shielding film 1708, and a thickness at the transition portion 1734 of the shielding film 1708 that is greater than thickness $T_{ac}$. Similarly, adhesive layer 1710 may have a thickness $T_{ap}$ between the pinched portions 1709 of the shielding films 1708, and a thickness at the transition portion 1734 of the shielding film 1708 that is greater than thickness $T_{ap}$. Adhesive layer 1710 may represent at least 25% of cross-sectional transition area 1736a. The presence of adhesive layer 1710 in transition area 1736a, in particular at a thickness that is greater than thickness $T_{ac}$ or thickness $T_{ap}$, contributes to the strength of the cable 1702 in the transition region 1736.

Careful control of the manufacturing process and the material characteristics of the various elements of shielded electrical cable 1702 may reduce variations in void area 1736b and the thickness of conformable adhesive layer 1710 in transition region 1736, which may in turn reduce variations in the capacitance of cross-sectional transition area 1736a. Shielded electrical cable 1702 may include transition region 1736 positioned on one or both sides of conductor set 1704 that includes a cross-sectional transition area 1736a that is substantially equal to or smaller than a cross-sectional area 1706a of conductor 1706. Shielded electrical cable 1702 may include a transition region 1736 positioned on one or both sides of conductor set 1704 that includes a cross-sectional transition area 1736a that is substantially the same along the length of conductor 1706. For example, cross-sectional transition area 1736a may vary less than 50% over a length of 1 meter. Shielded electrical cable 1702 may include transition regions 1736 positioned on both sides of conductor set 1704 that each include a cross-sectional transition area, wherein the sum of cross-sectional areas 1734a is substantially the same along the length of conductor 1706. For example, the sum of cross-sectional areas 1734a may vary less than 50% over a length of 1 meter. Shielded electrical cable 1702 may include transition regions 1736 positioned on both sides of conductor set 1704 that each include a cross-sectional transition area 1736a, wherein the cross-sectional transition areas 1736a are substantially the same. Shielded electrical cable 1702 may include transition regions 1736 positioned on both sides of conductor set 1704, wherein the transition regions 1736 are substantially identical. Insulated conductor 1706 has an insulation thickness $T_1$, and transition region 1736 may have a lateral length $L_t$ that is less than insulation thickness $T_1$. The central conductor of insulated conductor 1706 has a diameter $D_c$, and transition region 1736 may have a lateral length $L_t$ that is less than the diameter $D_c$. The various configurations described above may provide a characteristic impedance that remains within a desired range, such as, e.g., within 5-10% of a target impedance value, such as, e.g., 50 Ohms, over a given length, such as, e.g., 1 meter.

Factors that can influence the configuration of transition region 1736 along the length of shielded electrical cable 1702 include the manufacturing process, the thickness of conductive layers 1708a and non-conductive polymeric layers 1708b, adhesive layer 1710, and the bond strength between insulated conductor 1706 and shielding films 1708, to name a few.

In one aspect, conductor set 1704, shielding films 1708, and transition region 1736 are cooperatively configured in an impedance controlling relationship. An impedance controlling relationship means that conductor set 1704, shielding films 1708, and transition region 1736 are cooperatively configured to control the characteristic impedance of the shielded electrical cable.

Figure 8A:
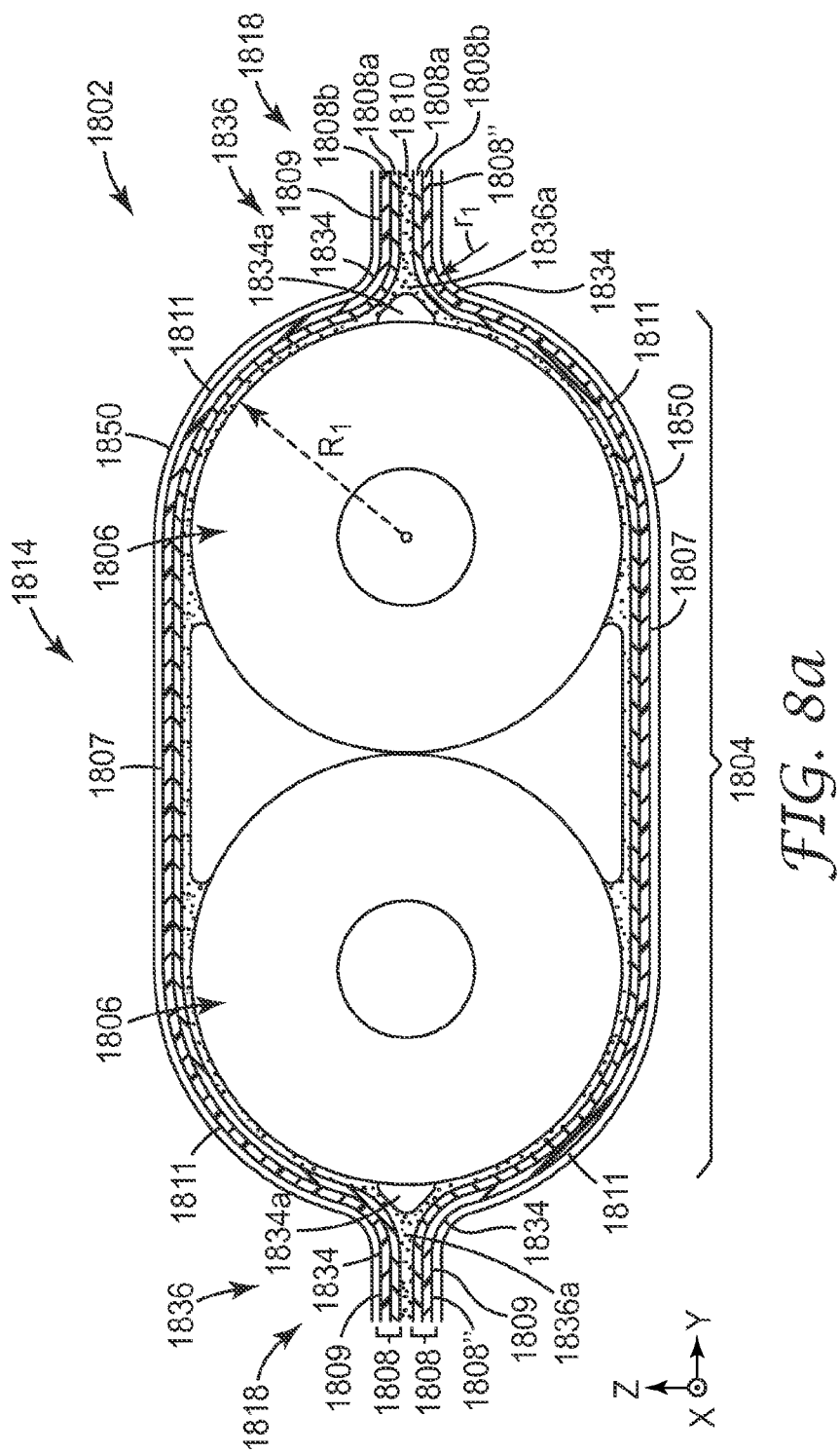

FIGS. 8a-8b illustrate, in transverse cross section, two exemplary embodiments of a shielded electrical cable which has two insulated conductors in a conductor set. Referring to FIG. 8a, shielded electrical cable 1802 generally lies in the xy-plane and includes a single conductor set 1804 including two individually insulated conductors 1806 extending along a length of the cable 1802 along the x-axis. Two shielding films 1808 are disposed on opposite sides of the cable 1802 and in combination substantially surround conductor set 1804. An optional adhesive layer 1810 is disposed between pinched portions 1809 of the shielding films 1808 and bonds shielding films 1808 to each other on both sides of conductor set 1804 in the pinched regions 1818 of the cable 1802. Insulated conductors 1806 can be arranged generally in a single plane, such as the xy-plane, and effectively in a twinaxial cable configuration. The twinaxial cable configuration can be used in a differential pair circuit arrangement or in a single ended circuit arrangement. Shielding films 1808 may include a conductive layer 1808a and a non-conductive polymeric layer 1808b or may include the conductive layer 1808a without the non-conductive polymeric layer 1808b. FIG. 8a shows conductive layer 1808a facing insulated conductors 1806, but in alternative embodiments, one or both of the shielding films may have a reversed orientation. Cable 1802 further includes EMI absorbing layers 1850 that are disposed on conductor set 1804 and shielding films 1808 on both sides of the cable.

The cover portion 1807 of at least one of the shielding films 1808 includes concentric portions 1811 that are substantially concentric with corresponding end conductors 1806 of the conductor set 1804. In the transition region 1836 of the cable 1802, transition portion 1834 of the shielding films 1808 are between the concentric portions 1811 and the pinched portions 1809 of the shielding films 1808. Transition portions 1836 are positioned on both sides of conductor set 1804 and each such portion includes a cross-sectional transition area 1836a. The sum of cross-sectional transition areas 1836a is preferably substantially the same along the length of conductors 1806. For example, the sum of cross-sectional areas 1836a may vary less than 50% over a length of 1 meter.

In addition, the two cross-sectional transition areas 1836a may be substantially the same and/or substantially identical. This configuration of transition regions contributes to a characteristic impedance for each conductor 1806 (single-ended) and a differential impedance that both remain within a desired range, such as, e.g., within 5-10% of a target impedance value over a given length, such as, e.g., 1 meter. In addition, this configuration of transition region 1836 may minimize skew of the two conductors 1806 along at least a portion of their length.

When the cable is in an unfolded, planar configuration, each of the shielding films may be characterizable in transverse cross section by a radius of curvature that changes across a width of the cable 1802. The maximum radius of curvature of the shielding film 1808 may occur, for example, at the pinched portion 1809 of the cable 1802 or near the center point of the cover portion 1807 of the multi-conductor cable set 1804 illustrated in FIG. 8a. At these positions, the film may be substantially flat and the radius of curvature may be substantially infinite. The minimum radius of curvature of the shielding film 1808 may occur, for example, at the transition portion 1834 of the shielding film 1808. In some embodiments, the radius of curvature of the shielding film across the width of the cable is at least about 50 micrometers, i.e., the radius of curvature does not have a magnitude smaller than 50 micrometers at any point along the width of the cable, between the edges of the cable. In some embodiments, for shielding films that include a transition portion, the radius of curvature of the transition portion of the shielding film is similarly at least about 50 micrometers.

In an unfolded, planar configuration, shielding films 1808 that include a concentric portion and a transition portion are characterizable by a radius of curvature of the concentric portion, $R_1$, and/or a radius of curvature of the transition portion $r_1$, which are illustrated in FIG. 8a. In some embodiments, $R_1/r_1$ is in a range of 2 to 15.

Referring to FIG. 8b, shielded electrical cable 1902 is similar in some aspects to shielded electrical cable 1802. Whereas shielded electrical cable 1802 has individually insulated conductors 1806, shielded electrical cable 1902 has jointly insulated conductors 1906. Nonetheless, transition regions 1936 are substantially similar to transition regions 1836 and provide the same benefits to shielded electrical cable 1902.

Figure 9A:
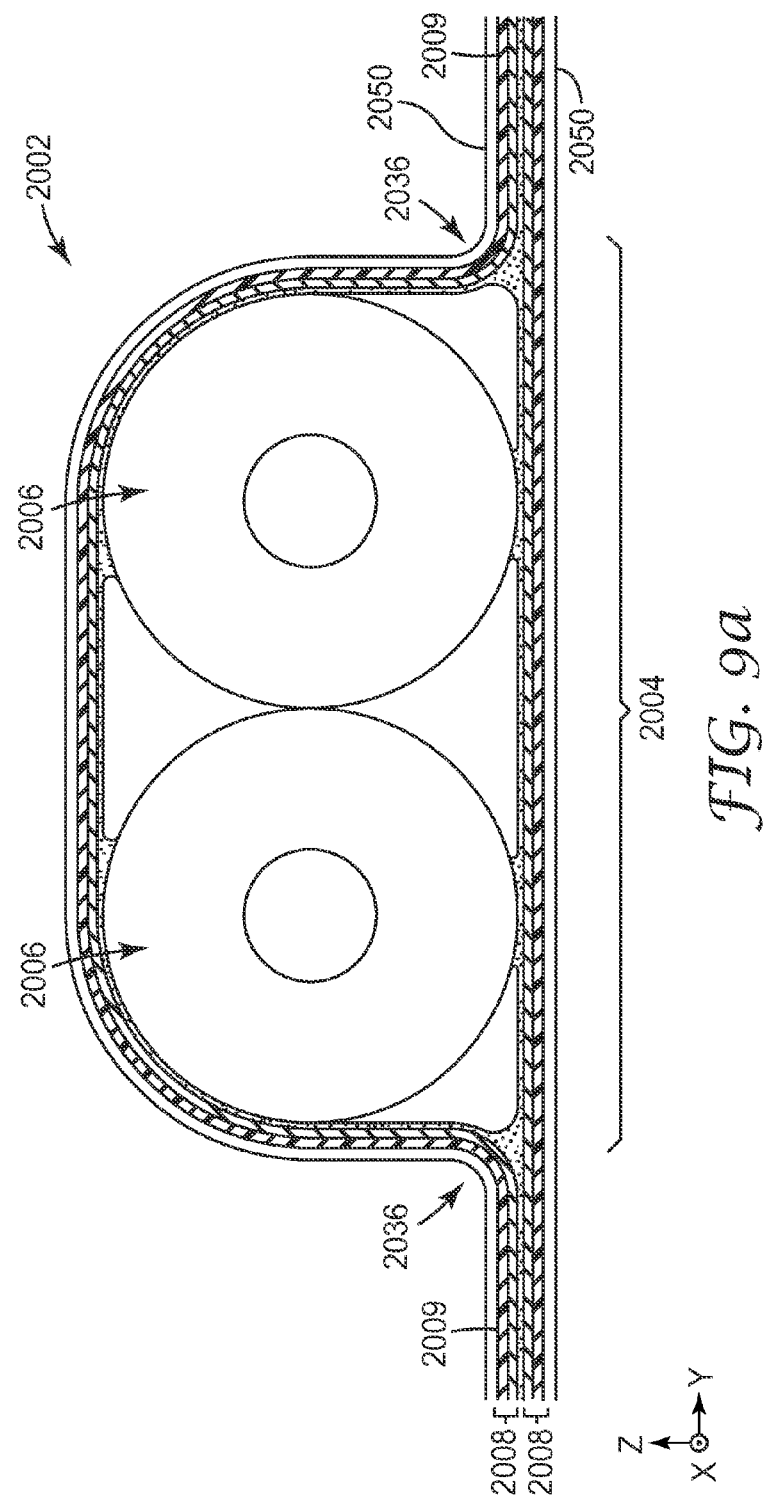
FIGS. 9a-9b are front cross-sectional views of two other exemplary embodiments of a shielded electrical cable.
Figure 9B:
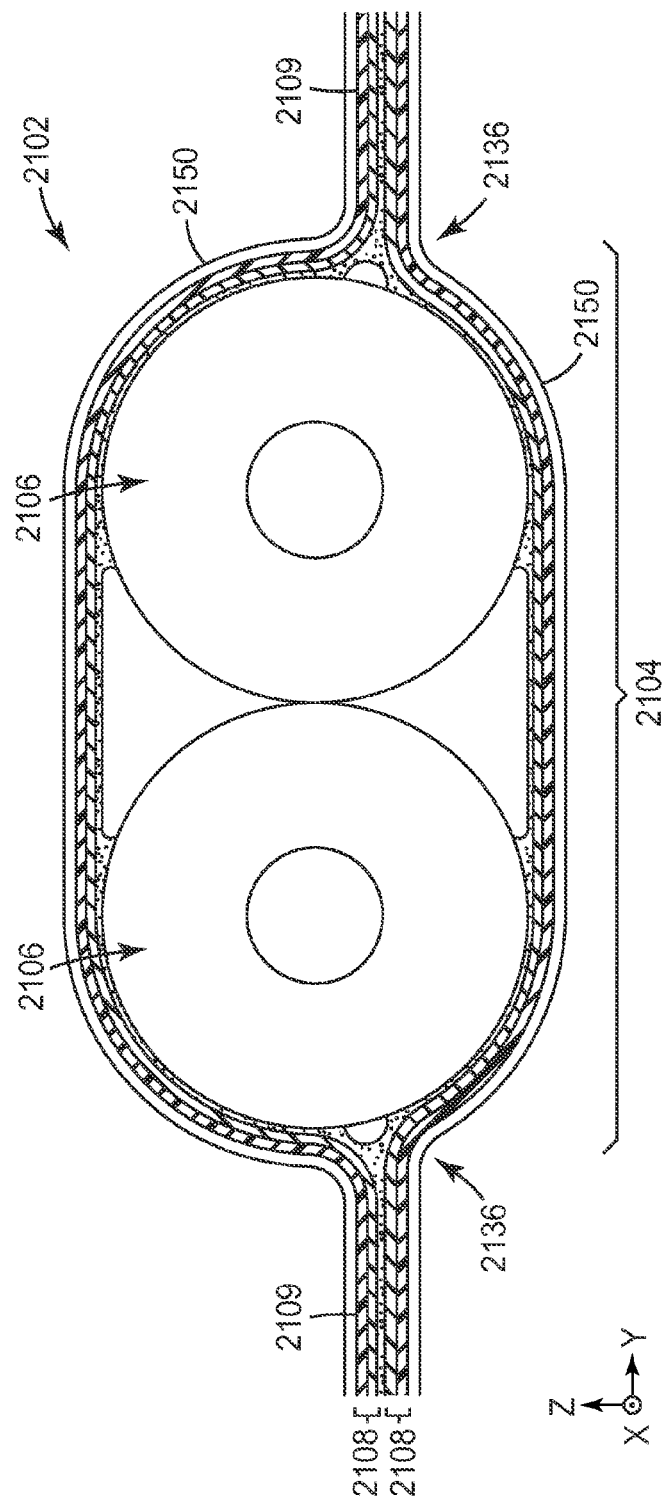

FIGS. 9a-9b illustrate variations in position and configuration of the transition portions. In these exemplary embodiments, the shielding films 2008, 2108 have an asymmetric configuration which changes the position of the transition portions relative to more symmetric embodiment such that of FIG. 8a. Shielded electrical cables 2002 (FIG. 9a) and 2102 (FIG. 9b) have pinched portions 2009 of shielding films 2008, 2108 that lie in a plane that is offset from the plane of symmetry of the insulated conductors 2006, 2106. As a result, the transition regions 2036, 2136 have a somewhat offset position and configuration relative to other depicted embodiments. However, by ensuring that the transition regions 2036, 2136 are positioned substantially symmetrically with respect to corresponding insulated conductors 2006, 2106 (e.g., with respect to a vertical plane between the conductors 2006, 2106), and that the configuration of transition regions 2036, 2136 is carefully controlled along the length of shielded electrical cables 2002, 2102, shielded electrical cables 2002, 2102 can be configured to still provide acceptable electrical properties. Cable 2002 further includes EMI absorbing layers 2050 that are disposed on conductor set 2004 and shielding films 2008 on both sides of the cable. Cable 2102 further includes EMI absorbing layers 2150 that are disposed on conductor set 2104 and shielding films 2108 on both sides of the cable.

FIGS. 10a-10c, 13 and 14 illustrate additional exemplary embodiments of shielded electrical cables. FIGS. 11a-11g, 12a-12b and 15a-15f illustrate several exemplary embodiments of a pinched portion of a shielded electrical cable. FIGS. 10a-15f illustrate examples of a pinched portion that is configured to electrically isolate a conductor set of the shielded electrical cable. The conductor set may be electrically isolated from an adjacent conductor set (e.g., to minimize crosstalk between adjacent conductor sets, FIGS. 10a-10c and 11a-11g) or from the external environment of the shielded electrical cable (e.g., to minimize electromagnetic radiation escape from the shielded electrical cable and minimize electromagnetic interference from external sources, FIGS. 14 and 15a-15f). In both cases, the pinched portion may include various mechanical structures to change the electrical isolation. Examples include close proximity of the shielding films, high dielectric constant material between the shielding films, ground conductors that make direct or indirect electrical contact with at least one of the shielding films, extended distance between adjacent conductor sets, physical breaks between adjacent conductor sets, intermittent contact of the shielding films to each other directly either longitudinally, reduction of spacing between the EMI absorbing layers, transversely, or both, and conductive adhesive, to name a few. In one aspect, a pinched portion of the shielding films is defined as a portion of the shielding films that is not covering a conductor set.

Figure 10A:
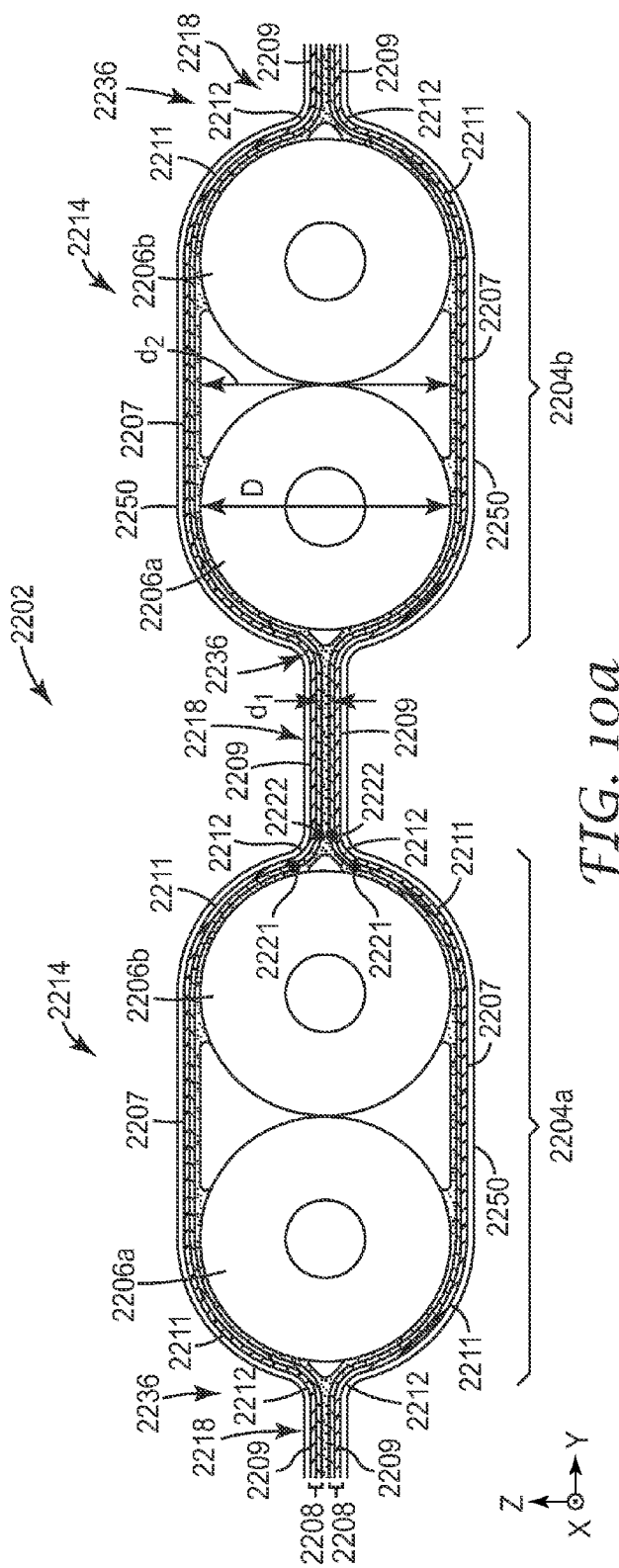

FIG. 10a shows, in cross section, a shielded electrical cable 2202 that includes two conductor sets 2204a, 2204b spaced apart across a width of the cable 2202 along the y-axis and extending longitudinally along a length of the cable 2202 along the x-axis. Each conductor set 2204a, 2204b includes two insulated conductors 2206a, 2206b. Two shielding films 2208 are disposed on opposite sides of the cable 2202. Furthermore, two EMI absorbing layers 2250 are disposed on the shielding films on the opposite sides of cable 2202. In transverse cross section, cover portions 2207 of the shielding films 2208 substantially surround conductor sets 2204a, 2204b in cover regions 2214 of the cable 2202. For example, the cover portions 2207 of the shielding films 2208 in combination substantially surround each conductor set 2204a, 2204b by encompassing at least 70% of a periphery of each conductor set 2204a, 2204b. In pinched regions 2218 of the cable 2202, on both sides of the conductor sets 2204a, 2204b, the shielding films 2208 include pinched portions 2209. In shielded electrical cable 2202, the pinched portions 2209 of shielding films 2208 and insulated conductors 2206 are arranged generally in a single plane when the cable 2202 is in a planar and/or unfolded arrangement. Pinched portions 2209 positioned in between conductor sets 2204a, 2204b are configured to electrically isolate conductor sets 2204a, 2204b from each other.

When arranged in a generally planar, unfolded arrangement, as illustrated in FIG. 10a, the high frequency electrical isolation of the first insulated conductor 2206a in the conductor set 2204 relative to the second insulated conductor 2206b in the conductor set 2204 is substantially less than the high frequency electrical isolation of the first conductor set 2204a relative to the second conductor set 2204b. For example, the high frequency isolation of the first insulated conductor relative to the second conductor is a first far end crosstalk C1 at a specified frequency of 3-15 GHz and a length of 1 meter, and the high frequency isolation of the first conductor set relative to the adjacent conductor set is a second far end crosstalk C2 at the specified frequency, and wherein C2 is at least 10 dB lower than C1.

As illustrated in the cross section of FIG. 10a, the cable 2202 can be characterized by a maximum separation, D, between the cover portions 2207 of the shielding films 2208, a minimum separation, $d_2$, between the cover portions 2207 of the shielding films 2208, and a minimum separation, $d_1$, between the pinched portions 2209 of the shielding films 2208. In some embodiments, $d_1/D$ is less than 0.25 or less than 0.1. In some embodiments, $d_2/D$ is greater than 0.33.

An optional adhesive layer 2210 may be included, as shown, between the pinched portions 2209 of the shielding films 2208. Adhesive layer 2210 may be continuous or discontinuous. In some embodiments, the adhesive layer extends fully or partially in the cover region 2214 of the cable 2202, e.g., between the cover portion 2207 of the shielding films 2208 and the insulated conductors 2206a, 2206b. The adhesive layer 2210 may be disposed on the cover portion 2207 of the shielding film 2208 and may extend fully or partially from the pinched portion 2209 of the shielding film 2208 on one side of a conductor set 2204a, 2204b to the pinched portion 2209 of the shielding film 2208 on the other side of the conductor set 2204a, 2204b.

The shielding films 2208 can be characterized by a radius of curvature, R, across a width of the cable 2202 and/or by a radius of curvature, $r_1$, of the transition portion 2212 of the shielding film and/or by a radius of curvature, $r_2$, of the concentric portion 2211 of the shielding film.

In the transition region 2236, the transition portion 2212 of the shielding film 2208 can be arranged to provide a gradual transition between the concentric portion 2211 of the shielding film 2208 and the pinched portion 2209 of the shielding film 2208. The transition portion 2212 of the shielding film 2208 extends from a first transition point 2221, which is the inflection point of the shielding film 2208 and marks the end of the concentric portion 2211, to a second transition point 2222 where the separation between the shielding films exceeds the minimum separation, $d_1$, of the pinched portions 2209 by a predetermined factor.

In some embodiments, the cable 2202 includes at least one shielding film that has a radius of curvature, R, across the width of the cable that is at least about 50 micrometers and/or the minimum radius of curvature, $r_1$, of the transition portion 2212 of the shielding film 2202 is at least about 50 micrometers. In some embodiments, the ratio of the minimum radius of curvature of the concentric portion to the minimum radius of curvature of the transition portion, $r_2/r_1$ is in a range of 2 to 15.

Figure 10B:
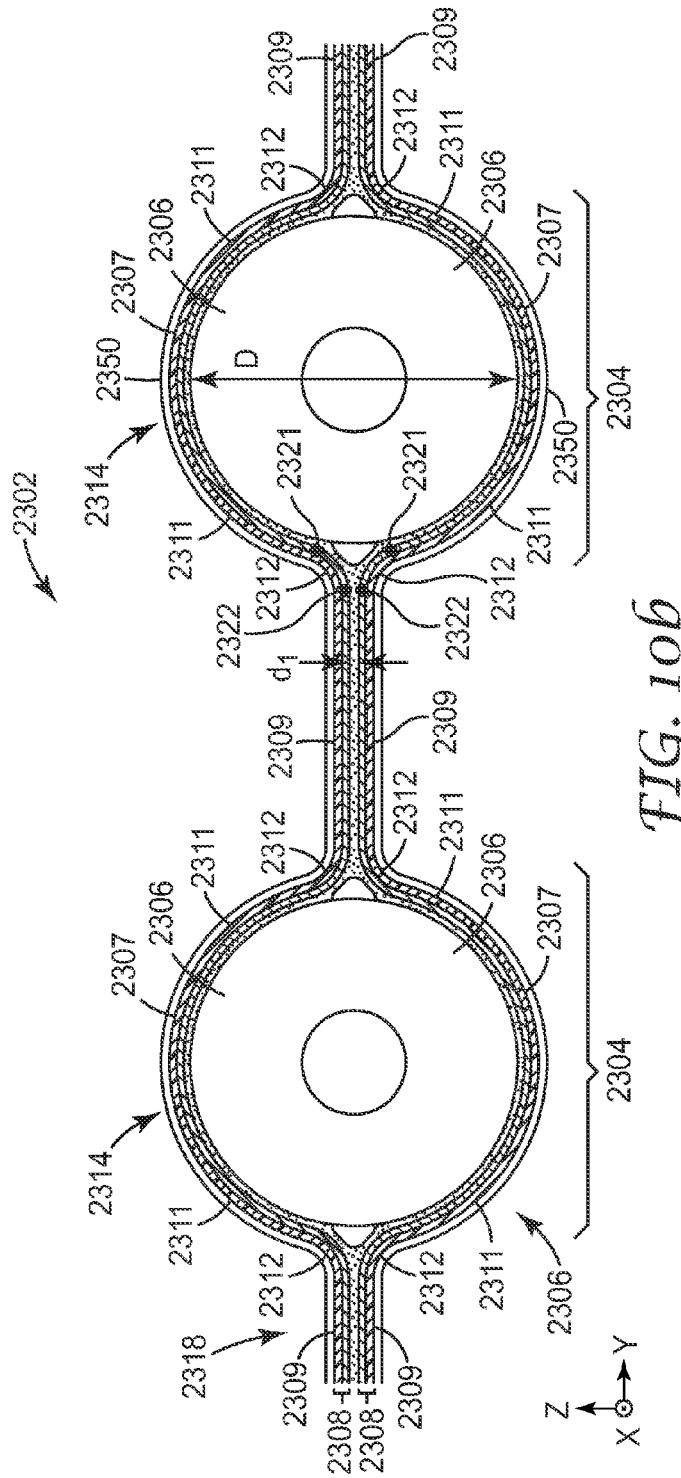

FIG. 10b is a cross sectional view of a shielded electrical cable 2302 that includes two conductor sets 2304 spaced apart from each other across a width of the cable 2302 along the y-axis and extending longitudinally along a length of the cable 2302 along the x-axis. Each conductor set 2304 includes one insulated conductor 2306, two shielding films 2308, and two EMI absorbing layers 2350 disposed on opposite sides of the cable 2302. In transverse cross section, the cover portions 2307 of the shielding films 2308 in combination substantially surround the insulated conductor 2306 of conductor sets 2304 in a cover region 2314 of the cable 2302. In pinched regions 2318 of the cable 2302, on both sides of the conductor sets 2304, the shielding films 2308 include pinched portions 2309. In shielded electrical cable 2302, pinched portions 2309 of shielding films 2308 and insulated conductors 2306 can be arranged generally in a single plane when the cable 2302 is in a planar and/or unfolded arrangement. The cover portions 2307 of the shielding films 2308 and/or the pinched portions 2309 of the cable 2302 are configured to electrically isolate the conductor sets 2304 from each other.

As illustrated in the cross section of FIG. 10b, the cable 2302 can be characterized by a maximum separation, D, between the cover portions 2307 of the shielding films 2308 and a minimum separation, $d_1$, between the pinched portions 2309 of the shielding films 2308. In some embodiments, $d_1/D$ is less than 0.25, or less than 0.1.

An optional adhesive layer 2310 may be included between the pinched portions 2309 of the shielding films 2308. Adhesive layer 2310 may be continuous or discontinuous. In some embodiments, the adhesive layer 2310 extends fully or partially in the cover region 2314 of the cable, e.g., between the cover portion 2307 of the shielding films 2308 and the insulated conductors 2306. The adhesive layer 2310 may be disposed on the cover portions 2307 of the shielding films 2308 and may extend fully or partially from the pinched portions 2309 of the shielding films 2308 on one side of a conductor set 2304 to the pinched portions 2309 of the shielding films 2308 on the other side of the conductor set 2304.

The shielding films 2308 can be characterized by a radius of curvature, R, across a width of the cable 2302 and/or by a minimum radius of curvature, $r_1$, in the transition portion 2312 of the shielding film 2308 and/or by a minimum radius of curvature, $r_2$, of the concentric portion 2311 of the shielding film 2308. In the transition regions 2236 of the cable 2302, transition portions 2312 of the shielding films 2302 can be configured to provide a gradual transition between the concentric portions 2311 of the shielding films 2308 and the pinched portions 2309 of the shielding films 2308. The transition portion 2312 of the shielding film 2308 extends from a first transition point 2321, which is the inflection point of the shielding film 2308 and marks the end of the concentric portion 2311, to a second transition point 2322 where the separation between the shielding films equals the minimum separation, $d_1$, of the pinched portions 2309 or exceeds $d_1$ by a predetermined factor.

In some embodiments, the radius of curvature, R, of the shielding film across the width of the cable is at least about 50 micrometers and/or the minimum radius of curvature in the transition portion of the shielding film is at least 50 micrometers.

FIG. 10c shows, in cross section, a shielded electrical cable 2402 that includes two conductor sets 2404a, 2404b spaced apart from each other across a width of the cable 2402 along the y-axis and extending longitudinally along a length of the cable 2402 along the x-axis. Each conductor set 2404a, 2404b includes two insulated conductors 2206a, 2206b. Two shielding films 2408a, 2408b and two EMI absorbing layers 2450a, 2450b are disposed on opposite sides of the cable 2402. In transverse cross section, cover portions 2407 of the shielding films 2408a, 2408b, in combination, substantially surround conductor sets 2404a, 2404b in a cover region 2414 of the cable 2402. In pinched regions 2418 of the cable 2402 on both sides of the conductor sets 2404a, 2404b, the upper and lower shielding films 2408a, 2408b include pinched portions 2409.

In shielded electrical cable 2402, pinched portions 2409 of shielding films 2408 and insulated conductors 2406a, 2406b are arranged generally in different planes when the cable 2402 is in a planar and/or unfolded arrangement. One of the shielding films 2408b is substantially flat. The portion of the substantially flat shielding film 2408b in the pinched region 2418 of the cable 2402 is referred to herein as a pinched portion 2409, even though there is little or no out of plane deviation of the shielding film 2408b in the pinched region 2418. When the cable 2402 is in a planar or unfolded configuration, the concentric 2411, transition 2412, and pinched 2407 portions of shielding film 2408b are substantially coplanar.

The cover portions 2407 and/or the pinched portions 2409 of the cable 2402 between conductor sets 2404a, 2404b are configured to electrically isolate the conductor sets 2404a, 2404b from each other. When arranged in a generally planar, unfolded arrangement, as illustrated in FIG. 10c, the high frequency electrical isolation of the first insulated conductor 2406a in the first conductor set 2404a relative to the second insulated conductor 2406b in the first conductor set 2404a is substantially less than the high frequency electrical isolation of either conductor 2406a, 2406b of the first conductor set 2404a relative to either conductor 2406a, 2406b of the second conductor set 2404b, as previously discussed.

As illustrated in the cross section of FIG. 10c, the cable 2402 can be characterized by a maximum separation, D, between the cover portions 2407 of the shielding films 2408a, 2408b, a minimum separation, $d_2$, between the cover portions 2407 of the shielding films 2408a, 2408b, and a minimum separation, $d_1$, between the pinched portions 2409 of the shielding films 2408a, 2408b. In some embodiments, $d_1/D$ is less than 0.25, or less than 0.1. In some embodiments, $d_2/D$ is greater than 0.33.

An optional adhesive layer 2410 may be disposed between the pinched portions 2409 of the shielding films 2408a, 2408b. Adhesive layer 2410 may be continuous or discontinuous. In some embodiments, the adhesive layer 2410 extends fully or partially in the cover region 2414 of the cable 2402, e.g., between the cover portions 2407 of one or more of the shielding films 2408a, 2408b and the insulated conductors 2406a, 2406b. The adhesive layer 2410 may be disposed on the cover portion 2407 of one or more shielding films 2408a, 2408b and may extend fully or partially from the pinched portion 2409 of the shielding films 2408a, 2408b on one side of a conductor set 2404a, 2404b to the pinched portions 2409 of the shielding films 2408a, 2408b on the other side of the conductor set 2404a, 2404b.

The transition portions 2412 of the curved shielding film 2408a provide a gradual transition between the concentric portions 2411 of the shielding film 2408a and the pinched portions 2409 of the shielding film 2408a. The transition portions 2412 of the shielding film 2408a extends from a first transition point 2421a, which is the inflection point of the shielding film 2408a to a second transition point 2422a where the separation between the shielding films is equal to the minimum separation, $d_1$, of the pinched portions 2409, or exceeds $d_1$ by a predetermined factor. The transition portion of the substantially flat shielding film 2808b extends from a first transition point 2421b to a second transition point 2422b where the separation between the shielding films is equal to the minimum separation, $d_1$, of the pinched portions 2409, or exceeds $d_1$ by a predetermined factor. The first transition point 2421b is defined by a line perpendicular to the substantially flat shielding film 2408b which intersects the first transition point 2421a of the shielding film 2408a.

Curved shielding film 2408a can be characterized by a radius of curvature, R, across a width of the cable 2402 and/or by a minimum radius of curvature, $r_1$, of the transition portions 2412 of the shielding film 2408a and/or by a minimum radius of curvature, $r_2$, of the concentric portions 2411 of the shielding film. In some embodiments, the cable 2402 includes at least one shielding film 2408 that has a radius of curvature across the width of the cable that is at least about 50 micrometers and/or a minimum radius of curvature, $r_1$, of the transition portion of the shielding film that is at least about 50 micrometers. In some embodiments, the ratio $r_2/r_1$ of the minimum radius of curvature, $r_2$, of the concentric portion of the shielding film to the minimum radius of curvature, $r_1$, of the transition portion of the shielding film is in a range of 2 to 15.

In FIG. 11a, shielded electrical cable 2502 includes a pinched region 2518 wherein shielding films 2508 are spaced apart by a distance. Spacing apart shielding films 2508, i.e., not having shielding films 2508 make direct electrical contact continuously along their seam, increases the strength of pinched region 2518. Shielded electrical cables having relatively thin and fragile shielding films may fracture or crack during manufacturing if forced to make direct electrical contact continuously along their seam. Spacing apart shielding films 2508 may permit crosstalk between adjacent conductor sets if effective means are not used to reduce the crosstalk potential. Reducing crosstalk involves containing the electrical and magnetic fields of one conductor set so that they to not impinge on an adjacent conductor set. In the embodiment illustrated in FIG. 11a, an effective shield against crosstalk is achieved by providing a low DC resistance between shielding films 2508. A low DC resistance can be achieved by orienting the shielding films 2508 in close proximity. For example, pinched portions 2509 of shielding films 2508 may be spaced apart by less than about 0.13 mm in at least one location of pinched region 2518. The resulting DC resistance between shielding films 2508 may be less than about 15 ohms, and the resulting crosstalk between adjacent conductor sets may be less than about −25 dB. In some cases, the pinched region 2518 of the cable 2502 has a minimum thickness of less than about 0.13 mm.

The shielding films 2508 can be spaced apart by a separation medium. The separation medium may include conformable adhesive layer 2510. For example, the separation medium may have a dielectric constant of at least 1.5. A high dielectric constant decreases the impedance between shielding films 2508, thereby increasing the electrical isolation and decreasing the crosstalk between adjacent conductor sets. Shielding films 2508 may make direct electrical contact with each other in at least one location of pinched region 2518'. Shielding films 2508 may be forced together in selected locations so that the thickness of conformable adhesive layer 2510 is reduced in the selected locations. Forcing the shielding film together in selected locations may be accomplished, for example, with a patterned tool making intermittent pinch contact between shielding films 2508 in these locations. These locations may be patterned longitudinally or transversely. In some cases, the separation medium may be electrically conductive to enable direct electrical contact between shielding films 2508. The cross-talk between adjacent conductor sets may be further reduced by including EMI absorbing layers 2550 disposed on shielding films 2508 on both sides of cable 2502.

In FIG. 11b, shielded electrical cable 2602 includes a pinched region 2618 including a ground conductor 2612 disposed between shielding films 2608 and extending along a length of the cable 2602 along the x-axis. The ground conductor 2612 may make indirect electrical contact with both shielding films 2608, e.g., a low but non-zero DC resistance between the shielding films 2608. In some cases, the ground conductor 2612 may make direct or indirect electrical contact with at least one of the shielding films 2608 in at least one location of pinched region 2618. The shielded electrical cable 2602 may include a conformable adhesive layer 2610 disposed between shielding films 2608 and configured to provide controlled separation of at least one of shielding films 2608 and ground conductor 2612. The conformable adhesive layer 2610 may have a non-uniform thickness that allows ground conductor 2612 to make direct or indirect electrical contact with at least one of shielding films 2608 in selective locations. In some cases, the ground conductor 2612 may include surface asperities or a deformable wire, such as, e.g., a stranded wire, to provide the controlled electrical contact between ground conductor 2612 and at least one of shielding films 2608. The cross-talk between adjacent conductor sets may be further reduced by including EMI absorbing layers 2650 disposed on shielding films 2608 on both sides of cable 2602.

In FIG. 11c, shielded electrical cable 2702 includes a pinched region 2718. A ground conductor 2712 disposed between shielding films 2708 and makes direct electrical contact with both shielding films 2708.

Figure 11D:
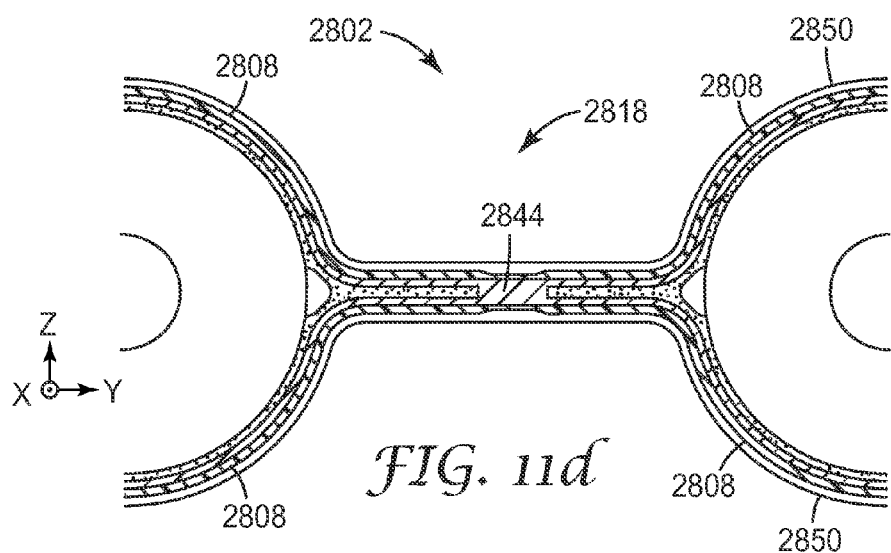

In FIG. 11d, shielded electrical cable 2802 includes a pinched region 2818 wherein shielding films 2808 make direct electrical contact with each other by any suitable means, such as, e.g., conductive element 2844. Conductive element 2844 may include a conductive plated via or channel, a conductive filled via or channel, or a conductive adhesive, to name a few. The cross-talk between adjacent conductor sets may be further reduced by including EMI absorbing layers 2850 disposed on shielding films 2808 on both sides of cable 2802.

Figure 11E:
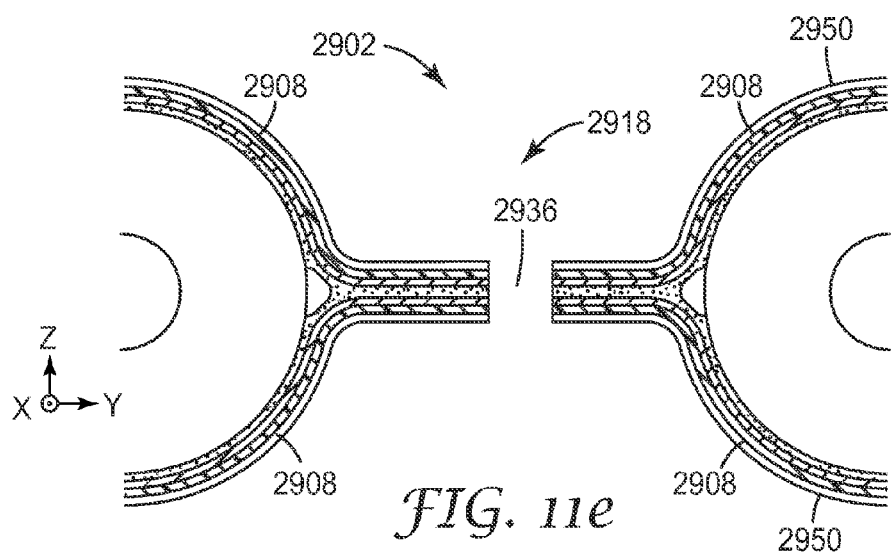

In FIG. 11e, shielded electrical cable 2902 includes a pinched region 2918 that has an opening 2936 in at least one location of the pinched region 2918 where opening 2936 includes openings in shielding films 2908 and EMI absorbing layers 2950. In other words, pinched region 2918 is discontinuous. Opening 2936 may include a hole, a perforation, a slit, and any other suitable element. Opening 2936 provides at least some level of physical separation, which contributes to the electrical isolation performance of pinched region 2918 and increases at least the lateral flexibility of shielded electrical cable 2902. This separation may be discontinuous along the length of pinched region 2918, and may be discontinuous across the width of pinched region 2918.

Figure 11F:
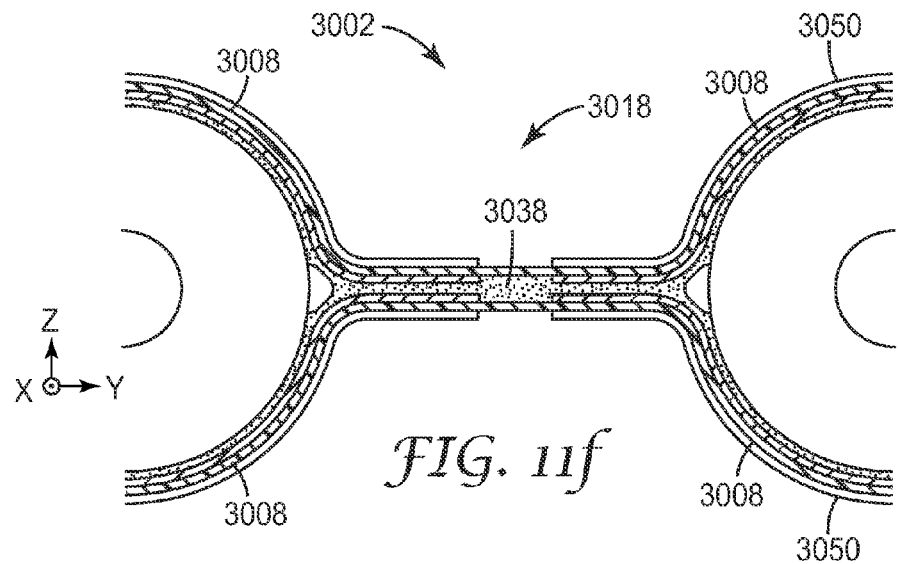

In FIG. 11f, shielded electrical cable 3002 includes a pinched region 3018 where at least one of shielding films 3008 includes a break 3038 in at least one location of pinched region 3018. In other words, at least one of shielding films 3008 is discontinuous. In some cases, break 3038 also includes a discontinuity in at least one of the two EMI absorbing layers 3050. Break 3038 may include a hole, a perforation, a slit, and any other suitable element. Break 3038 provides at least some level of physical separation, which contributes to the electrical isolation performance of pinched region 3018 and increases at least the lateral flexibility of shielded electrical cable 3002. This separation may be discontinuous or continuous along the length of pinched region, and may be discontinuous across the width of the pinched portion 3018.

Figure 11G:
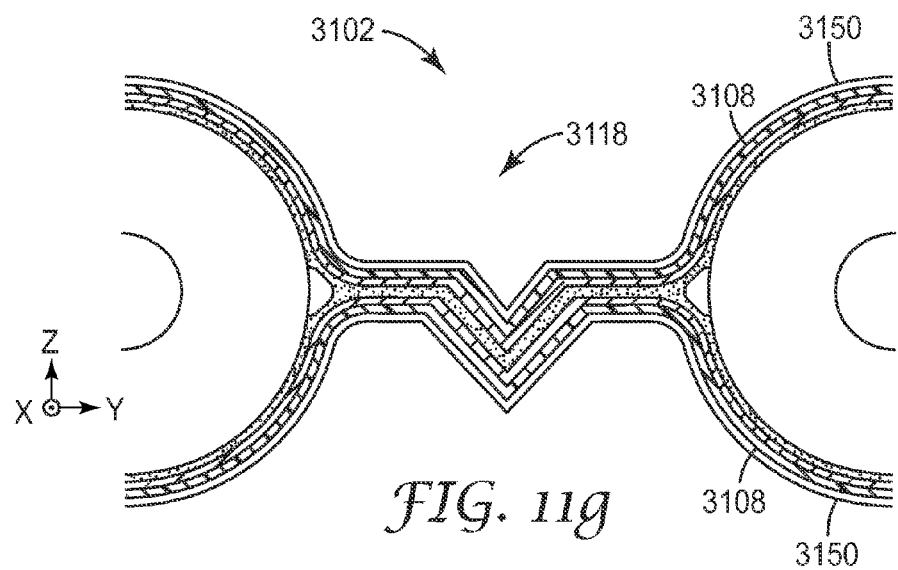

In FIG. 11g, shielded electrical cable 3102 includes a pinched region 3118 that is piecewise planar in a folded configuration. All other things being equal, a piecewise planar pinched region has a greater actual surface area than a planar pinched region having the same projected width. If the surface area of a pinched region is much greater than the spacing between the shielding films 3108, the DC resistance is decreased which improves the electrical isolation performance of the pinched region 3118. In one embodiment, a DC resistance of less than 5 to 10 Ohms results in good electrical isolation. In one embodiment, pinched portion 3118 of shielded electrical cable 3102 has an actual width to minimum spacing ratio of at least 5. In one embodiment, pinched region 3118 is pre-bent and thereby increases at least the lateral flexibility of shielded electrical cable 3102. Pinched region 3118 may be piecewise planar in any other suitable configuration. In some cases, EMI absorbing layers 3150 are also piecewise planar in pinched region 3118.

Figure 12A:
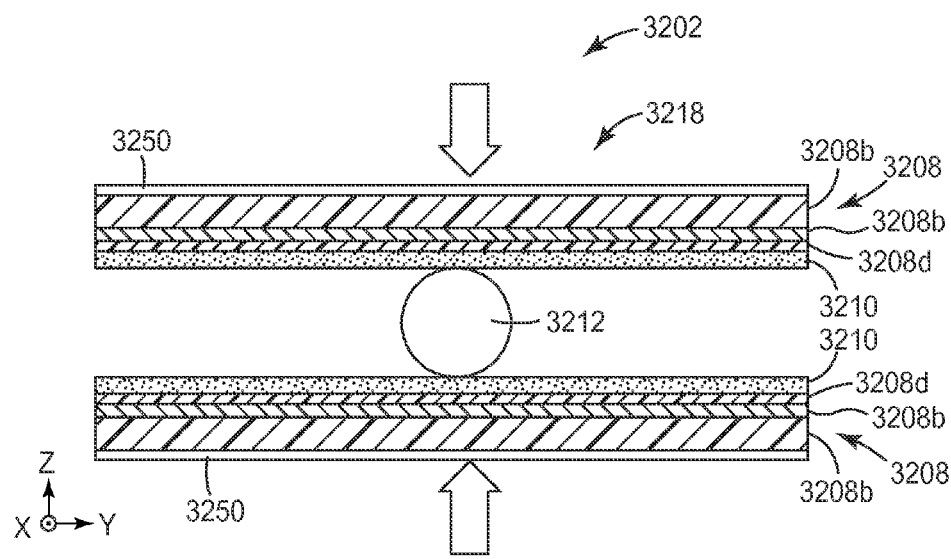
FIGS. 12a-12b are front cross-sectional detail views of another exemplary embodiment of a parallel portion of a shielded electrical cable.
Figure 12B:
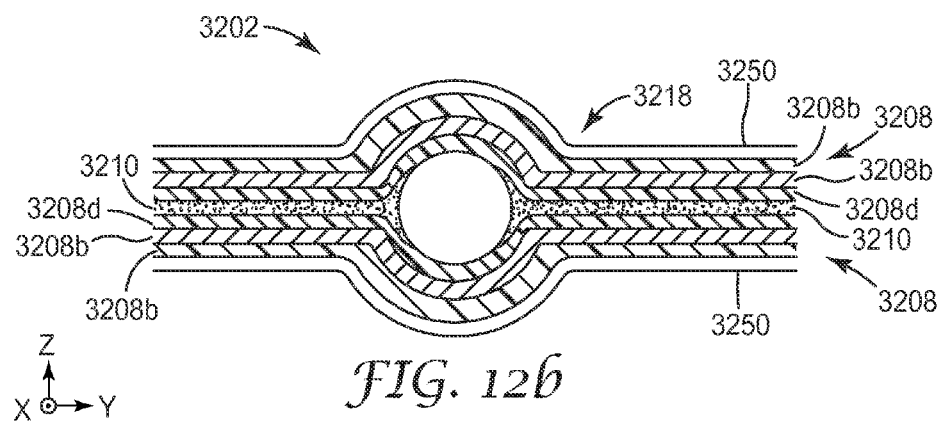

FIGS. 12a-12b, illustrate details pertaining to a pinched region during the manufacture of an exemplary shielded electrical cable. Shielded electrical cable 3202 includes two shielding films 3208 and two EMI absorbing layers 3250 and includes a pinched region 3218 where shielding films 3208 may be substantially parallel. Shielding films 3208 include a non-conductive polymeric layer 3208b, a conductive layer 3208a disposed on non-conductive polymeric layer 3208b, and a stop layer 3208d disposed on the conductive layer 3208a. A conformable adhesive layer 3210 is disposed on stop layer 3208d. Pinched region 3218 includes a longitudinal ground conductor 3212 disposed between shielding films 3208.

After the shielding films are forced together around the ground conductor, the ground conductor 3212 makes indirect electrical contact with conductive layers 3208a of the shielding films 3208. This indirect electrical contact is enabled by a controlled separation of conductive layer 3208a and ground conductor 3212 provided by stop layer 3208d. In some cases, the stop layer 3208d may be or include a non-conductive polymeric layer. As shown in the figures, an external pressure (see FIG. 12a) is used to press conductive layers 3208a together and force conformable adhesive layers 3210 to conform around the ground conductor (FIG. 12b). Because stop layer 3208d does not conform at least under the same processing conditions, it prevents direct electrical contact between the ground conductor 3212 and conductive layer 3208a of shielding films 3208, but achieves indirect electrical contact. The thickness and dielectric properties of stop layer 3208d may be selected to achieve a low target DC resistance, i.e., electrical contact of an indirect type. In some embodiments, the characteristic DC resistance between the ground conductor and the shielding film may be less than 10 ohms, or less than 5 ohms, for example, but greater than 0 ohms, to achieve the desired indirect electrical contact. In some cases, it is desirable to make direct electrical contact between a given ground conductor and one or two shielding films, whereupon the DC resistance between such ground conductor and such shielding film(s) may be substantially 0 ohms.

Figure 13:
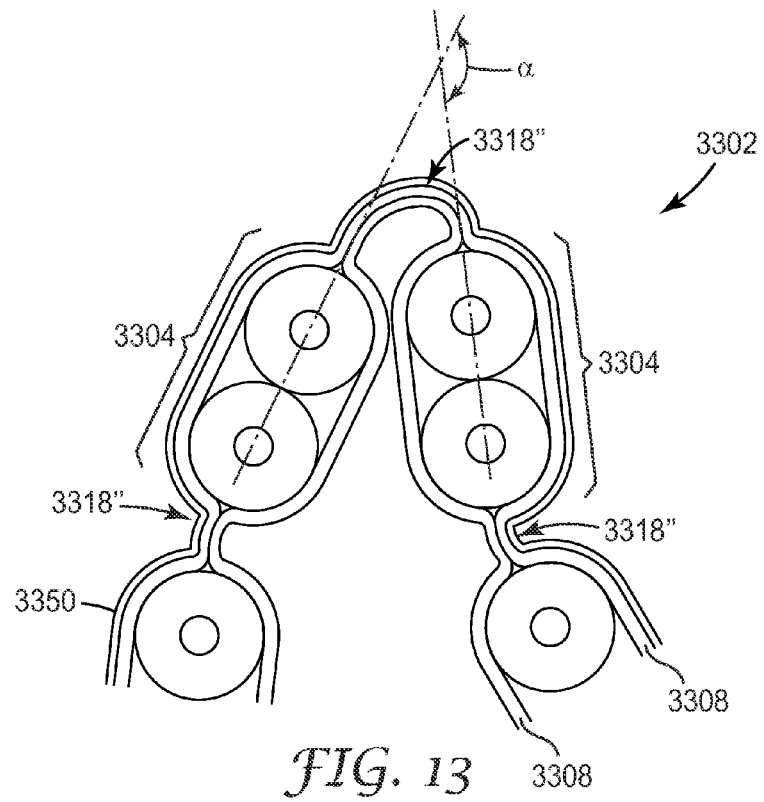
FIG. 13 is a front cross-sectional detail view of another exemplary embodiment of a shielded electrical cable in a bent configuration.

FIG. 13 shows a folded shielded cable 3302. Shielded cable 3302 includes two shielding films 3308 disposed around spaced apart conductor sets 3304. Shielded cable 3302 also includes an EMI absorbing layer 3350 disposed on conductor sets 3304 and shielding film 3308 on one side of the cable. Shielding films 3308 are disposed on opposite sides of the cable 3302 and include pinched regions 3318 on each side of the conductor sets 3304. The pinched regions 3318 are configured to be laterally bent at an angle α of at least 30°. This lateral flexibility of pinched regions 3318 enables shielded electrical cable 3302 to be folded in any suitable configuration, such as, e.g., a configuration that can be used in a round cable (see, e.g., FIG. 5g). In one embodiment, the shielding films 3308 having relatively thin individual layers increases the lateral flexibility of pinched regions 3318. To maintain the integrity of these individual layers in particular under bending conditions, it is preferred that the bonds between them remain intact. For example, pinched regions 3318 may have a minimum thickness of less than about 0.13 mm, and a bond strength between individual layers of at least 17.86 g/mm (1 lbs/inch) after thermal exposures during processing or use.

In one aspect, it is beneficial to the electrical performance of a shielded electrical cable for the pinched regions to have approximately the same size and shape on both sides of a conductor set. Any dimensional changes or imbalances may produce imbalances in capacitance and inductance along the length of the parallel portion. This in turn may cause impedance differences along the length of the pinched region and impedance imbalances between adjacent conductor sets. At least for these reasons, control of the spacing between the shielding films may be desired. In some cases, the pinched portions of the shielding films in the pinched regions of the cable on both sides of a conductor set are spaced apart within about 0.05 mm of each other.

Figure 14:
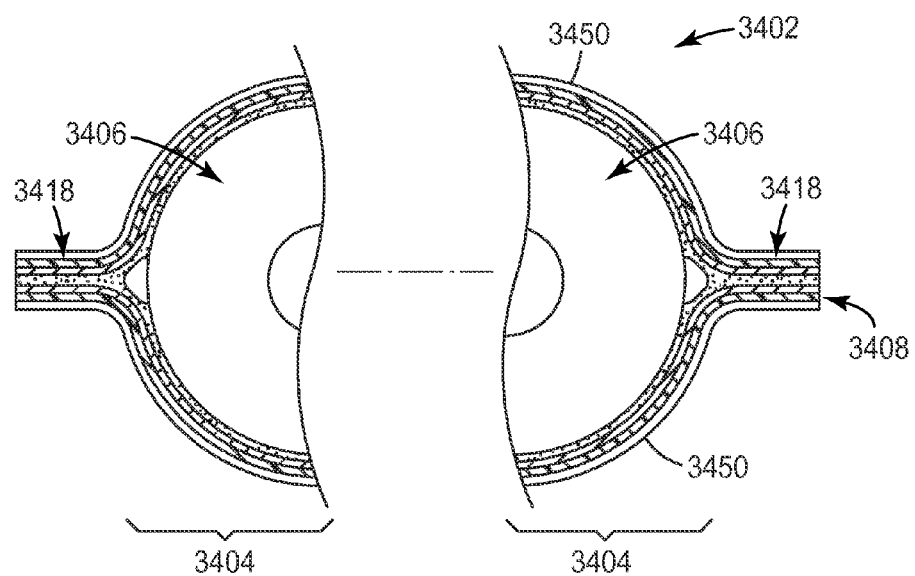
FIG. 14 is a front cross-sectional detail view of another exemplary embodiment of a shielded electrical cable.

In FIG. 14, shielded electrical cable 3402 includes two conductor sets 3404, each including two insulated conductors 3406, and two generally shielding films 3408 and two EMI absorbing layers 3450 disposed on opposite sides of the electrical cable 3402 around conductor sets 3404. Shielding films 3408 include pinched portions 3418. Pinched portions 3418 are positioned at or near an edge of shielded electrical cable 3402 are configured to electrically isolate conductor sets 3404 from the external environment. In shielded electrical cable 3402, pinched portions 3418 of shielding films 3408 and insulated conductors 3406 are arranged generally in a single plane.

Figure 15A:
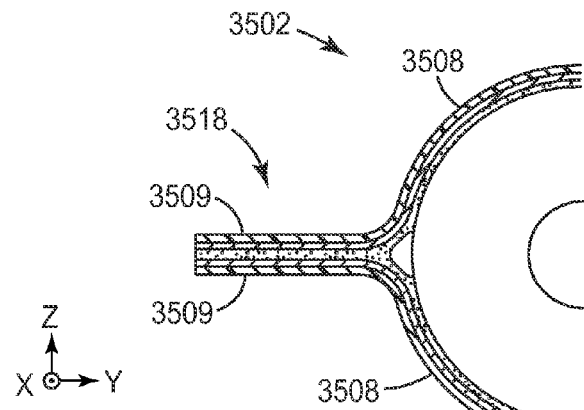
FIGS. 15a-15f are front cross-sectional detail views illustrating six other exemplary embodiments of a parallel portion of a shielded electrical cable.

In FIG. 15a, shielded electrical cable 3502 includes a pinched region 3518 wherein pinched portions 3509 of shielding films 3508 are spaced apart. Pinched region 3518 is similar to pinched region 2518 described above and illustrated in FIG. 11a. Whereas pinched region 2518 is positioned in between conductor sets, pinched region 3518 is positioned at or near an edge of shielded electrical cable 3502.

Figure 15B:
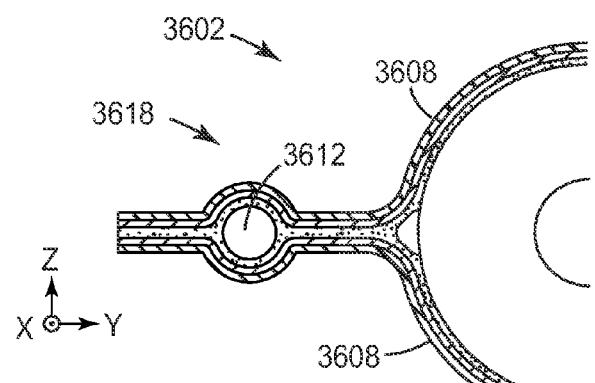

In FIG. 15b, shielded electrical cable 3602 includes a pinched region 3618 that includes a longitudinal ground conductor 3612 disposed between shielding films 3608. Pinched region 3618 is similar to pinched region 2618 described above and illustrated in FIG. 11b. Whereas pinched region 2618 is positioned in between conductor sets, pinched region 3618 is positioned at or near an edge of shielded electrical cable 3602.

Figure 15C:
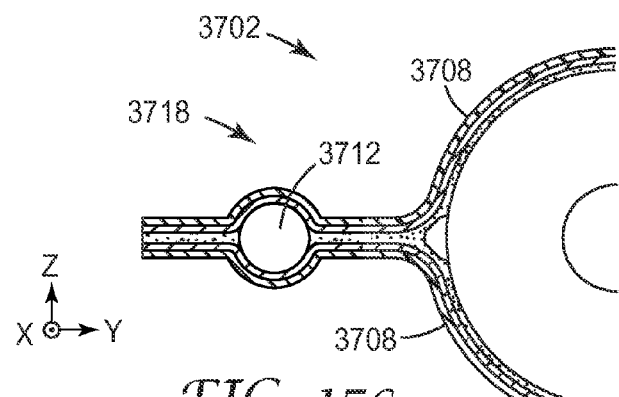

In FIG. 15c, shielded electrical cable 3702 includes a pinched region 3718 including a longitudinal ground conductor 3712 disposed between shielding films 3708. Pinched region 3718 is similar to pinched region 2718 described above and illustrated in FIG. 11c. Whereas pinched region 2718 is positioned in between conductor sets, pinched region 3718 is positioned at or near an edge of shielded electrical cable 3702.

Figure 15D:
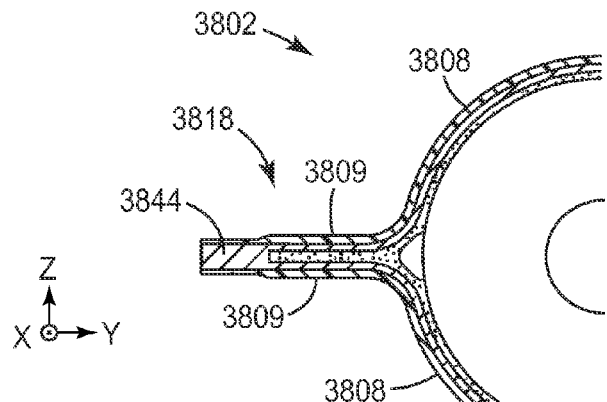

In FIG. 15d, shielded electrical cable 3802 includes a pinched region 3818 wherein the pinched portions 3809 of shielding films 3808 make direct electrical contact with each other by any suitable means, such as, e.g., conductive element 3844. Conductive element 3844 may include a conductive plated via or channel, a conductive filled via or channel, or a conductive adhesive, to name a few. Pinched region 3818 is similar to pinched region 2818 described above and illustrated in FIG. 11d. Whereas pinched region 2818 is positioned in between conductor sets, pinched region 3818 is positioned at or near an edge of shielded electrical cable 3802.

Figure 15E:
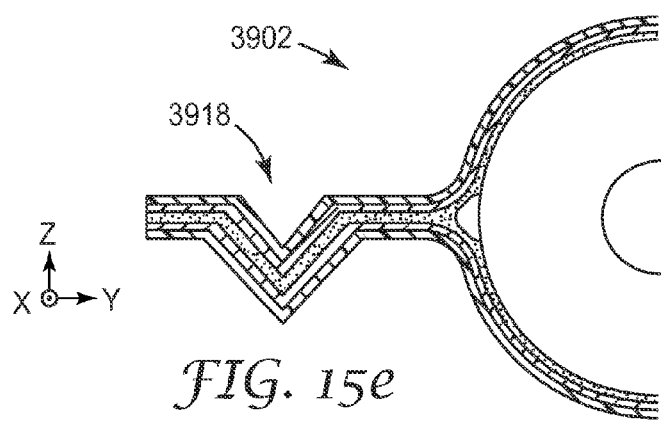

In FIG. 15e, shielded electrical cable 3902 includes a pinched region 3918 that is piecewise planar in a folded configuration. Pinched region 3918 is similar to pinched region 3118 described above and illustrated in FIG. 11g. Whereas pinched region 3118 is positioned in between conductor sets, pinched region 3918 is positioned at or near an edge of shielded electrical cable 3902.

Figure 15F:
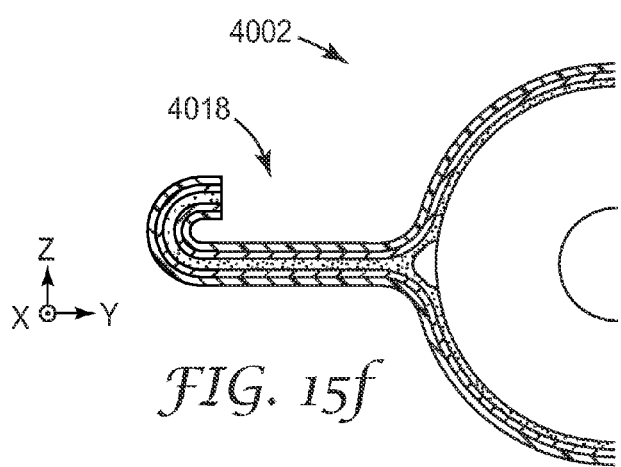

In FIG. 15f, shielded electrical cable 4002 includes a pinched region 4018 that is piecewise planar in a curved configuration and positioned at or near an edge of shielded electrical cable 4002. In some cases, one or more of the shielded cables 3502-4002 can include one or more EMI absorbing layers disposed on the conductor sets.

Figure 16A:
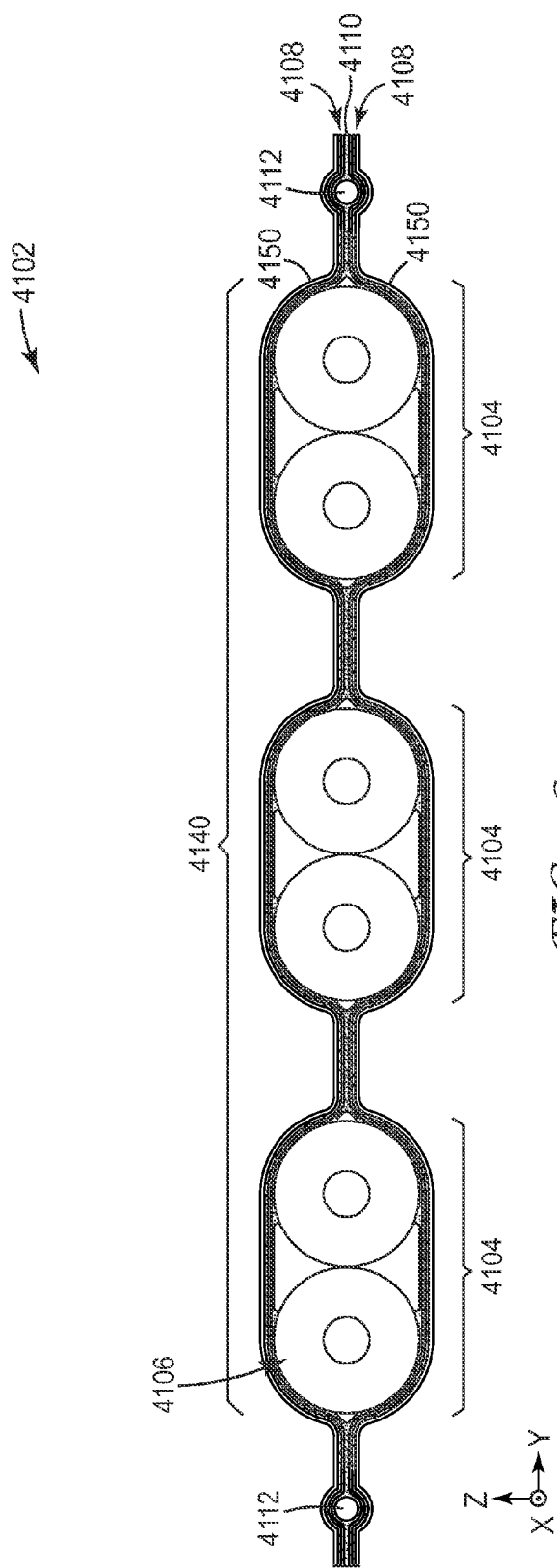
FIG. 16a-16b are front cross-sectional views of two other exemplary embodiments of a shielded electrical cable.
Figure 16B:
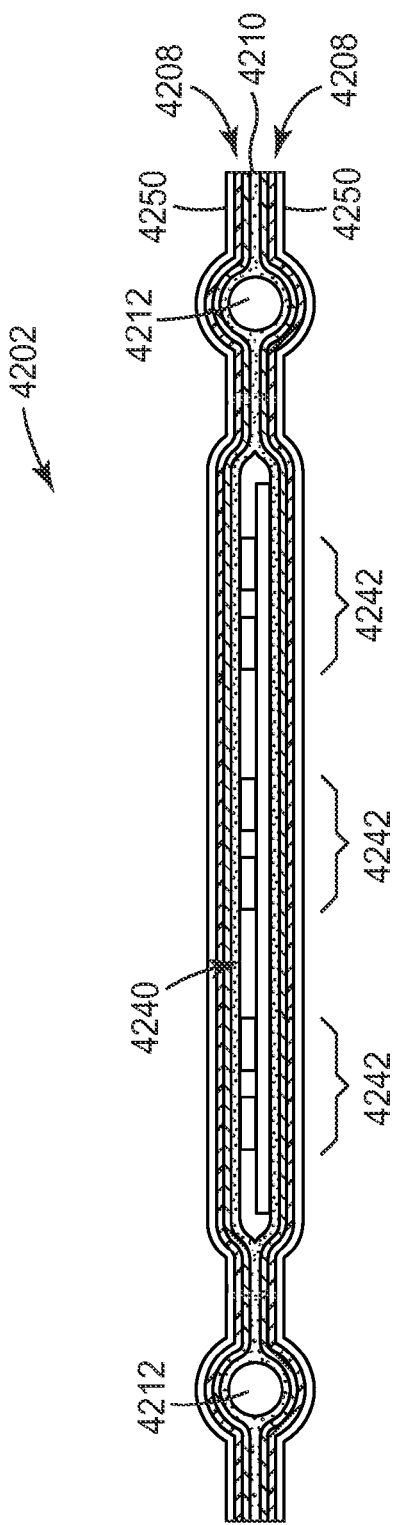

A shielded electrical cable according to an aspect of the present invention may include at least one longitudinal ground conductor, an electrical article extending in substantially the same direction as the ground conductor, and two shielding films and two EMI absorbing layers disposed on opposite sides of the shielded electrical cable. In transverse cross section, the shielding films and the EMI absorbing layers substantially surround the ground conductor and the electrical article. In this configuration, the shielding films, the EMI absorbing layers, and the ground conductor are configured to electrically isolate the electrical article. The ground conductor may extend beyond at least one of the ends of the shielding films, e.g., for termination of the shielding films to any suitable individual contact element of any suitable termination point, such as, e.g., a contact element on a printed circuit board or an electrical contact of an electrical connector. Beneficially, only a limited number of ground conductors is needed for a cable construction, and can, along with the shielding films, complete an electromagnetic enclosure of the electrical article. The electrical article may include at least one conductor that extends along a length of the cable, at least one conductor set that extends along a length of the cable including one or more insulated conductors, a flexible printed circuit, or any other suitable electrical article of which electrical isolation is desired. FIGS. 16a-16b illustrate two exemplary embodiments of such shielded electrical cable configuration.

In FIG. 16a, shielded electrical cable 4102 includes two spaced apart ground conductors 4112 that extend along a length of the cable 4102 along the x-axis, an electrical article 4140 positioned between and extending in substantially the same direction as ground conductors 4112, and two shielding films 4108 and two EMI absorbing layers 4150 disposed on opposite sides of the cable. In transverse cross section, the shielding films 4108 and the EMI absorbing layers 4150, in combination, substantially surround ground conductors 4112 and electrical article 4140.

Electrical article 4140 includes three conductor sets 4104 that are spaced apart across a width of the cable 4102 along the y-axis. Each conductor set 4104 includes two substantially insulated conductors 4106 that extend along a length of the cable. Ground conductors 4112 may make indirect electrical contact with both shielding films 4108 resulting in a low but non-zero impedance between the ground conductors 4112 and the shielding films 4108. In some cases, ground conductors 4112 may make direct or indirect electrical contact with at least one of the shielding films 4108 in at least one location of shielding films 4108. In some cases, an adhesive layer 4110 is disposed between the shielding films 4108 and bonds the shielding films 4108 to each other on both sides of ground conductors 4112 and electrical article 4140. Adhesive layer 4110 can be configured to provide controlled separation of at least one of shielding films 4108 and ground conductors 4112. In one aspect, this means that adhesive layer 4110 has a non-uniform thickness that allows ground conductors 4112 to make direct or indirect electrical contact with at least one of shielding films 4108 in selective locations. The ground conductors 4112 may include surface asperities or a deformable wire, such as, e.g., a stranded wire, to provide this controlled electrical contact between ground conductors 4112 and at least one of shielding films 4108. The shielding films 4108 can be spaced apart by a minimum spacing in at least one location of shielding films 4108, where ground conductors 4112 have a thickness that is greater than the minimum spacing. For example, the shielding films 4108 may have a thickness of less than about 0.025 mm.

In FIG. 16b, shielded electrical cable 4202 includes two spaced apart ground conductors 4212 that extend along a length of the cable 4202 along the x-axis, an electrical article 4240 positioned between and extending in substantially the same direction as ground conductors 4212, and two shielding films 4208 and two EMI absorbing layers 4250 disposed on opposite sides of the cable 4202. In transverse cross section, the shielding films and the EMI absorbing layers, in combination, substantially surround ground conductors 4212 and electrical article 4240. Shielded electrical cable 4202 is similar in some respects to shielded electrical cable 4102 described above and illustrated in FIG. 16a. Whereas in shielded electrical cable 4102, electrical article 4140 includes three conductor sets 4104 each including two substantially parallel longitudinal insulated conductors 4106, in shielded electrical cable 4202, electrical article 4240 includes a flexible printed circuit including three conductor sets 4242.

Figure 17:
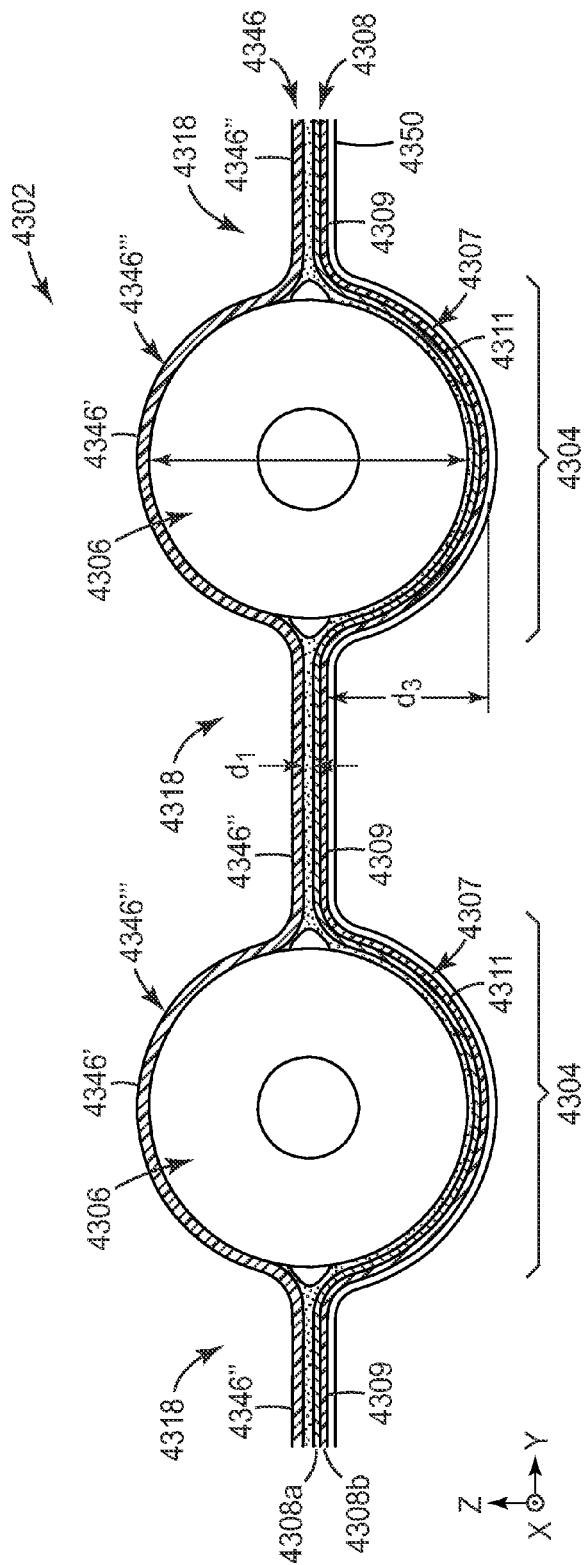
FIG. 17 is a front cross-sectional view of another exemplary embodiment of a shielded electrical cable.

In some cases, a single shielding film may provide an acceptable level of electromagnetic interference (EMI) isolation for a given application, and may reduce the proximity effect thereby decreasing signal attenuation. FIG. 17 illustrates one example of such a shielded electrical cable that includes only one shielding film.

Shielded electrical cable 4302, illustrated in FIG. 17, includes two spaced apart conductor sets 4304 and a single shielding film 4308 and a single EMI absorbing layer 4350. Each conductor set 4304 includes a single insulated conductor 4306 that extends along a length of the cable 4302 along the x-axis. Insulated conductors 4306 are arranged generally in a single plane, such as the xy-plane, and effectively in a coaxial cable configuration that can be used in a single ended circuit arrangement. Cable 4302 includes pinched regions 4318. In the pinched regions 4318, the shielding film 4308 includes pinched portions 4309 extending from both sides of each conductor set 4304. Pinched regions 4318 cooperatively define a generally planar shielding film. The shielding film 4308 includes two cover portions 4307 each partially covering a conductor set 4304. Each cover portion 4307 includes a concentric portion 4311 substantially concentric with corresponding conductor 4306. Shielding film 4308 includes a conductive layer 4308a and a non-conductive polymeric layer 4308b. The conductive layer 4308a faces the insulated conductors 4306. The cable 4302 may optionally include an non-conductive carrier film 4346. Carrier film 4346 includes pinched portions 4346" that extend from both sides of each conductor set 4304 and opposite pinched portions 4309 of the shielding film 4308. The carrier film 4346 includes two cover portions 4346' each partially covering a conductor set 4304 opposite cover portion 4307 of shielding film 4308. Each cover portion 4346' includes a concentric portion 4346' substantially concentric with corresponding conductor 4306. Carrier film 4346 may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. Carrier film 4346 may include one or more additives and/or fillers to provide properties suitable for the intended application. Carrier film 4346 may be used to complete physical coverage of conductor sets 4304 and add to the mechanical stability of shielded electrical cable 4302.

Figure 18:
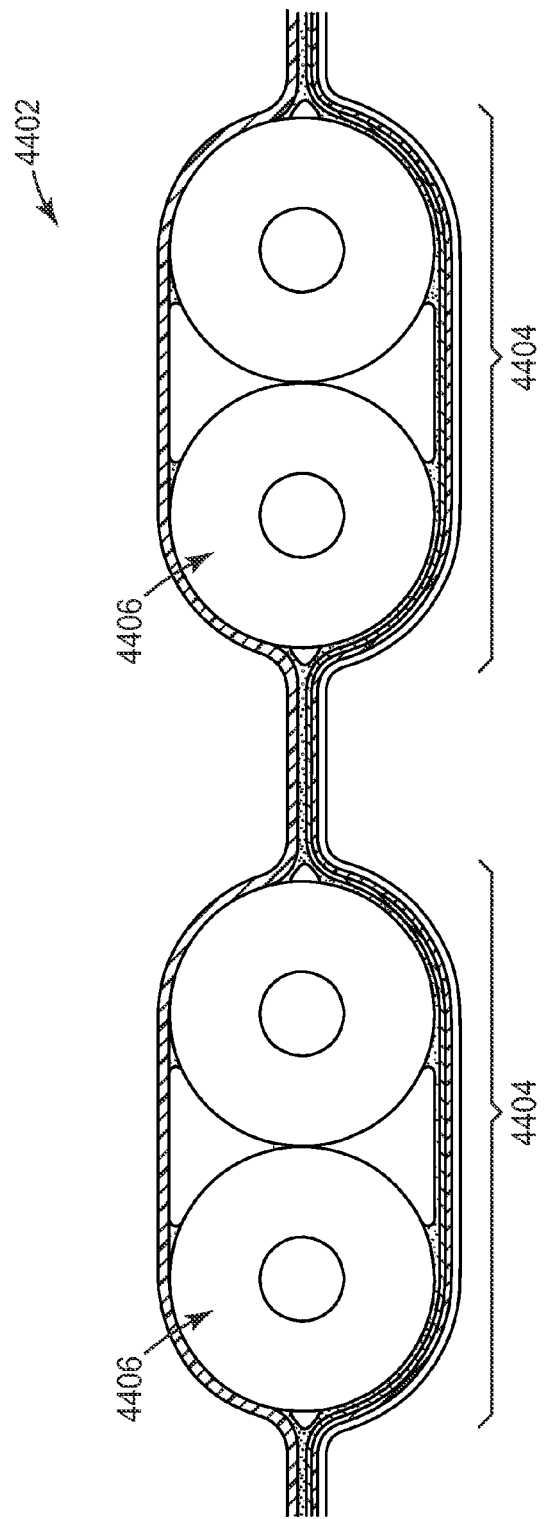
FIG. 18 is a front cross-sectional view of another exemplary embodiment of a shielded electrical cable.

Referring to FIG. 18, shielded electrical cable 4402 is similar in some respects to shielded electrical cable 4302 described above and illustrated in FIG. 17. Whereas shielded electrical cable 4302 includes conductor sets 4304 each including a single insulated conductor 4306, shielded electrical cable 4402 includes conductor sets 4404 that have two insulated conductors 4406. The insulated conductors 4406 are arranged generally in a single plane and effectively in a twinaxial cable configuration which can be used in a single ended or differential pair circuit arrangement.

Figure 19:
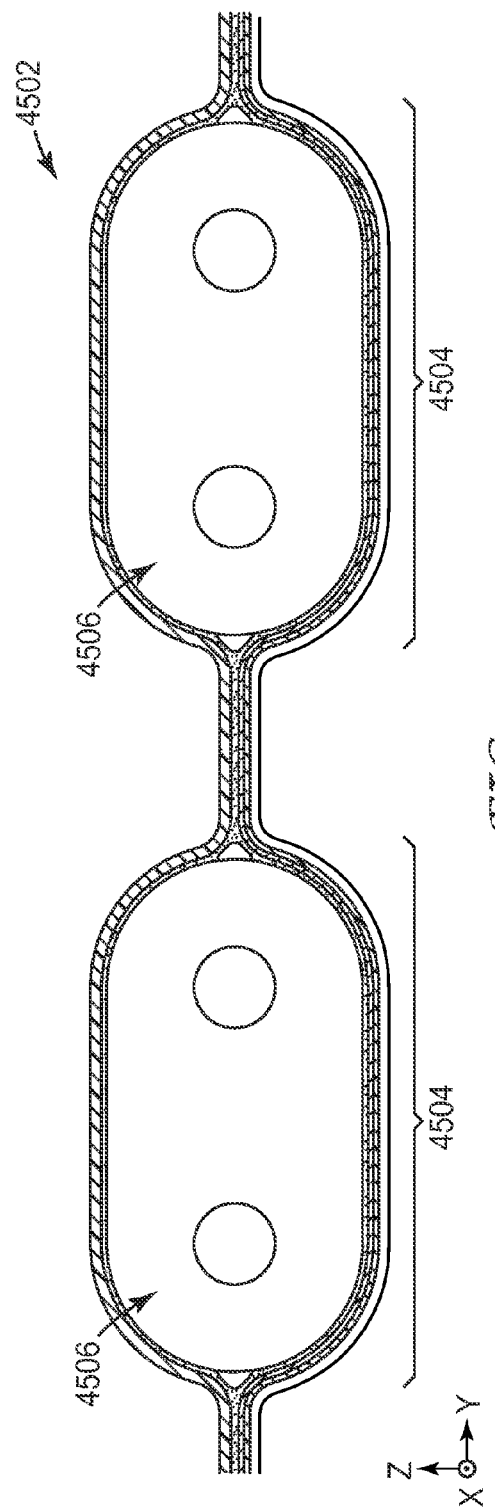
FIG. 19 is a front cross-sectional view of another exemplary embodiment of a shielded electrical cable.

Referring to FIG. 19, shielded electrical cable 4502 is similar in some respects to shielded electrical cable 4402 described above and illustrated in FIG. 18. Whereas shielded electrical cable 4402 has individually insulated conductors 4406, shielded electrical cable 4502 has jointly insulated conductors 4506.

In one aspect, as can be seen in FIGS. 17-19, the shielding film is re-entrant between adjacent conductor sets. In other words, the shielding film includes a pinched portion that is disposed between adjacent conductor sets. This pinched portion is configured to electrically isolate the adjacent conductor sets from each other. The pinched portion may eliminate the need for a ground conductor to be positioned between adjacent conductor sets, which simplifies the cable construction and increases the cable flexibility, among other benefits. The pinched portion may be positioned at a depth $d_3$ (FIG. 17) that is greater than about one third of the diameter of the insulated conductors. In some cases, the pinched portion may be positioned at a depth $d_3$ that is greater than about one half of the diameter of the insulated conductors. Depending on the spacing between adjacent conductor sets, the transmission distance, and the signaling scheme (differential versus single-ended), this re-entrant configuration of the shielding film more than adequately electrically isolates the conductor sets from each other.

The conductor sets and shielding film may be cooperatively configured in an impedance controlling relationship. In one aspect, this means that the partial coverage of the conductor sets by the shielding film is accomplished with a desired consistency in geometry along the length of the shielded electrical cable such as to provide an acceptable impedance variation as suitable for the intended application. In one embodiment, this impedance variation is less than 5 Ohms and preferably less than 3 Ohms along a representative cable length, such as, e.g., 1 m. In another aspect, if the insulated conductors are arranged effectively in a twinaxial and/or differential pair cable arrangement, this means that the partial coverage of the conductor sets by the shielding film is accomplished with a desired consistency in geometry between the insulated conductors of a pair such as to provide an acceptable impedance variation as suitable for the intended application. In some cases, the impedance variation is less than 2 Ohms and preferably less than 0.5 Ohms along a representative cable length, such as, e.g., 1 m.

FIGS. 20a-20d illustrate various examples of partial coverage of the conductor set by the shielding film and/or the EMI absorbing layer. The amount of coverage by the shielding film and the EMI absorbing layer varies between the embodiments. In the embodiment illustrated in FIG. 20a, the conductor set has the most coverage. In the embodiment illustrated in FIG. 20d, the conductor set has the least coverage. In the embodiments illustrated in FIGS. 20a and 20b, more than half of the periphery of the conductor set is covered by the shielding film and the EMI absorbing layer. In the embodiments illustrated in FIGS. 20c and 20d, less than half of the periphery of the conductor set is covered by the shielding film and the EMI absorbing layer. A greater amount of coverage provides better electromagnetic interference (EMI) isolation and reduced signal attenuation (resulting from a reduction in the proximity effect).

Figure 20A:
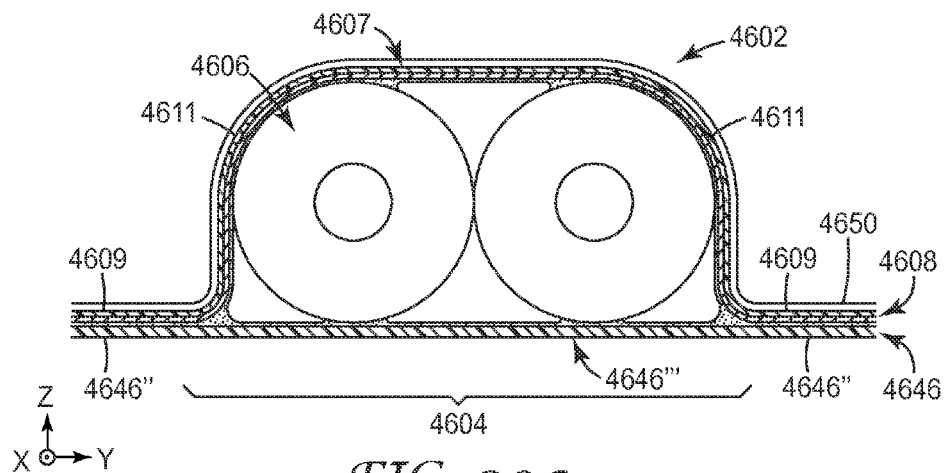
FIG. 20a-20d are front cross-sectional views of four other exemplary embodiments of a shielded electrical cable.

Referring to FIG. 20a, shielded electrical cable 4602 includes a conductor set 4604 and a shielding film 4608 and an EMI absorbing layer 4650. Conductor set 4604 includes two insulated conductors 4606 which extend along a length of the cable 4602 along the x-axis. Shielding film 4608 and the EMI absorbing layer 4650 include pinched portions 4609 extending from both sides of conductor set 4604. Pinched portions 4609 cooperatively define a generally planar shielding film and EMI absorbing layer. Shielding film 4608 further includes a cover portion 4607 partially covering conductor set 4604. Cover portion 4607 includes concentric portions 4611 substantially concentric with a corresponding end conductor 4306 of the conductor set 4604. Shielded electrical cable 4602 may also have an optional non-conductive carrier film 4646. Carrier film 4646 includes pinched portions 4646" extending from both sides of conductor set 4604 and disposed opposite pinched portions 4609 of shielding film 4608. Carrier film 4646 further includes a cover portion 4646' partially covering conductor set 4604 opposite cover portion 4607 of shielding film 4608. Cover portion 4607 of shielding film 4608 covers the top side and the entire left and right sides of conductor set 4604. Cover portion 4646' of carrier film 4646 covers the bottom side of conductor set 4604, completing the substantial enclosure of conductor set 4604. In this embodiment, pinched portions 4646" and cover portion 4646' of carrier film 4646 are substantially coplanar.

Figure 20B:
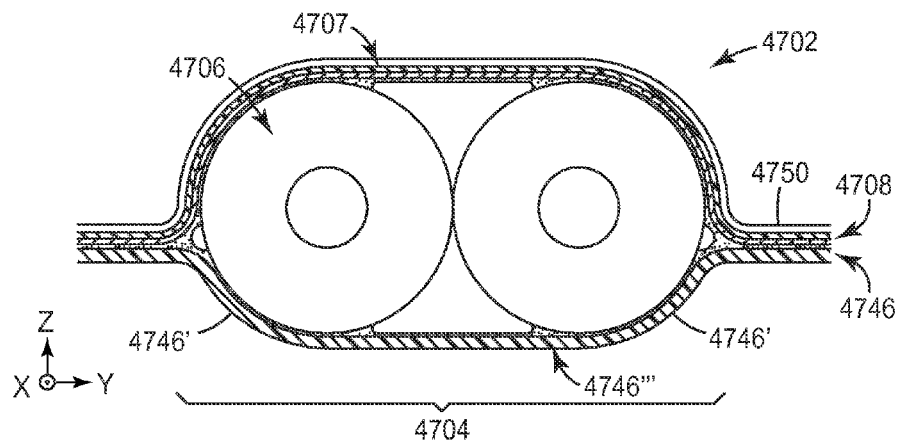

Referring to FIG. 20b, shielded electrical cable 4702 is similar in some respects to shielded electrical cable 4602 described above and illustrated in FIG. 20a. However, in shielded electrical cable 4702, the cover portion 4707 of shielding film 4708 and EMI absorbing layer 4750 covers the top side and more than half of the left and right sides of conductor set 4704. The cover portion 4746' of carrier film 4746 covers the bottom side and the remainder (less than half) of the left and right sides of conductor set 4704, completing the substantial enclosure of conductor set 4704. Cover portion 4746' of carrier film 4746 includes concentric portions 4746' substantially concentric with corresponding conductor 4706.

Figure 20C:
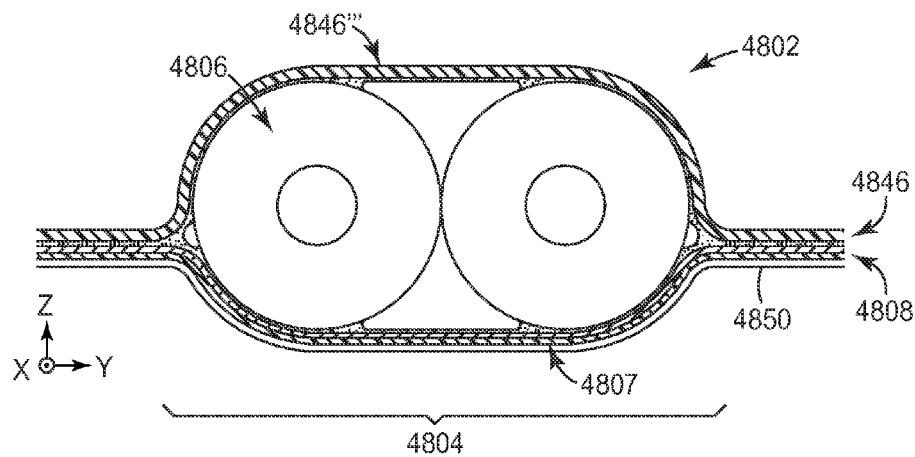

Referring to FIG. 20c, shielded electrical cable 4802 is similar in some respects to shielded electrical cable 4602 described above and illustrated in FIG. 20a. In shielded electrical cable 4802, the cover portion 4807 of shielding film 4808 and EMI absorbing layer 4850 covers the bottom side and less than half of the left and right sides of conductor set 4804. Cover portion 4846' of carrier film 4846 covers the top side and the remainder (more than half) of the left and right sides of conductor set 4804, completing the enclosure of conductor set 4804.

Figure 20D:
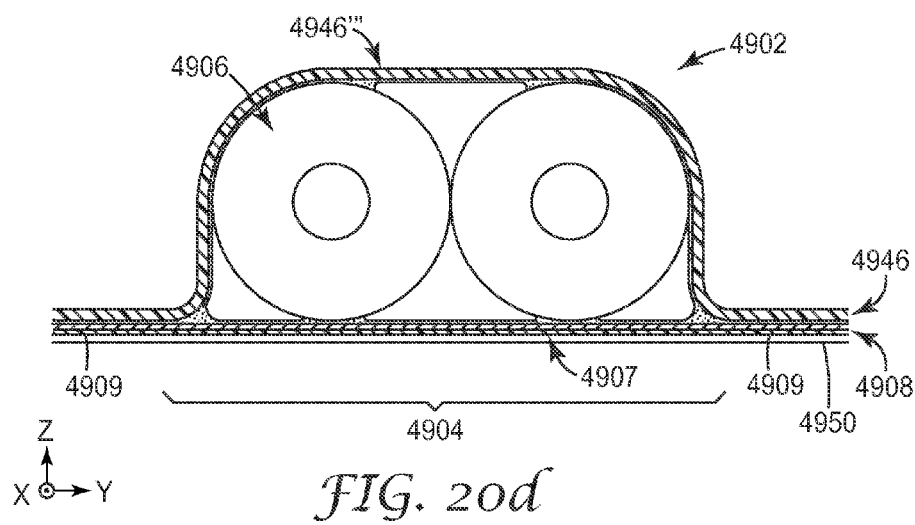

Referring to FIG. 20d, shielded electrical cable 4902 is similar to shielded electrical cable 4602 described above and illustrated in FIG. 20a. However, in shielded electrical cable 4902, cover portion 4907 of shielding film 4908 and EMI absorbing layer 4950 covers the bottom side of conductor set 4904. Cover portion 4946' of carrier film 4946 covers the top side and the entire left and right sides of conductor set 4904, completing the substantial enclosure of conductor set 4904. In some cases, pinched portions 4909 and cover portion 4907 of shielding film 4908 are substantially coplanar.

Similar to embodiments of the shielded electrical cable including two shielding films and one or more EMI absorbing layers disposed on opposite sides of the cable around a conductor set and/or around a plurality of spaced apart conductor sets, embodiments of the shielded electrical cable including a single shielding film and a single EMI absorbing layer may include at least one longitudinal ground conductor. In one aspect, this ground conductor facilitates electrical contact of the shielding film to any suitable individual contact element of any suitable termination point, such as, e.g., a contact element on a printed circuit board or an electrical contact of an electrical connector. The ground conductor may extend beyond at least one of the ends of the shielding film to facilitate this electrical contact. The ground conductor may make direct or indirect electrical contact with the shielding film in at least one location along its length, and may be placed in suitable locations of the shielded electrical cable.

Figure 21:
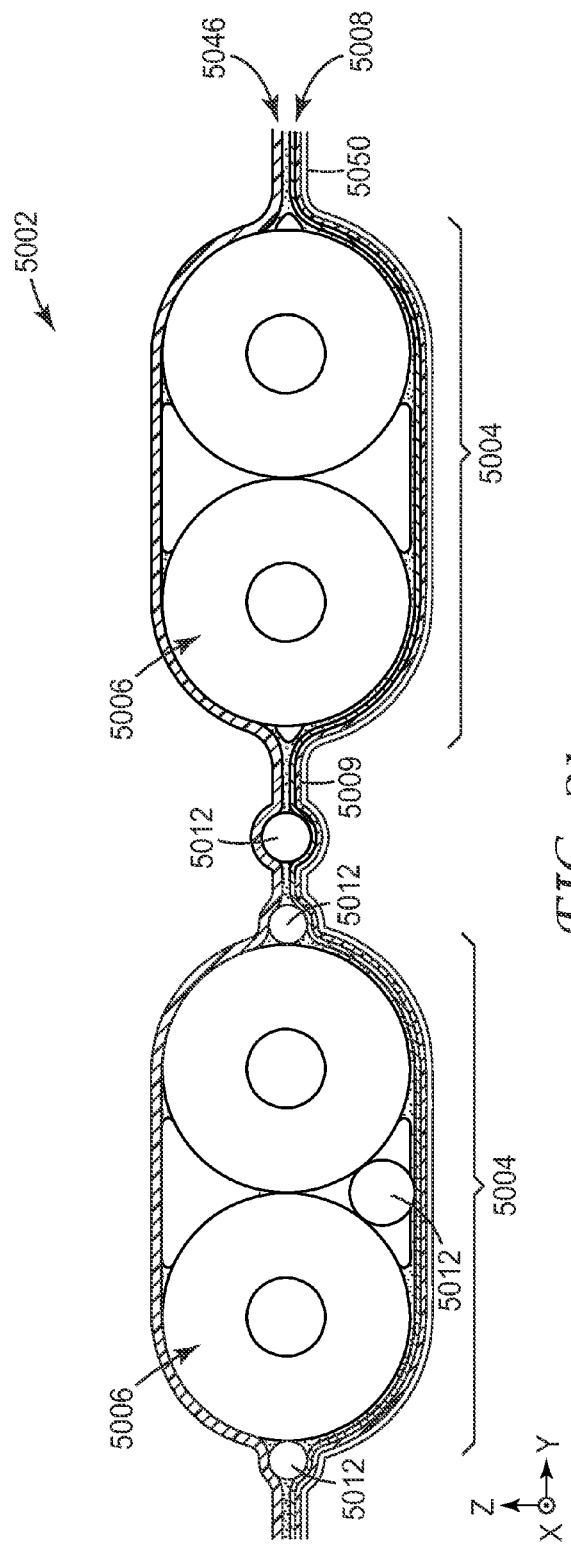
FIG. 21 is a front cross-sectional view of another exemplary embodiment of a shielded electrical cable.

FIG. 21 illustrates a shielded electrical cable 5002 having only one shielding film 5008 and an EMI absorbing layer 5050. Insulated conductors 5006 are arranged in two conductor sets 5004, each having only one pair of insulated conductors, although conductor sets having other numbers of insulated conductors as discussed herein are also contemplated. Shielded electrical cable 5002 is shown to include ground conductors 5012 in various exemplary locations but any or all of the ground conductors 5012 may be omitted if desired, or additional ground conductors can be included. Ground conductors 5012 extend in substantially the same direction as insulated conductors 5006 of conductor sets 5004 and are positioned between shielding film 5008 and carrier film 5046. One ground conductor 5012 is included in a pinched portion 5009 of shielding film 5008 and EMI absorbing layer 5050 and three ground conductors 5012 are included in a conductor set 5004. One of these three ground conductors 5012 is positioned between insulated conductors 5006 and shielding film 5008 and two of these three ground conductors 5012 and insulated conductors 5006 are arranged generally in a single plane.

FIGS. 22a-22d are cross sectional views that illustrate various exemplary embodiments of a shielded electrical cable according to aspects of the present invention. FIGS. 22a-22d illustrate various examples of partial coverage of the conductor set by the shielding film and the EMI absorbing layer without the presence of a carrier film. The amount of coverage by the shielding film and the EMI absorbing layer varies between the embodiments. In the embodiment illustrated in FIG. 22a, the conductor set has the most coverage. In the embodiment illustrated in FIG. 22d, the conductor set has the least coverage. In the embodiments illustrated in FIGS. 22a and 22b, more than half of the periphery of the conductor set is covered by the shielding film and the EMI absorbing layer. In the embodiment illustrated in FIG. 22c, about half of the periphery of the conductor set is covered by the shielding film and the EMI absorbing layer. In the embodiment illustrated in FIG. 22d, less than half of the periphery of the conductor set is covered by the shielding film and the EMI absorbing layer. A greater amount of coverage provides better electromagnetic interference (EMI) isolation and reduced signal attenuation (resulting from a reduction in the proximity effect). Although in these embodiments, a conductor set includes two substantially parallel longitudinal insulated conductors, in other embodiments, a conductor set may include one or more than two substantially parallel longitudinal insulated conductors.

Figure 22A:
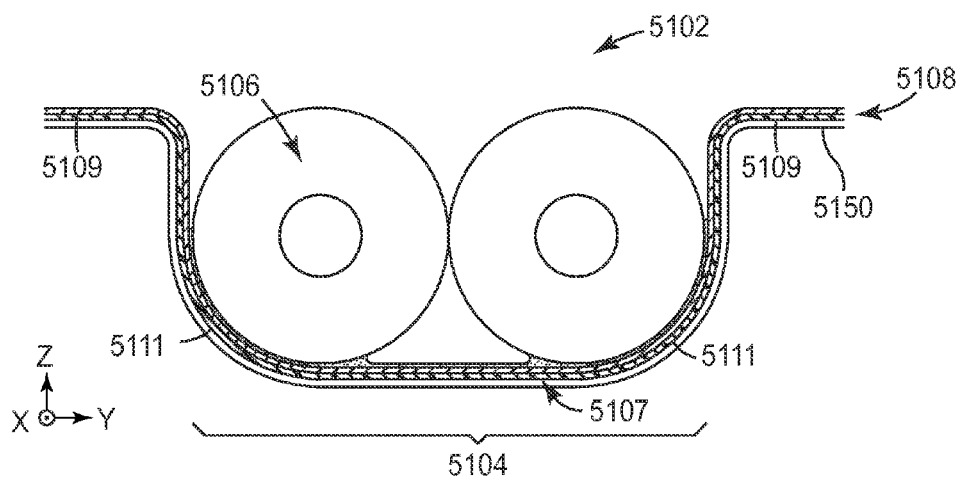
FIG. 22a-22d are front cross-sectional views of four other exemplary embodiments of a shielded electrical cable.

Referring to FIG. 22a, a shielded electrical cable 5102 includes a conductor set 5104 and a shielding film 5108 and an EMI absorbing layer 5150. The conductor set 5104 includes two insulated conductors 5106 that extend along a length of the cable 5102 along the x-axis. Shielding film 5108 and EMI absorbing layer 5150 include pinched portions 5109 extending from both sides of conductor set 5104. Pinched portions 5109 cooperatively define a generally planar shielding film in the xy-plane. Shielding film 5108 further includes a cover portion 5107 partially covering conductor set 5104. Cover portion 5107 includes concentric portions 5111 substantially concentric with a corresponding end conductor 5106 of the conductor 5104. Cover portion 5107 of shielding film 5108 covers the bottom side and the entire left and right sides of conductor set 5104 in FIG. 22a.

Figure 22B:
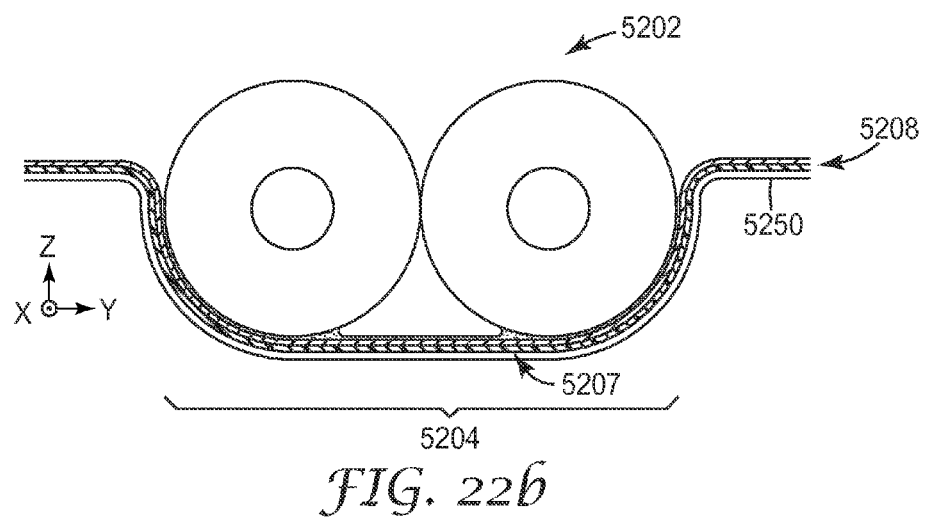

Referring to FIG. 22b, shielded electrical cable 5202 is similar in some respects to shielded electrical cable 5102 described above and illustrated in FIG. 22a. However, in shielded electrical cable 5202, cover portion 5207 of shielding film 5208 and EMI absorbing layer 5250 covers the bottom side and more than half of the left and right sides of conductor set 5204.

Figure 22C:
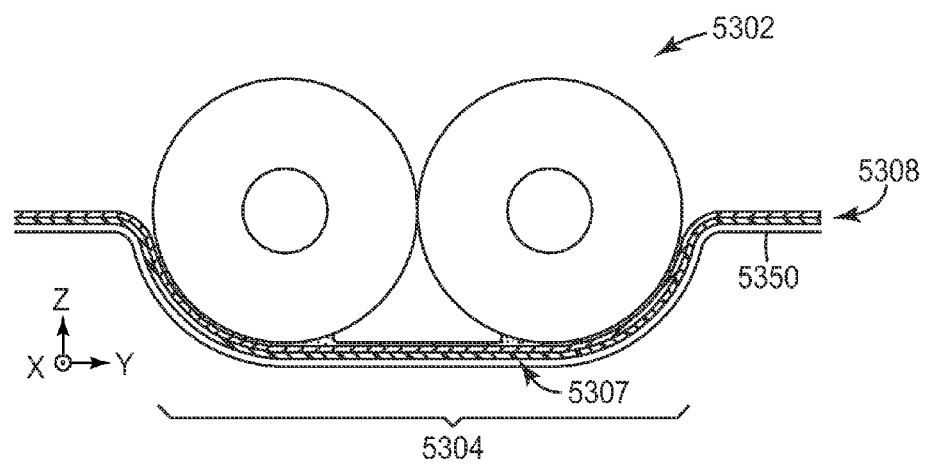

Referring to FIG. 22c, shielded electrical cable 5302 is similar to shielded electrical cable 5102 described above and illustrated in FIG. 22a. However, in shielded electrical cable 5302, cover portion 5307 of shielding film 5308 and EMI absorbing layer 5350 covers the bottom side and about half of the left and right sides of conductor set 5304.

Figure 22D:
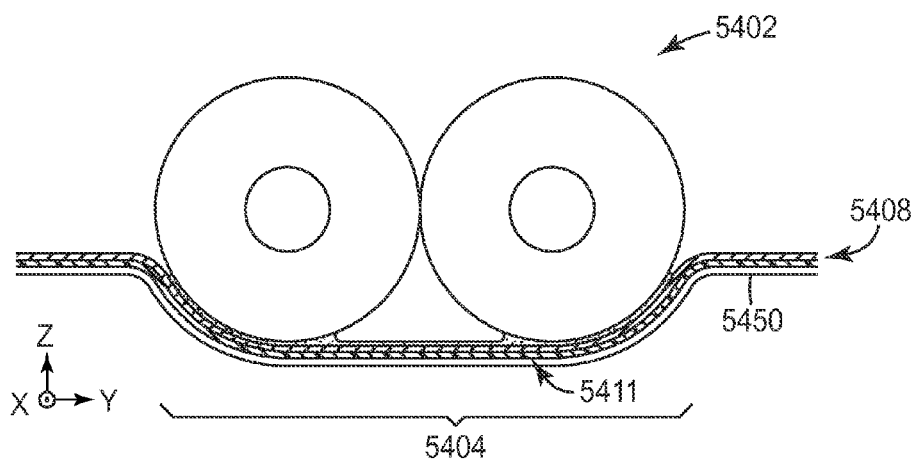

Referring to FIG. 22d, shielded electrical cable 5402 is similar in some respects to shielded electrical cable 5102 described above and illustrated in FIG. 22a. However, in shielded electrical cable 5402, cover portion 5411 of shielding film 5408 and EMI absorbing layer 5450 covers the bottom side and less than half of the left and right sides of conductor set 5404.

As an alternative to a carrier film, for example, shielded electrical cables according to aspects of the present invention may include an optional non-conductive support. This support may be used to complete physical coverage of a conductor set and add to the mechanical stability of the shielded electrical cable. FIGS. 23a-23d are cross sectional views that illustrate various exemplary embodiments of a shielded electrical cable according to aspects of the present invention including a non-conductive support. Although in these embodiments, a non-conductive support is used with a conductor set that includes two insulated conductors, in other embodiments, a non-conductive support may be used with a conductor set that includes one or more than two substantially parallel longitudinal insulated conductors, or with a ground conductor. The support may include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane, acrylates, silicones, natural rubber, epoxies, and synthetic rubber adhesive. The support may include one or more additives and/or fillers to provide properties suitable for the intended application.

Figure 23A:
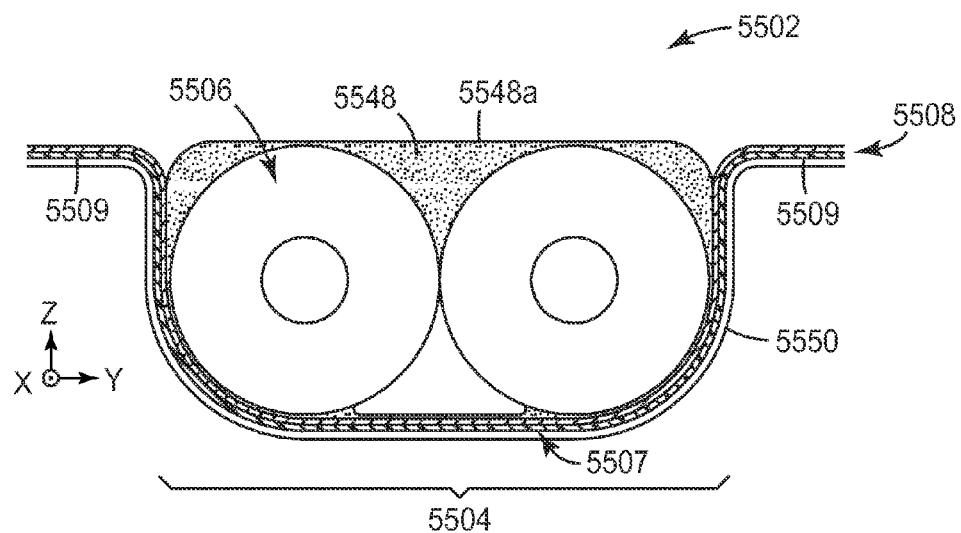
FIG. 23a-23d are front cross-sectional views of four other exemplary embodiments of a shielded electrical cable.

Referring to FIG. 23a, shielded electrical cable 5502 is similar to shielded electrical cable 5102 described above and illustrated in FIG. 22a, but further includes a non-conductive support 5548 partially covering conductor set 5504 opposite cover portion 5507 of shielding film 5508 and EMI absorbing layer 5550. The support 5548 can cover the top side of conductor 5504, to enclose insulated conductors 5506. The support 5548 includes a generally planar top surface 5548a. Top surface 5548a and pinched portions 5509 of the shielding film 5508 are substantially coplanar.

Figure 23B:
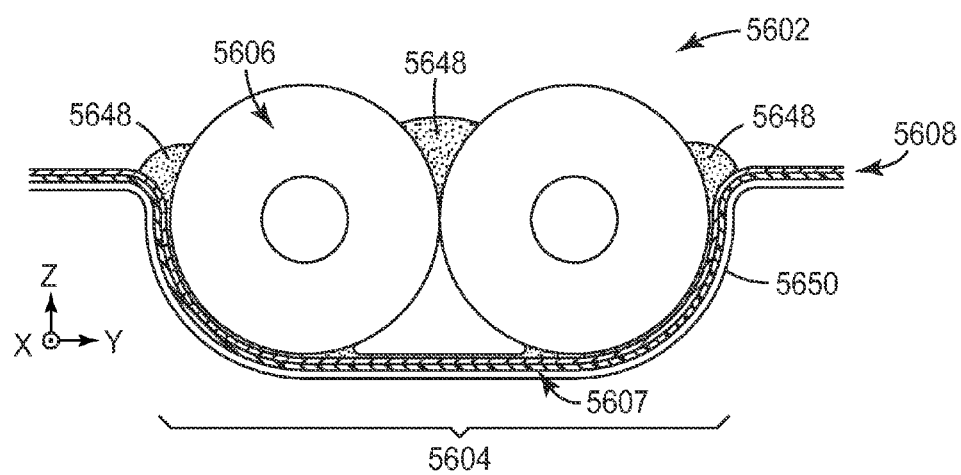

Referring to FIG. 23b, shielded electrical cable 5602 is similar to shielded electrical cable 5202 described above and illustrated in FIG. 22b, but further includes a non-conductive support 5648 partially covering conductor set 5604 opposite cover portion 5607 of shielding film 5608 and EMI absorbing layer 5650. Support 5648 only partially covers the top side of conductor set 5604, leaving insulated conductors 5606 partially exposed.

Figure 23C:
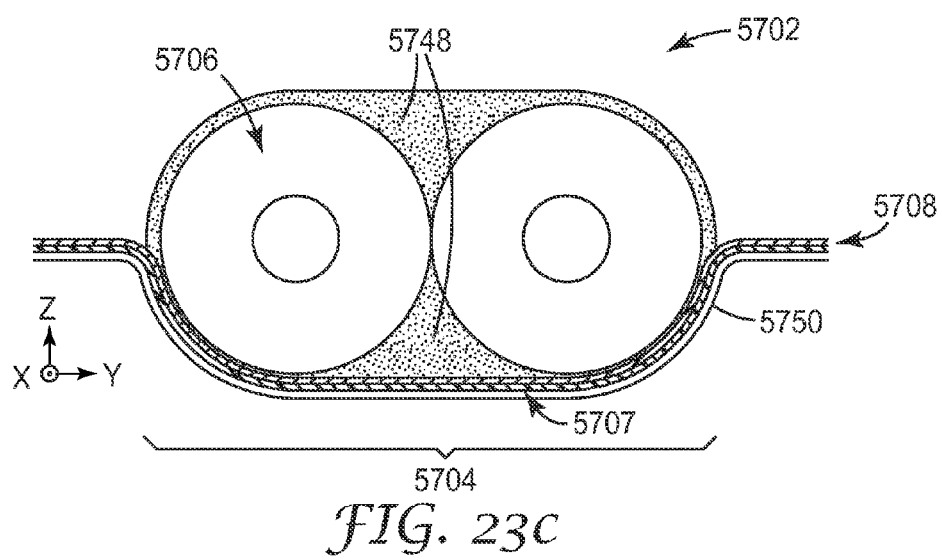

Referring to FIG. 23c, shielded electrical cable 5702 is similar to shielded electrical cable 5302 described above and illustrated in FIG. 22c, but further includes a non-conductive support 5748 partially covering conductor set 5704 opposite cover portion 5707 of shielding film 5708 and EMI absorbing layer 5750. Support 5748 covers essentially the entire top side of conductor set 5704, essentially fully enclosing insulated conductors 5706. At least a portion of support 5748 is substantially concentric with insulated conductors 5706. A portion of support 5748 is disposed between insulated conductors 5706 and shielding film 5708.

Figure 23D:
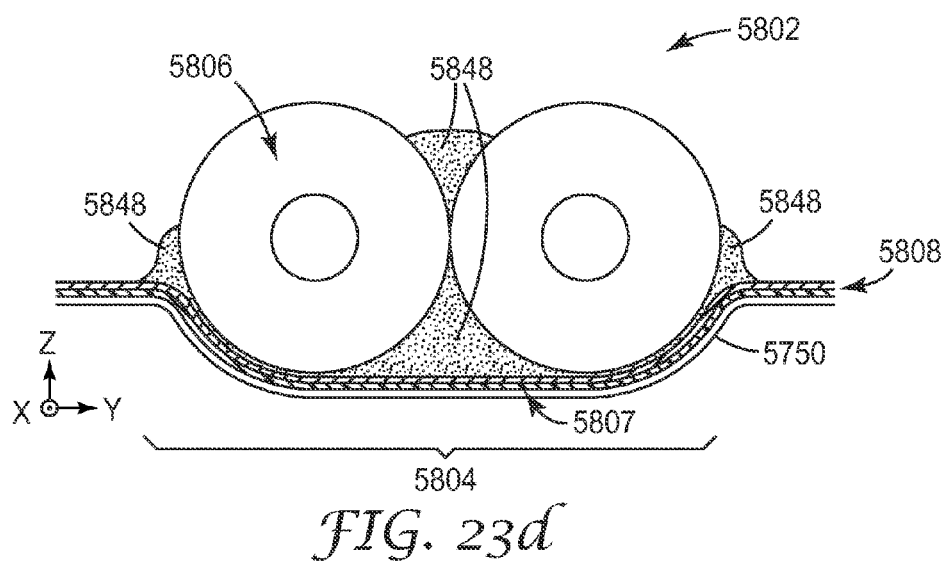

Referring to FIG. 23d, shielded electrical cable 5802 is similar to shielded electrical cable 5402 described above and illustrated in FIG. 22d, but further includes a non-conductive support 5848 partially covering conductor set 5804 opposite cover portion 5807 of shielding film 5808 and EMI absorbing layer 5850. Support 5848 only partially covers the top side of conductor set 5804, leaving insulated conductors 5806 partially exposed. A portion of support 5848 is disposed between insulated conductors 5806 and shielding film 5808.

In reference now to FIGS. 24a and 24b, respective perspective and cross sectional views shows a cable construction according to an example embodiment of the invention. Generally, an electrical ribbon cable 20102 includes one or more conductor sets 20104. Each conductor set 20104 includes two or more conductors (e.g., wires) 20106 extending from end-to-end along the length of the cable 20102 along the x-axis. Each of the conductors 20106 is encompassed by a first dielectric 20108 along the length of the cable. The conductors 20106 are affixed to first and second films 20110, 20112 that extend from end-to-end of the cable 20102 and are disposed on opposite sides of the cable 20102. A consistent spacing 20114 is maintained between the first dielectrics 20108 of the conductors 20106 of each conductor set 20104 along the length of the cable 20102. A second dielectric 20116 is disposed within the spacing 20114. The dielectric 20116 may include an air gap/void and/or some other material.

The spacing 20114 between members of the conductor sets 20104 can be made consistent enough such that the cable 20102 has equal or better electrical characteristics than a standard wrapped twinax cable, along with improved ease of termination and signal integrity of the termination. The films 20110, 20112 may include shielding material such as metallic foil and/or EMI absorbing material, and the films 20110, 20112 may be conformably shaped to substantially surround the conductor sets 20104. In the illustrated example, films 20110, 20112 are pinched together to form flat portions 20118 extending lengthwise along the cable 20102 outside of and/or between conductor sets 20104. In the flat portions 29118, the films 20110, 20112 substantially surround the conductor sets 20104, e.g., surround a perimeter of the conductor sets 20104 except where a small layer (e.g., of insulators and/or adhesives) the films 20110, 20112 join each other. For example, cover portions of the shielding films may collectively encompass at least 75%, or at least 80%, or at least 85%, or at least 90%, of the perimeter of any given conductor set. While the films 20110, 20112 may be shown here (and elsewhere herein) as separate pieces of film, those of skill in the art will appreciate that the films 20110, 20112 may alternatively be formed from a single sheet of film, e.g., folded around a longitudinal path/line to encompass the conductor sets 20104.

The cable 20102 may also include additional features, such as one or more drain wires 20120. The drain wires 20120 may be electrically coupled to shielded films 20110, 20112 continually or at discrete locations along the length of the cable 20102. Generally the drain wire 20102 provides convenient access at one or both ends of the cable for electrically terminating (e.g., grounding) the shielding material. The drain wire 20120 may also be configured to provide some level of DC coupling between the films 20110, 20112, e.g., where both films 20110, 20112 include shielding material and EMI absorbing material.

Item 1 is a shielded electrical cable, comprising:

a plurality of conductor sets extending along a length of the cable and being spaced apart from each other along a width of the cable, each conductor set including one or more insulated conductors;

first and second shielding films disposed on opposite first and second sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor set;

a first EMI absorbing layer disposed on the first side of the cable; and a first adhesive layer bonding the first shielding film to the second shielding film in the pinched portions of the cable; wherein:

the plurality of conductor sets comprises a first conductor set that comprises neighboring first and second insulated conductors and has corresponding first cover portions of the first and second shielding films and corresponding first pinched portions of the first and second shielding films forming a first pinched region of the cable on one side of the first conductor set;

a maximum separation between the first cover portions of the first and second shielding films is D;

a minimum separation between the first pinched portions of the first and second shielding films is $d_1$;

$d_1/D$ is less than 0.25;

a minimum separation between the first cover portions of the first and second shielding films in a region between the first and second insulated conductors is $d_2$; and $d_2/D$ is greater than 0.33.

Item 2 is the cable of item 1, wherein $d_1/D$ is less than 0.1.

Item 3 is the cable of item 1, wherein the first EMI absorbing layer is disposed between the first shielding film and the plurality of conductor sets.

Item 4 is the cable of item 1, wherein the first shielding film is disposed between the first EMI absorbing layer and the plurality of conductor sets.

Item 5 is the cable of item 1 further comprising a second EMI absorbing layer disposed on the second side of the cable.

Item 6 is a shielded electrical cable, comprising:

a plurality of conductor sets extending along a length of the cable and being spaced apart from each other along a width of the cable, each conductor set including one or more insulated conductors;

first and second shielding films disposed on opposite first and second sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor set;

a first EMI absorbing layer disposed on the first side of the cable; and a first adhesive layer bonding the first shielding film to the second shielding film in the pinched portions of the cable;

wherein:

the plurality of conductor sets comprises a first conductor set that comprises neighboring first and second insulated conductors and has corresponding first cover portions of the first and second shielding films and corresponding first pinched portions of the first and second shielding films forming a first pinched cable portion on one side of the first conductor set;

a maximum separation between the first cover portions of the first and second shielding films is D;

a minimum separation between the first pinched portions of the first and second shielding films is $d_1$;

$d_1/D$ is less than 0.25; and a high frequency electrical isolation of the first insulated conductor relative to the second insulated conductor is substantially less than a high frequency electrical isolation of the first conductor set relative to an adjacent conductor set.

Item 7 is the cable of item 6, wherein $d_1/D$ is less than 0.1.

Item 8 is the cable of item 6, wherein the high frequency isolation of the first insulated conductor relative to the second conductor is a first far end crosstalk C1 at a specified frequency range of 3-15 GHz and a length of 1 meter, and the high frequency isolation of the first conductor set relative to the adjacent conductor set is a second far end crosstalk C2 at the specified frequency, and wherein C2 is at least 10 dB lower than C1.

Item 9 is the cable of item 6, wherein the cover portions of the first and second shielding films in combination substantially surround each conductor set by encompassing at least 70% of a periphery of each conductor set.

Item 10 is a shielded electrical cable, comprising:

a plurality of conductor sets extending along a length of the cable and being spaced apart from each other along a width of the cable, each conductor set including one or more insulated conductors;

first and second shielding films including concentric portions, pinched portions, and transition portions arranged such that, in transverse cross section, the concentric portions are substantially concentric with one or more end conductors of each conductor set, the pinched portions of the first and second shielding films in combination form pinched portions of the cable on two sides of the conductor set, and the transition portions provide gradual transitions between the concentric portions and the pinched portions; and a first EMI absorbing layer disposed on the plurality of conductor sets; wherein each shielding film comprises a conductive layer;

a first one of the transition portions is proximate a first one of the one or more end conductors and has a cross-sectional area $A_1$ defined as an area between the conductive layers of the first and second shielding films, the concentric portions, and a first one of the pinched portions proximate the first end conductor, wherein $A_1$ is less than a cross-sectional area of the first end conductor; and each shielding film is characterizable in transverse cross section by a radius of curvature that changes across the width of the cable, the radius of curvature for each of the shielding films being at least 100 micrometers across the width of the cable.

Item 11 is the cable of item 10, wherein the cross-sectional area $A_1$ includes as one boundary a boundary of the first pinched portion, the boundary defined by the position along the first pinched portion at which a separation d between the first and second shielding films is about 1.2 to about 1.5 times a minimum separation $d_1$ between the first and second shielding films at the first pinched portion.

Item 12 is the cable of item 11, wherein the cross-sectional area $A_1$ includes as one boundary a line segment having a first endpoint at an inflection point of the first shielding film.

Item 13 is the cable of item 11, wherein the line segment has a second endpoint at an inflection point of the second shielding film.

Item 14 is a shielded electrical cable, comprising:

a plurality of conductor sets extending along a length of the cable and being spaced apart from each other along a width of the cable, each conductor set including one or more insulated conductors;

first and second shielding films including concentric portions, pinched portions, and transition portions arranged such that, in transverse cross section, the concentric portions are substantially concentric with one or more end conductors of each conductor set, the pinched portions of the first and second shielding films in combination form pinched regions of the cable on two sides of the conductor set, and the transition portions provide gradual transitions between the concentric portions and the pinched portions; and a first EMI absorbing layer disposed on the plurality of conductor sets; wherein one of the two shielding films includes a first one of the concentric portions, a first one of the pinched portions, and a first one of the transition portions, the first transition portion connecting the first concentric portion to the first pinched portion;

the first concentric portion has a radius of curvature $R_1$ and the transition portion has a radius of curvature $r_1$; and $R_1/r_1$ is in a range from 2 to 15.

The embodiments discussed in this disclosure have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof

What is claimed is:

1. A shielded electrical cable, comprising:

a plurality of conductor sets extending along a length of the cable and being spaced apart from each other along a width of the cable, each conductor set including one or more insulated conductors;

an EMI absorbing layer substantially surrounding each conductor set; and first and second non-conductive polymeric layers disposed on opposite sides of the cable and including cover portions and pinched portions arranged such that, in transverse cross section, the cover portions of the first and second layers, in combination, substantially surround the plurality of conductor sets, and the pinched portions of the first and second layers, in combination, form pinched portions of the cable on each side of the plurality of conductor sets, wherein a maximum separation between the cover portions of the first and second non-conductive polymeric layers is D, a minimum separation between the pinched portions of the first and second non-conductive polymeric layers is $d_1$, and $d_1/D$ is less than about 0.25.

2. The cable of claim 1 further comprising a shielding film substantially surrounding each conductor set.

3. The cable of claim 1, wherein $d_1/D$ is less than 0.1.

4. The cable of claim 1 further comprising an adhesive layer bonding the first polymeric layer to the second polymeric layer in the pinched portions of the cable.

5. The cable of claim 1, wherein each polymeric layer is characterizable in transverse cross section by a radius of curvature that changes across the width of the cable, the radius of curvature for each of the polymeric layers being at least 100 micrometers across the width of the cable.

6. A shielded electrical cable, comprising:
   a plurality of conductor sets extending along a length of the cable and being spaced apart from each other along a width of the cable, each conductor set including one or more insulated conductors;
   first and second shielding films disposed on opposite first and second sides of the cable, the first and second films including cover portions and pinched portions arranged such that, in transverse cross section, the cover portions of the first and second films in combination substantially surround each conductor set, and the pinched portions of the first and second films in combination form pinched portions of the cable on each side of each conductor set;
   a first EMI absorbing layer disposed on the first side of the cable;
   a second EMI absorbing layer disposed on the second side of the cable; and
   an adhesive layer bonding the first shielding film to the second shielding film in the pinched portions of the cable.

7. The shielded electrical cable of claim 6, wherein the plurality of conductor sets comprises a first conductor set that comprises neighboring first and second insulated conductors and has corresponding first cover portions of the first and second shielding films and corresponding first pinched portions of the first and second shielding films forming a first pinched cable portion on one side of the first conductor set; wherein
   a maximum separation between the first cover portions of the first and second shielding films is D;
   a minimum separation between the first pinched portions of the first and second shielding films is $d_1$, and
   $d_1/D$ is less than 0.25.

8. The cable of claim 6, wherein the cover portions of the first and second shielding films in combination substantially surround each conductor set by encompassing at least 70% of a periphery of each conductor set.

* * * * *

UNITED STATES PATENT AND TRADEMARK OFFICE
CERTIFICATE OF CORRECTION

PATENT NO.       : 9,129,724 B2                                    Page 1 of 1
APPLICATION NO.  : 14/483243
DATED            : September 8, 2015
INVENTOR(S)      : Douglas Gundel It is certified that error appears in the above-identified patent and that said Letters Patent is hereby corrected as shown below:

IN THE SPECIFICATION

Column 21
Line 12, delete "$T_1$" and insert -- $T_i$ --

Line 13, delete "$T_1$" and insert -- $T_i$ --

Column 32
Line 50, delete "4346'" and insert -- 4346''' --

Line 52, delete "4346'" and insert -- 4346''' --

Column 34
Line 20, delete "4646'" and insert -- 4646''' --

Line 24, delete "4646'" and insert -- 4646''' --

Line 27, delete "4646'" and insert -- 4646''' --

Line 35, delete "4746'" and insert -- 4746''' --

Line 39, delete "4746'" and insert -- 4746''' --

Line 48, delete "4846'" and insert -- 4846''' --

Line 57, delete "4946'" and insert -- 4946''' --

Column 40
Line 45, delete "thereof" and insert -- thereof. --

Signed and Sealed this
Twenty-second Day of March, 2016

Michelle K. Lee
*Director of the United States Patent and Trademark Office*